United States Patent
Murata

(10) Patent No.: US 7,524,024 B2
(45) Date of Patent: Apr. 28, 2009

(54) ELECTRICAL CONNECTION SUBSTRATE, DROPLET DISCHARGE HEAD, AND DROPLET DISCHARGE APPARATUS

(75) Inventor: Michiaki Murata, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 429 days.

(21) Appl. No.: 11/220,766

(22) Filed: Sep. 7, 2005

(65) Prior Publication Data

US 2006/0209139 A1    Sep. 21, 2006

(30) Foreign Application Priority Data

Mar. 15, 2005    (JP) ............... 2005-074000

(51) Int. Cl.
  *B41J 2/14*    (2006.01)
(52) U.S. Cl. ...................................... 347/50
(58) Field of Classification Search .......... 347/50, 347/68, 70–72
  See application file for complete search history.

(56) References Cited

U.S. PATENT DOCUMENTS 5,757,400 A * 5/1998 Hoisington ............. 347/40
5,889,539 A * 3/1999 Kamoi et al. ............ 347/50
6,270,193 B1 * 8/2001 Hiwada .................. 347/50
6,276,781 B1 * 8/2001 Hasegawa ............... 347/50
6,796,640 B2 * 9/2004 Miyata .................. 347/71

FOREIGN PATENT DOCUMENTS

JP    2000-135790    5/2000

* cited by examiner

*Primary Examiner*—An H Do
(74) *Attorney, Agent, or Firm*—Fildes & Outland, P.C.

(57) ABSTRACT

An electrical connection substrate includes a substrate main body in which an electrical connection through port is formed, and connection target members arranged on both sides of the substrate main body, respectively. The connection target members are electrically connected to each other through the electrical connection through port, and the electrical connection through port is filled with a fluidized conductive material. The fluidized conductive material thus filled can satisfactorily keep connection of the connection target members to each other through the electrical connection through port.

15 Claims, 50 Drawing Sheets

A-A' SECTION

B-B' SECTION

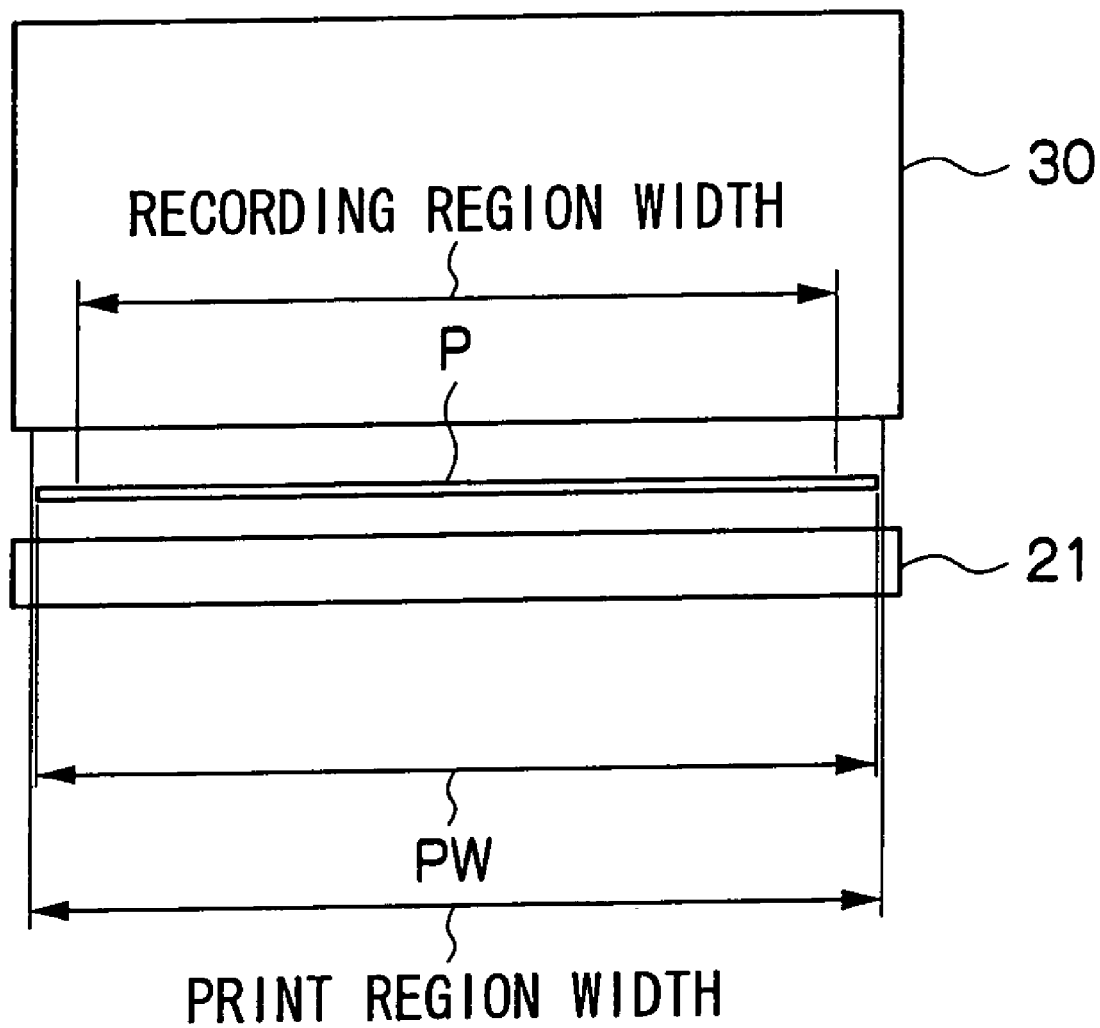

A-A' SECTION

B-B' SECTION

C-C' SECTION

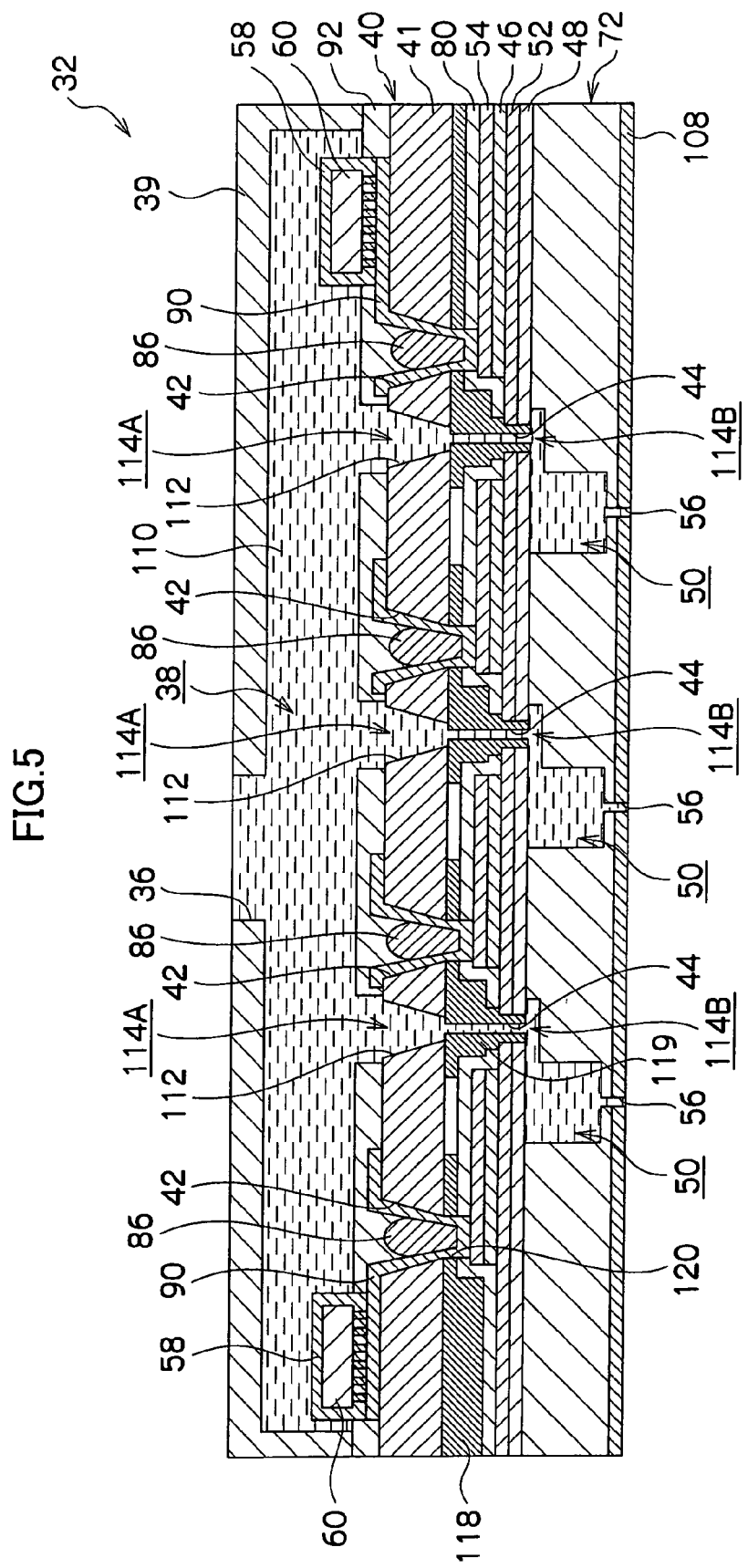

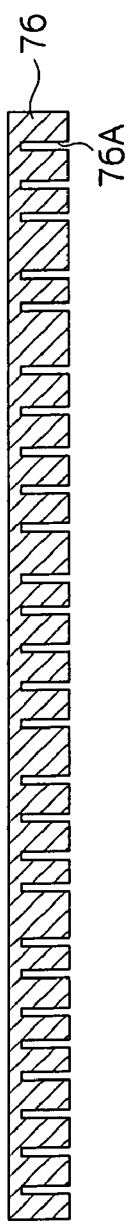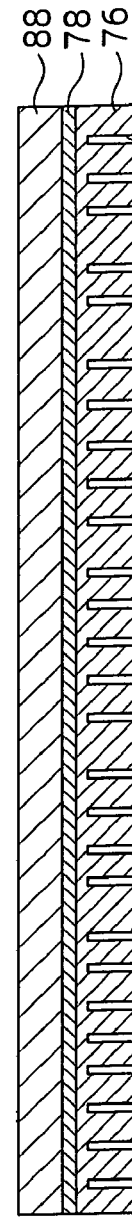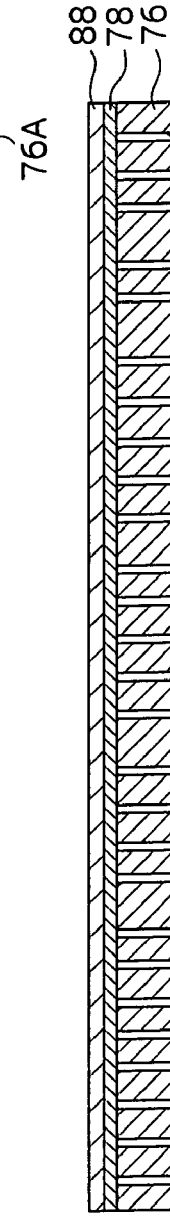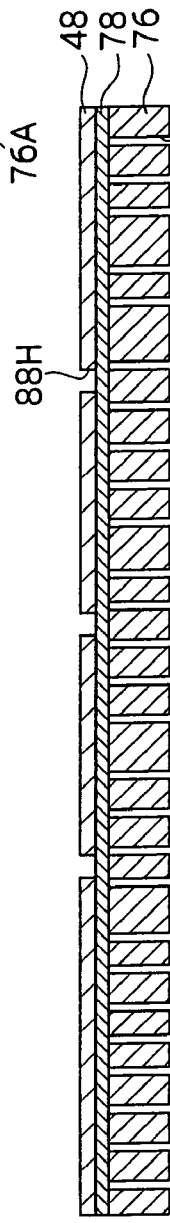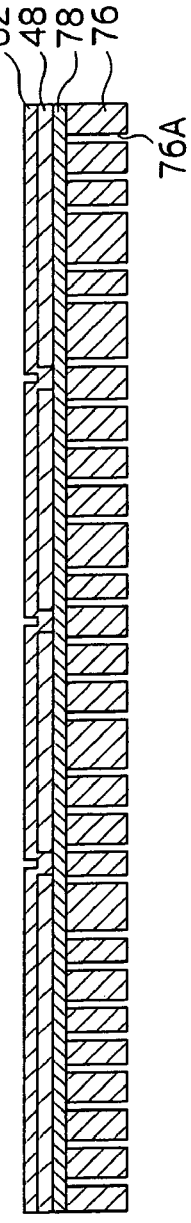
FIG.8-1A  FIG.8-1B  FIG.8-1C  FIG.8-1D  FIG.8-1E  FIG.8-1F

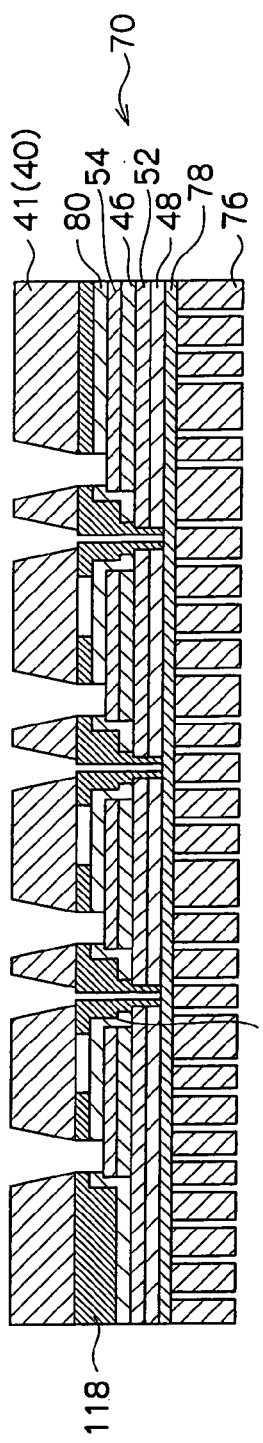
FIG.10-1A
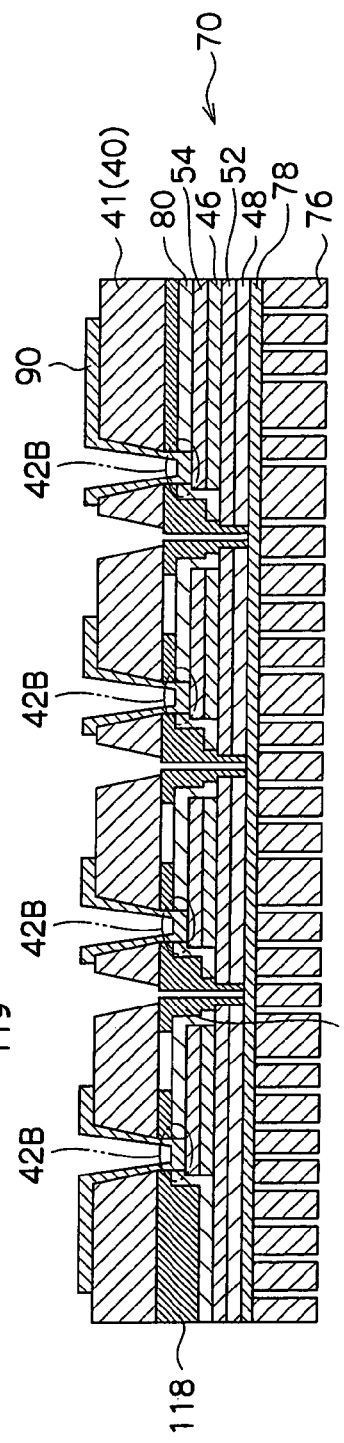
FIG.10-1B
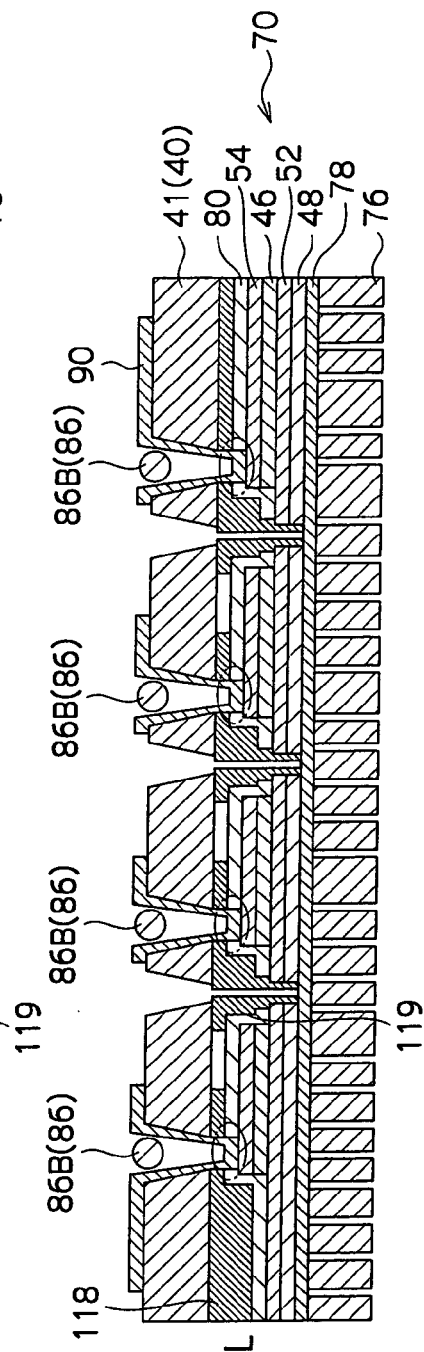
FIG.10-1C SOLDER BALL METHOD

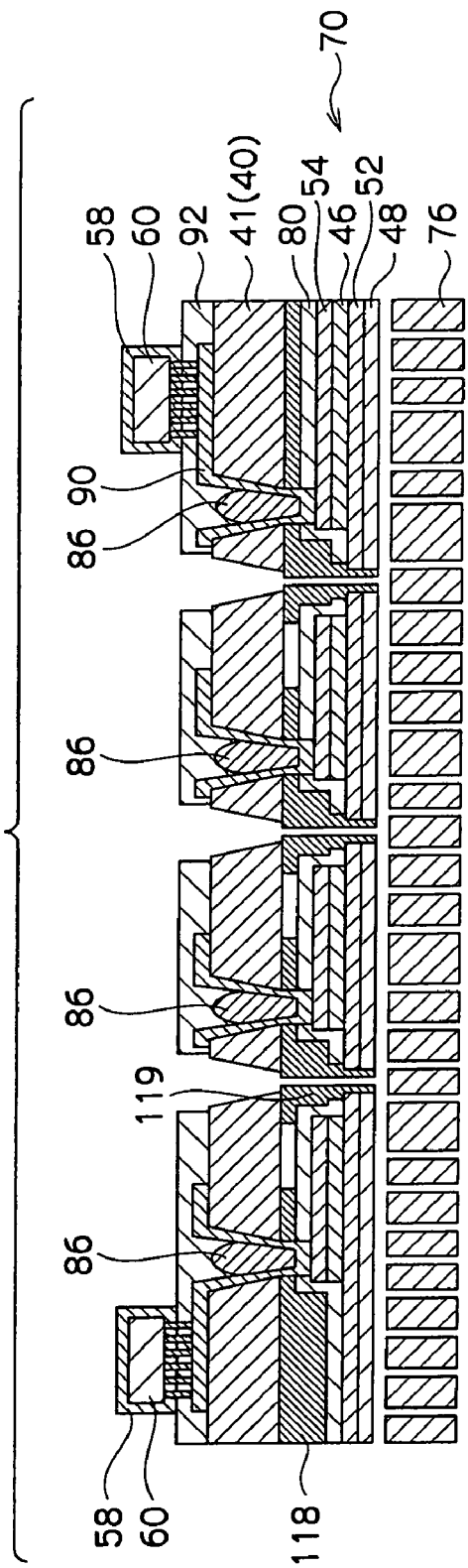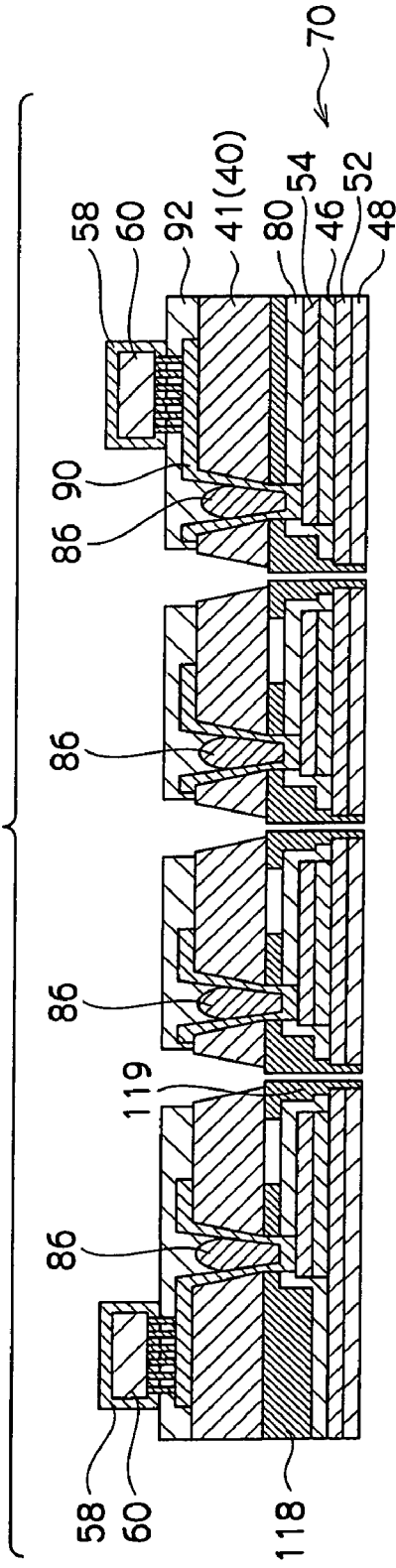

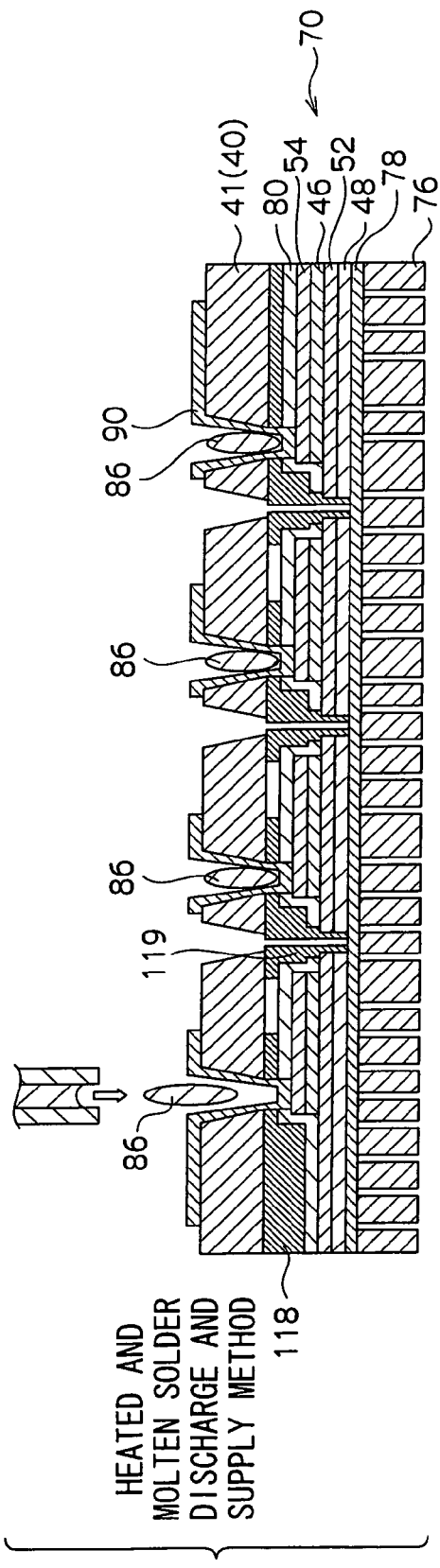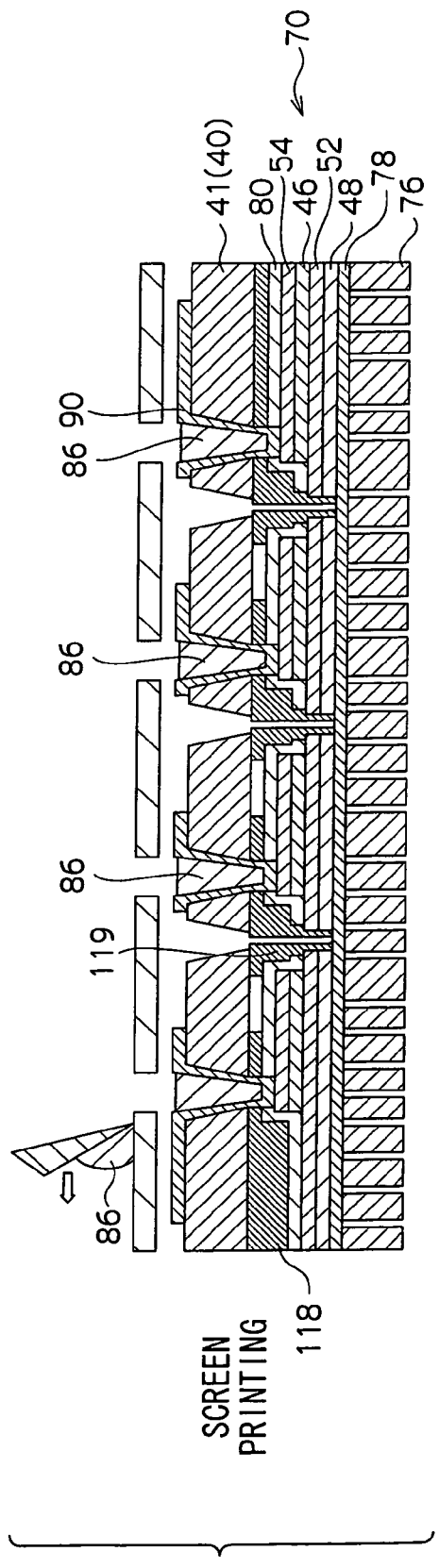

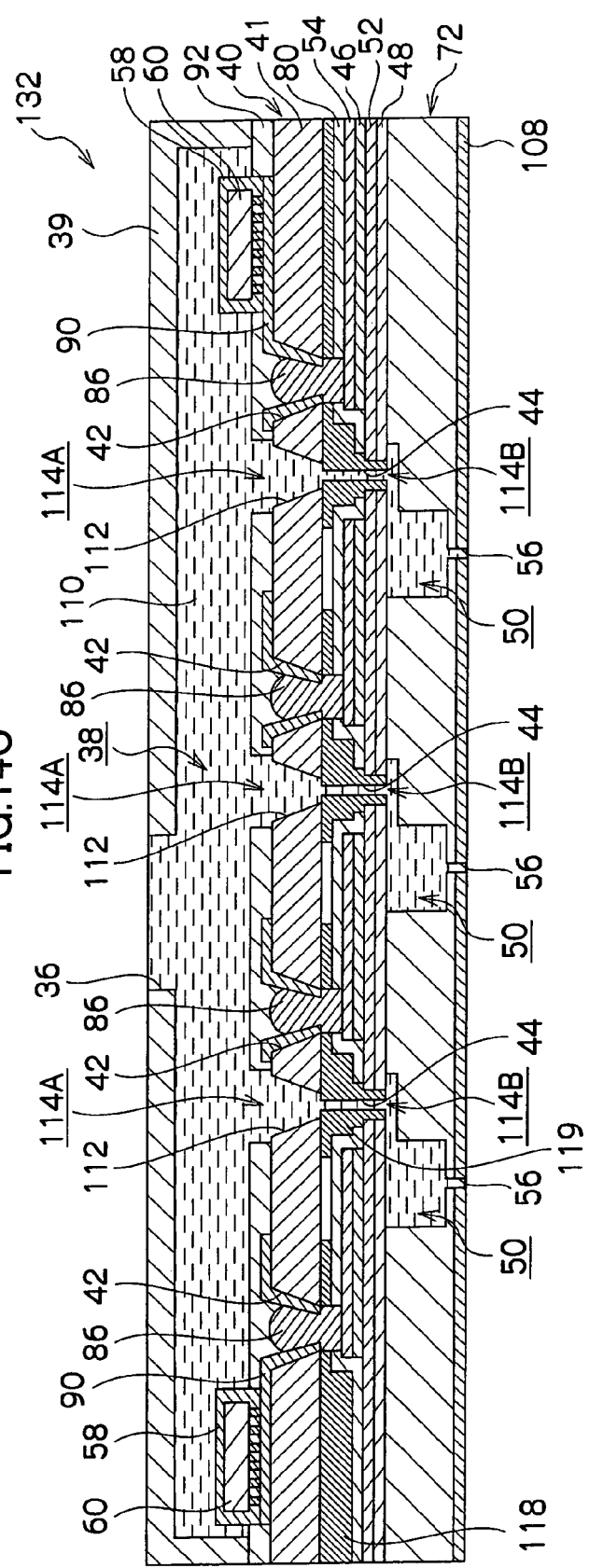

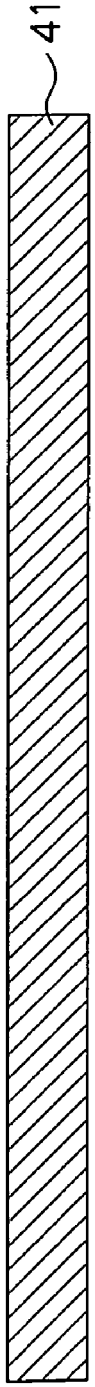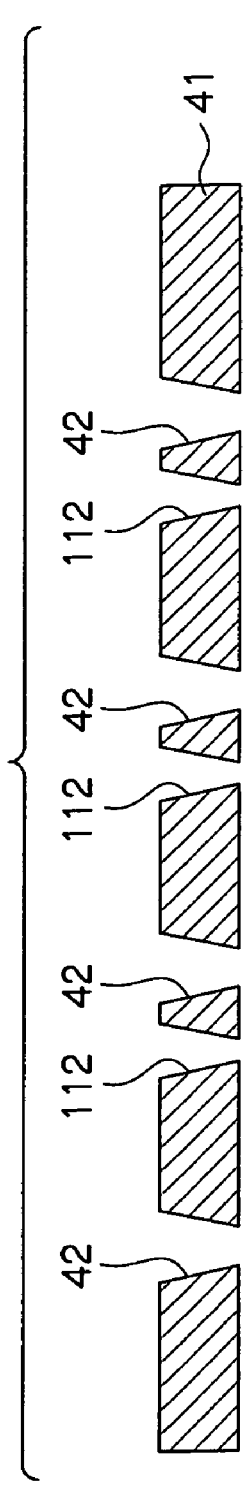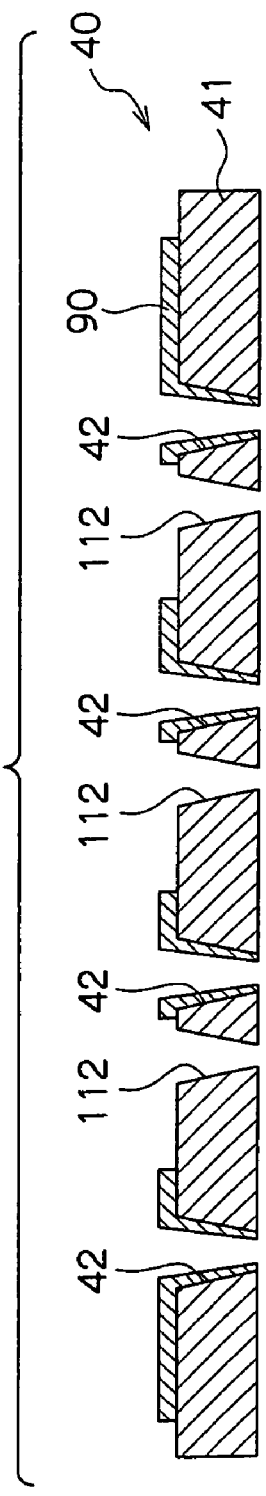

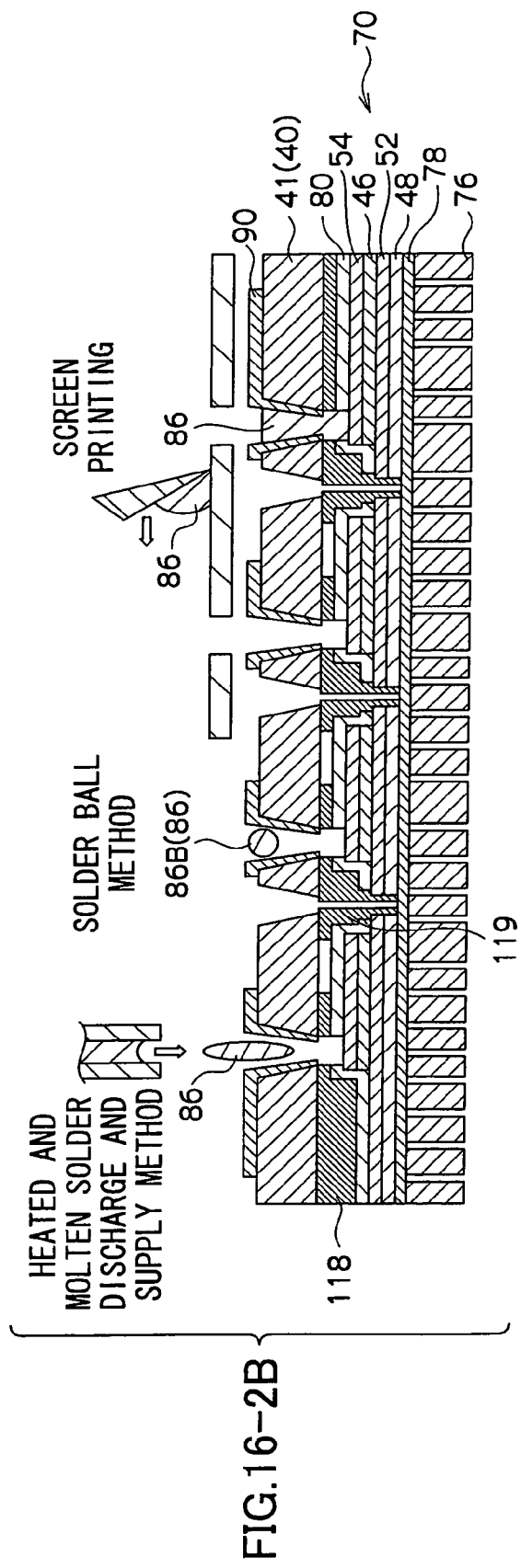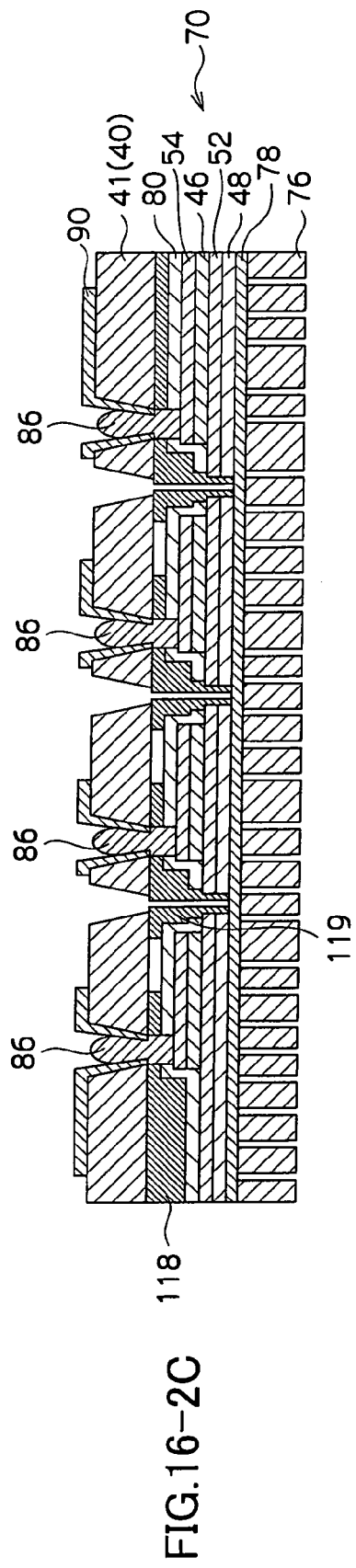

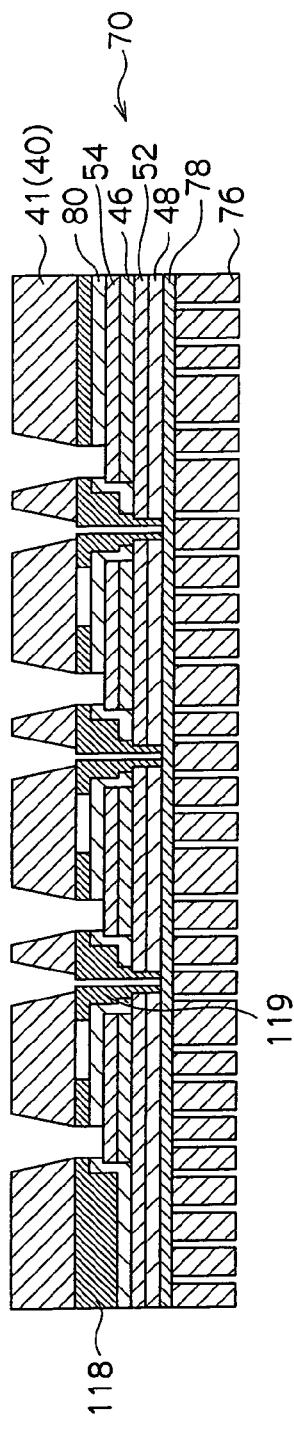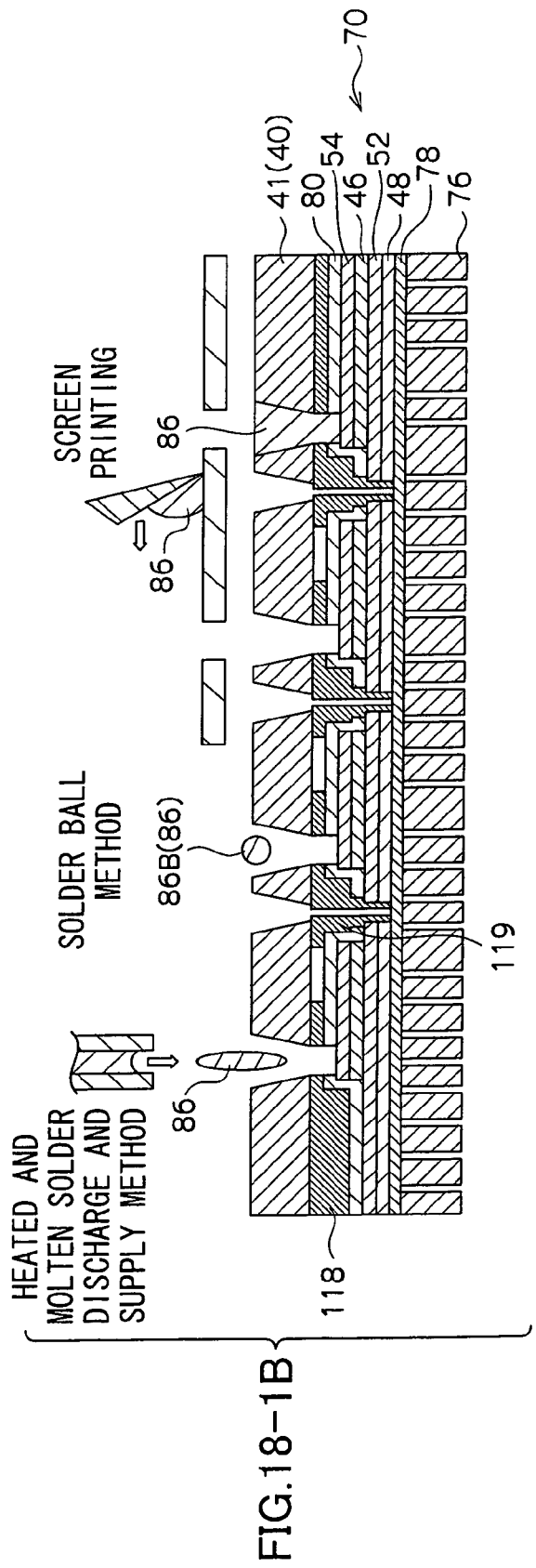
FIG.18-1A
FIG.18-1B

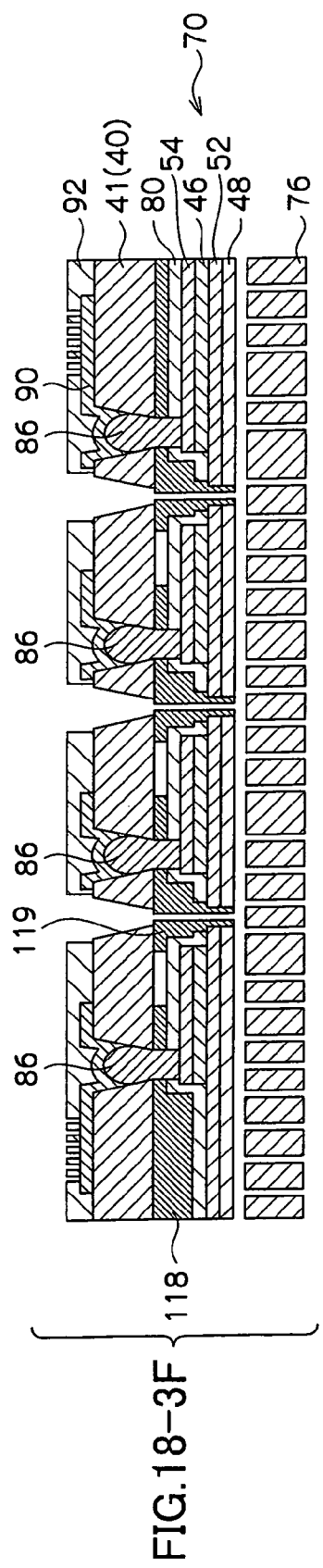
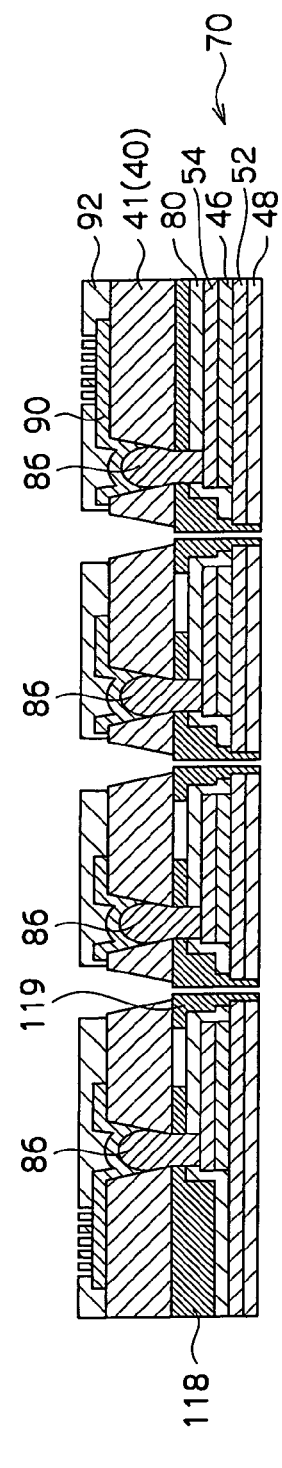
FIG.18-3F
FIG.18-3G

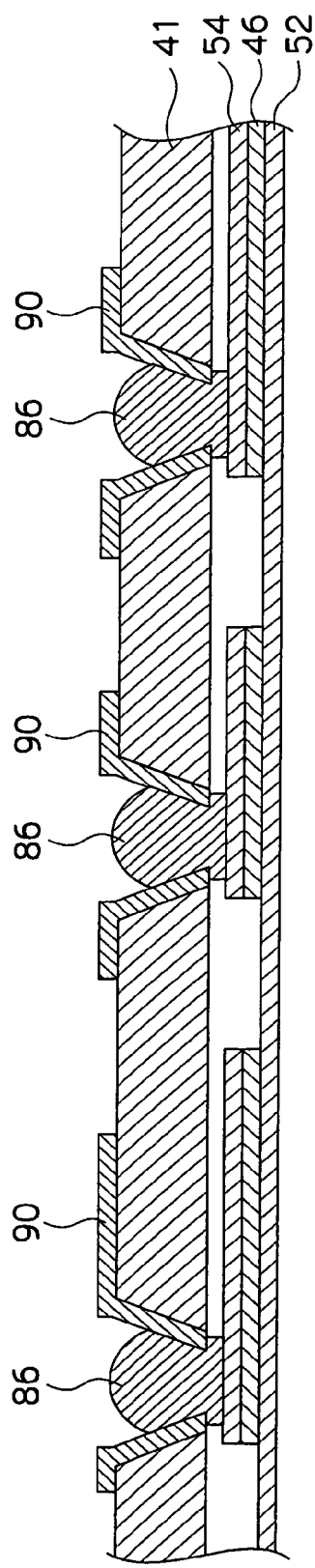
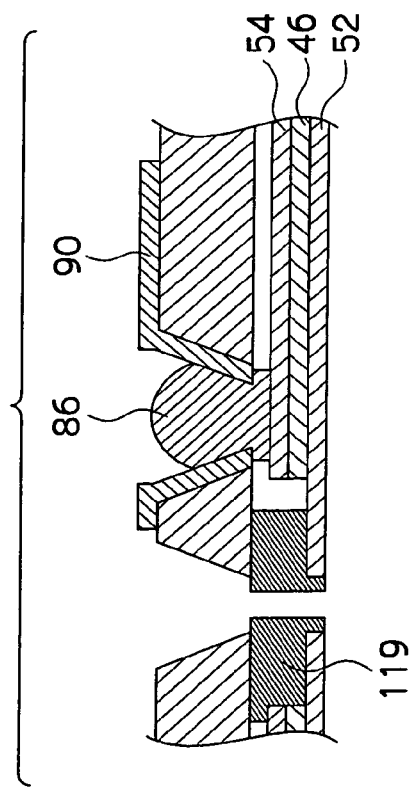
FIG.23A
FIG.23B

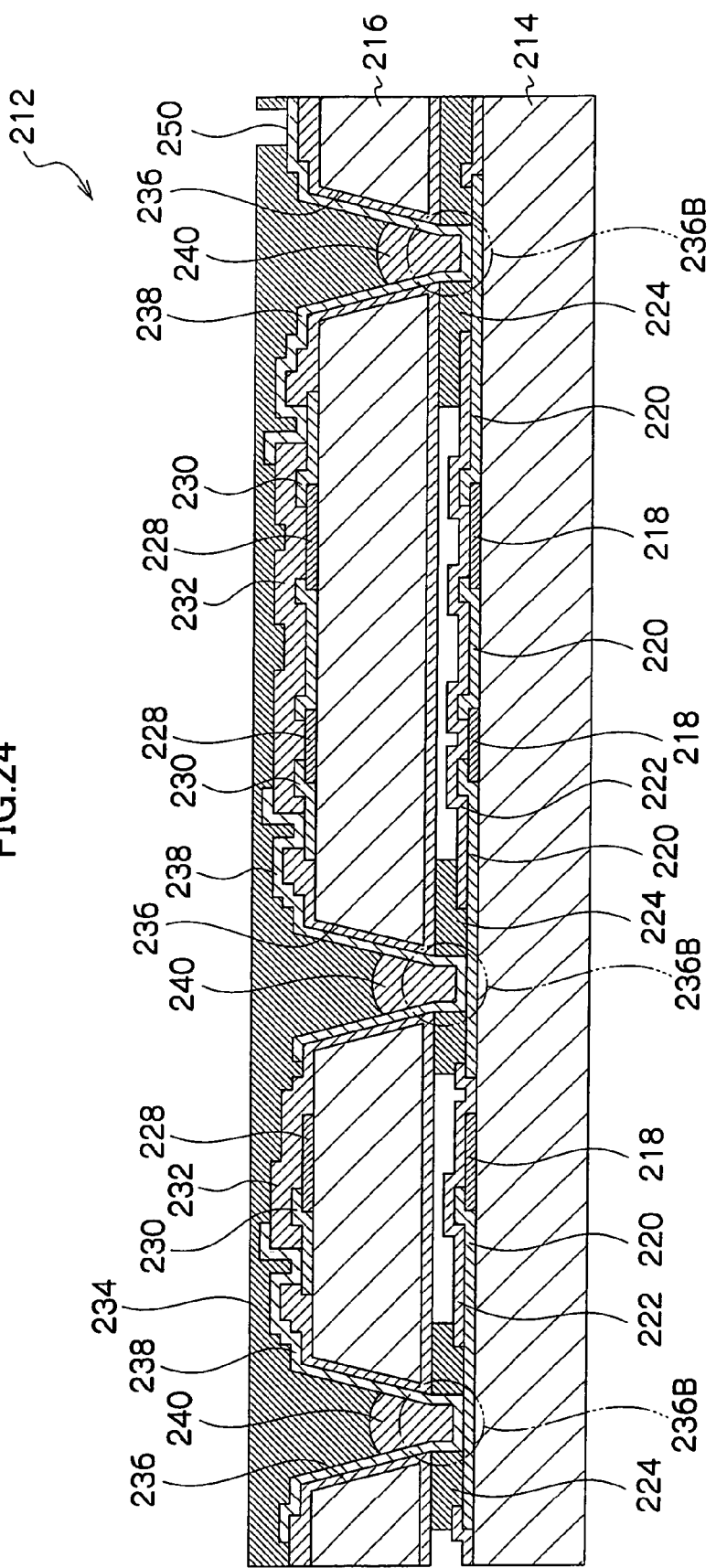

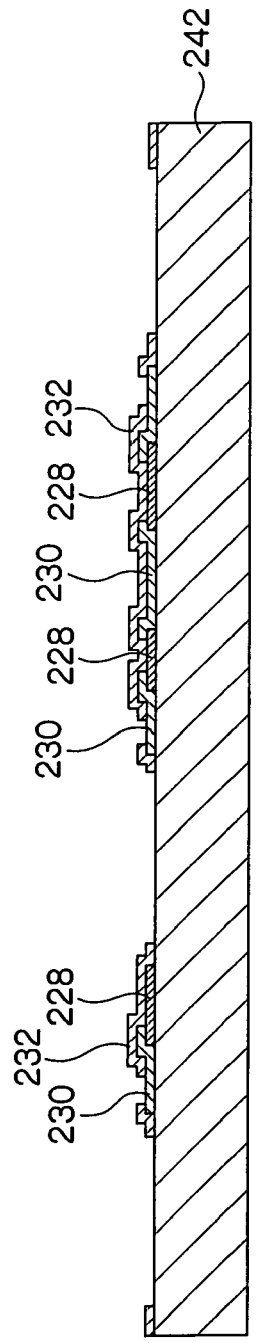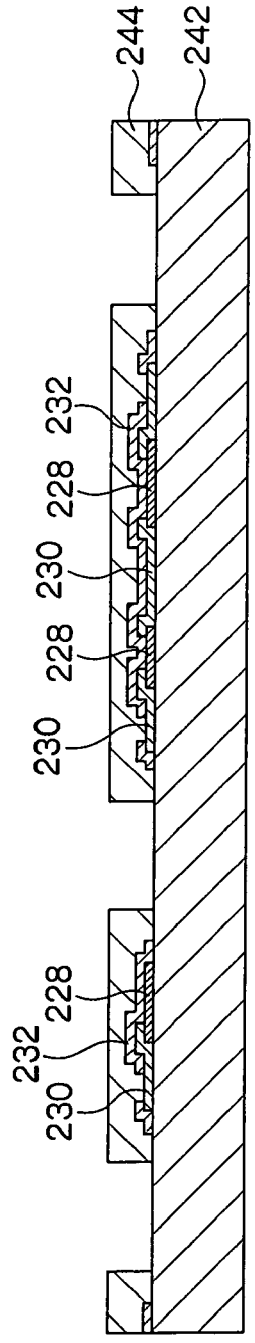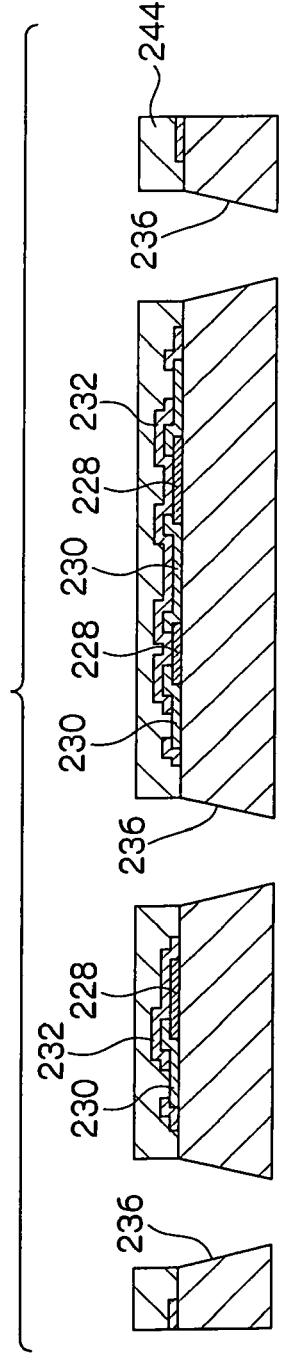
FIG.26-1A  FIG.26-1B  FIG.26-1C  FIG.26-1D

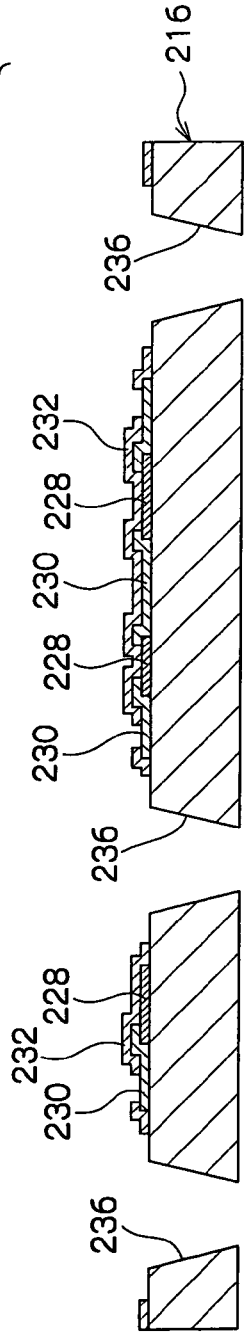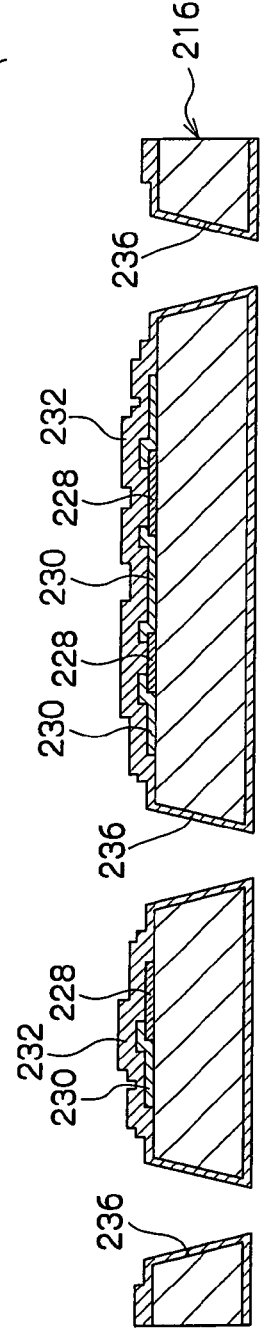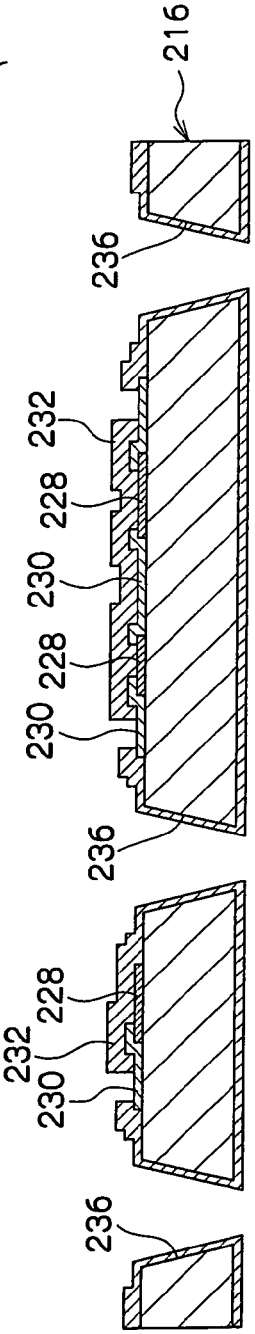

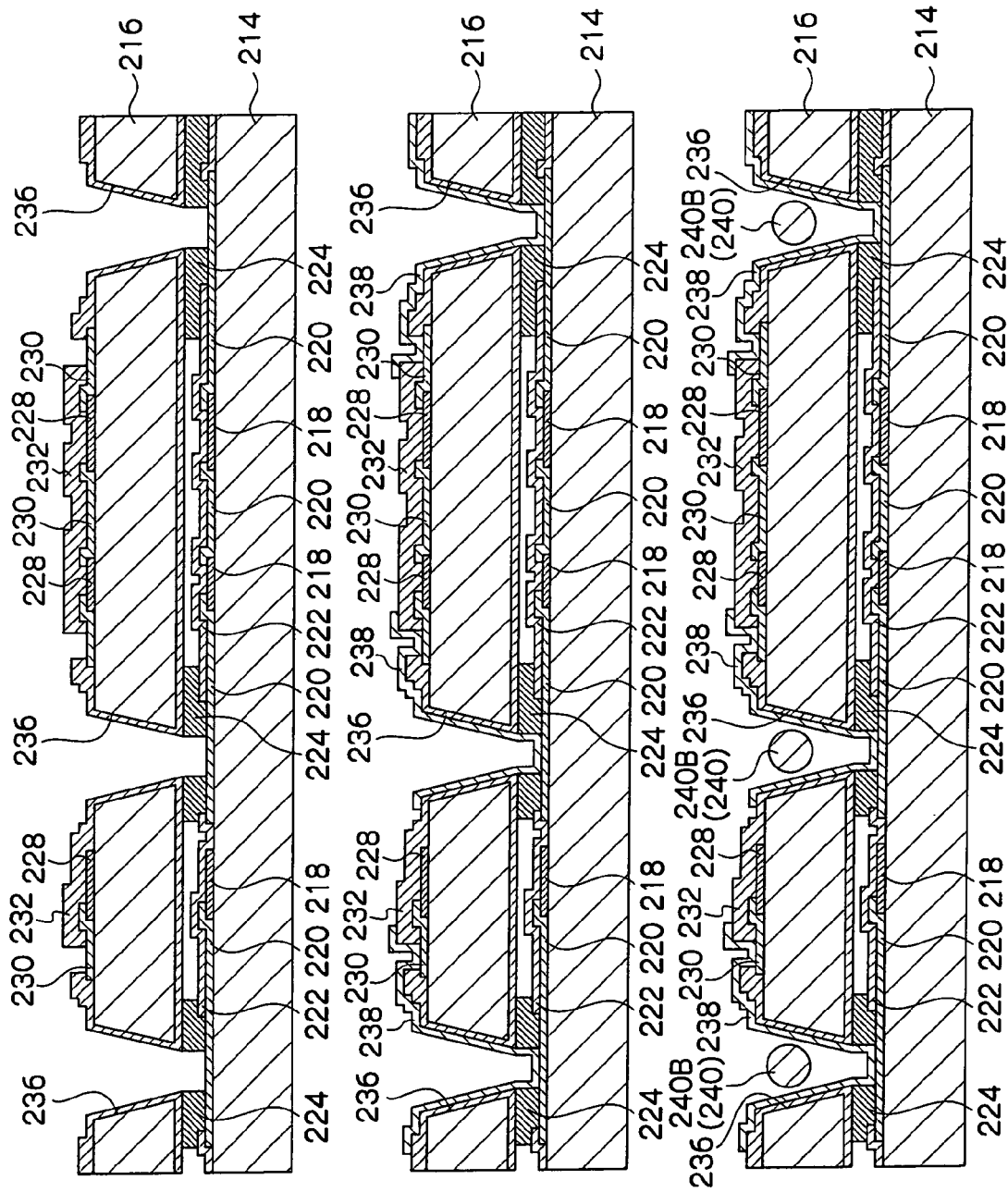

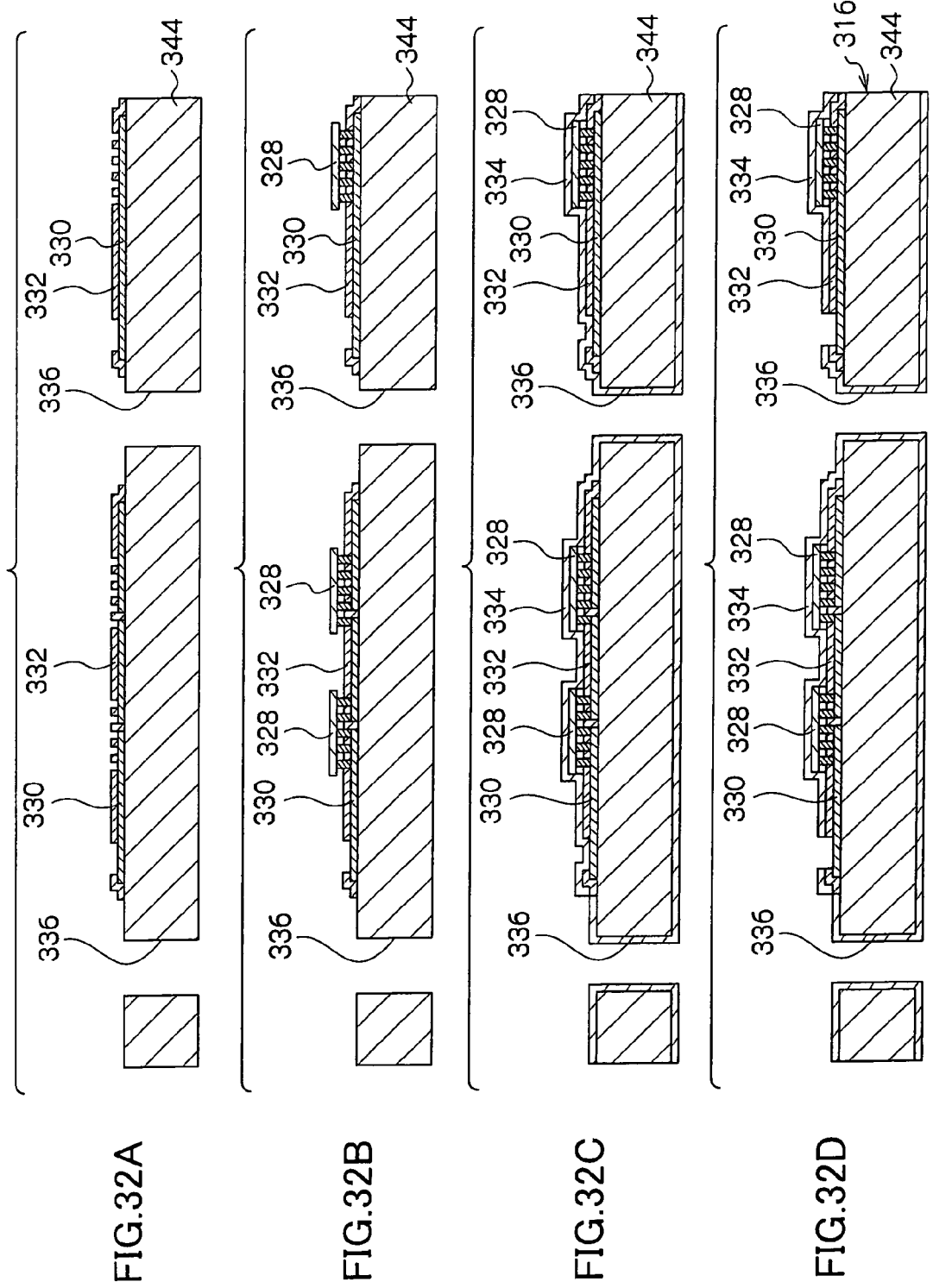

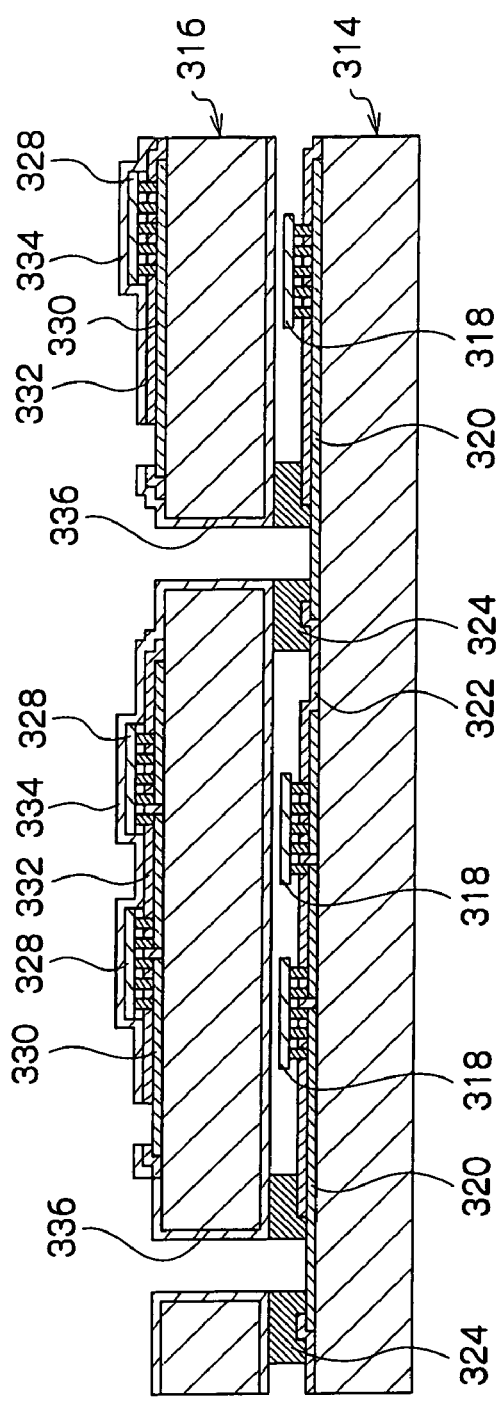
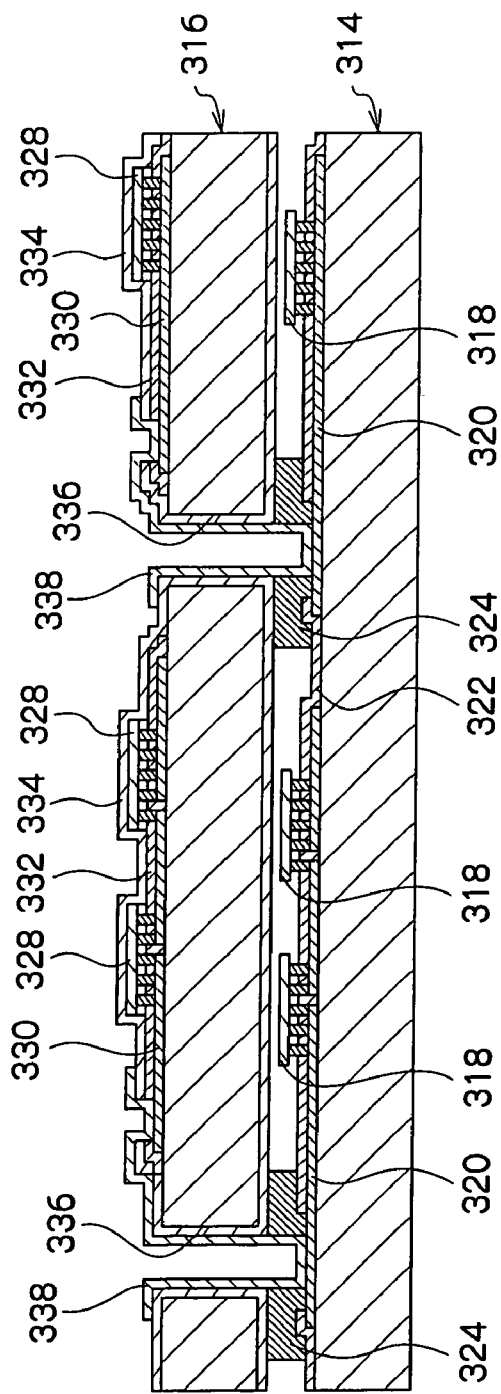
FIG.33-1A
FIG.33-1B

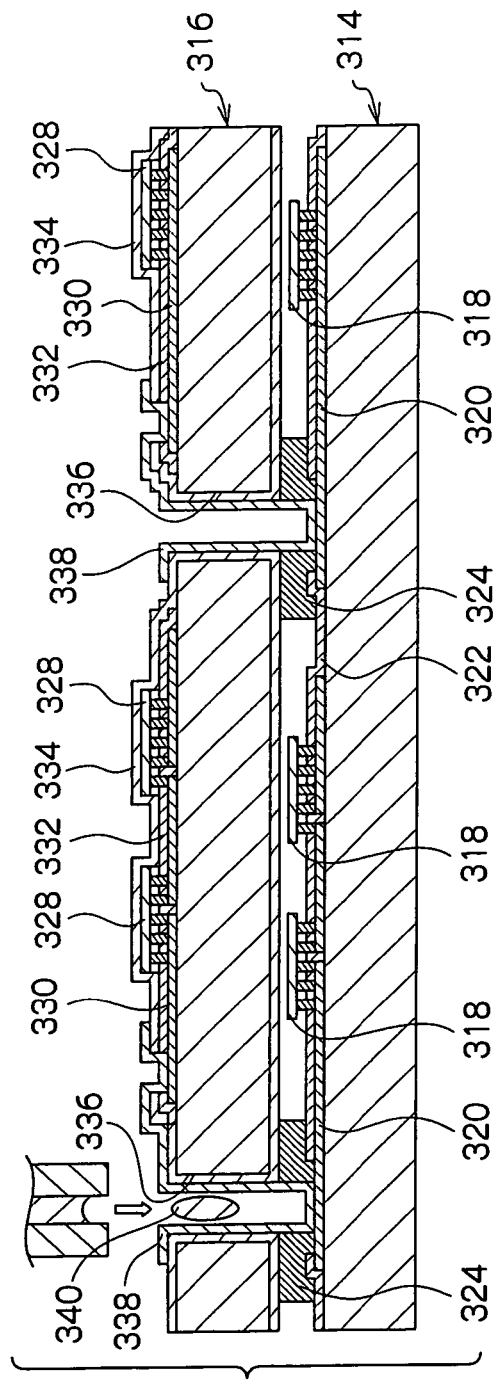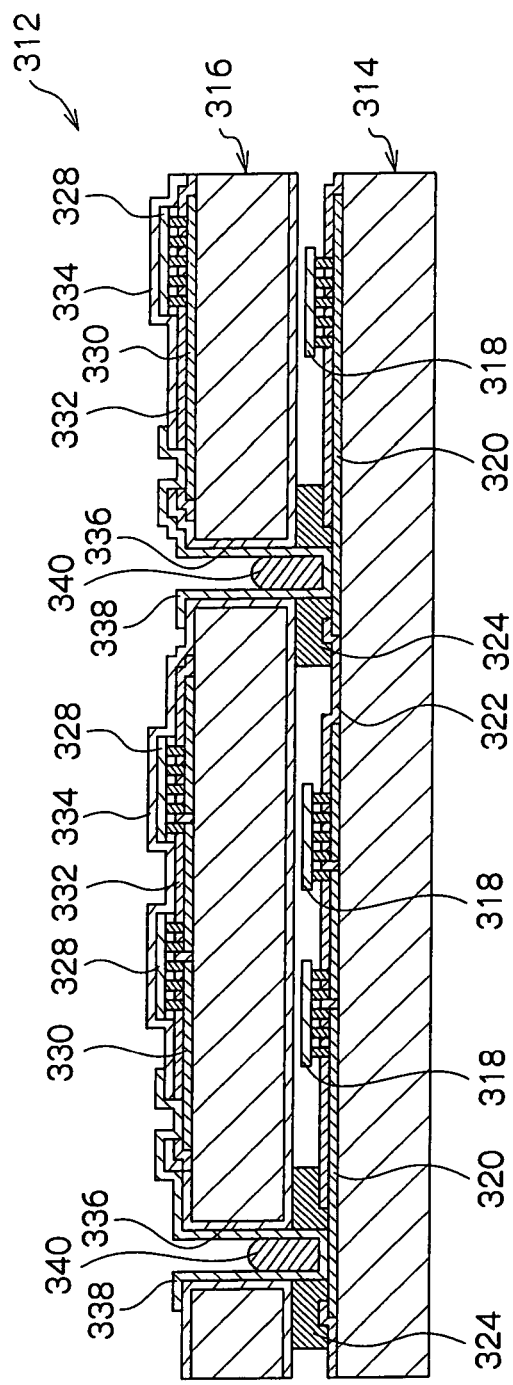

ELECTRICAL CONNECTION SUBSTRATE, DROPLET DISCHARGE HEAD, AND DROPLET DISCHARGE APPARATUS

CROSS-REFERENCE TO RELATED APPLICATION

This application claims priority under 35 USC 119 from Japanese Patent Application No. 2005-74000, the disclosure of which is incorporated by reference herein.

BACKGROUND OF THE INVENTION

1. Field of the Invention

The present invention relates to an electrical connection substrate and a droplet discharge head. More specifically, the invention relates to a droplet discharge head including a substrate main body having an electrical connection through hole formed therein and an electrical connection substrate that electrically connects connection target members arranged on both sides of the substrate main body to each other through the electrical connection through hole.

2. Description of the Related Art

As an inkjet recording head in which a diaphragm is vibrated by a piezoelectric element and ink in a pressure chamber is discharged as an ink droplet from a nozzle by this vibration, there is known an inkjet recording head structured in which a driving IC and a wiring for driving the piezoelectric element are arranged on a top plate member such as a printed wiring board so that the driving IC is connected to an electrode on the piezoelectric element through a through hole formed in the top plate member. For example, Japanese Patent Application Laid-Open (JP-A) No. 2000-135790 discloses an inkjet recording head configured so that a through groove is formed in a fixed member (top plate member) and so that an electrode film of a piezoelectric element is connected to a driving IC by a metal thin film through this through groove.

Such an electrical connection structure has, however, the following disadvantage. Since a connection wiring is directly connected to the electrode film of the piezoelectric element by the thin film, the wiring may possibly be peeled off or broken due to a heat stress, a mechanical stress or the like.

Such a disadvantage may possibly not only occur to the top plate member of the inkjet recording head but also widely occur when connection target members on both sides of the substrate main body are electrically connected to each other through the through hole of the substrate main body.

SUMMARY OF THE INVENTION

The present invention has been achieved in view of the above circumstances and provides an electrical connection substrate in which connecting connection target members on both sides of a substrate main body can be connected to each other with certainty through a through hole of the substrate main body, and a droplet discharge head including this electrical connection substrate.

According to a first aspect of the invention, there is provided an electrical connection substrate comprising: a substrate main body in which an electrical connection through port is formed; and connection target members arranged on both sides of the substrate main body, respectively, wherein the connection target members are electrically connected to each other through the electrical connection through port, and the electrical connection through port is filled with a fluidized conductive material.

According to the first aspect of the invention, examples of the "connection target members" which are to be electrically connected include electrodes, circuits, wirings, integrated circuits, various electronic components, and conductive substrates. Examples of the "fluidized conductive material" include solder, molten metal, metal paste, and conductive adhesive. If any one of the materials is used as the fluidized conductive material, this fluidized conductive material can reinforce a connection portion at which the connection target members are connected to each other within the electrical connection through port. Good contact performance can be, therefore, ensured. For example, even if thermal stress or mechanical stress acts on the connection portion, it is possible to ensure that the contact state is maintained and that the connection target members are electrically connected to each other.

According to a second aspect of the invention, a wiring pattern, in which the connection target members are arranged, is formed on at least one surface of the substrate main body, and the connection target members are electrically connected to each other through the wiring pattern.

One of the connection target members is, therefore, electrically connected to the other connection target member through the wiring pattern. By thus interposing the wiring pattern therebetween, the electrical connection performance of the connection target members can be improved. In addition, a desired circuit can be structured at the substrate main body according to this wiring pattern.

The wiring pattern may extend into the electrical connection through port. In this case, the wiring pattern within this electrical connection through port is reinforced by the fluidized conductive material. Furthermore, the wiring pattern within the electrical connection through port can be electrically connected to the other connection target member with the fluidized conductive material interposed therebetween.

According to a third aspect of the invention, the wiring pattern is formed to cover at least a part of an inside surface of the electrical connection through port. As a result, electrical connection within the through port is completed.

According to a fourth aspect of the invention, the wiring pattern is formed to be exposed from one surface of the substrate main body to the other surface thereof through the electrical connection through port.

With this configuration, the wiring pattern is brought into direct contact with the other connection target member, so that the wiring pattern can be electrically connected to the other connection target member.

In the case of the wiring pattern based on the fourth aspect of the invention, the wiring pattern is easily broken at the exposed portion due to various factors.

According to a fifth aspect of the invention, therefore, the fluidized conductive material is located closer to an inside surface of the electrical connection through port than a portion of the wiring pattern that is exposed from the electrical connection through port.

If the configuration according to this fifth aspect is adopted, the wiring pattern broken at the portion exposed from the electrical connection through port can be electrically connected to the wiring pattern within the electrical connection through port by the fluidized conductive material. Continuity defects can be, therefore, avoided.

According to a sixth aspect of the invention, the fluidized conductive material is arranged so as not to protrude from the electrical connection through port on an opposite surface to a surface of the substrate main body on which other members are bonded to the substrate main body.

With this configuration, if the other members are bonded to the substrate main body, it is possible to prevent the fluidized conductive material from protruding from the opposite side to the bonded surface or inadvertent mechanical load from being applied to the bonded portion.

According to a seventh aspect of the invention, the electrical connection substrate includes an insulating film which is formed on a surface of the substrate main body on which the wiring pattern is not formed, and in which a communication port communicating with the electrical connection through port is formed, and a closing member forming a part of the connection target members or the wiring pattern, and closing a side of the communication port which side does not communicate with the electrical connection through port.

According to this seventh aspect of the invention, when the electrical connection through port and the communication port are filled with the fluidized conductive material, the side of the communication port which side does not communicate with the electrical connection through port is closed by the closing member. It is, therefore, possible to prevent the fluidized conductive material from inadvertently flowing out. Accordingly, the fluidized conductive material can be fluidized (e.g., molten) sufficiently.

Besides, since the closing member forms a part of the connection target members or the wiring pattern, the closing member is electrically connected to the fluidized conductive material due to the fluidized conductive material being in contact therewith.

According to an eighth aspect of the invention, the electrical connection substrate includes a first resin layer formed to be located around the electrical connection through port on a side of the substrate main body which side the other members are bonded to, and a second resin layer formed to be located near the connection target members on the side of the substrate main body which side the other members are bonded to, wherein the first resin layer and the second resin layer are substantially equal in height from the substrate main body.

By thus making the first resin layer and the second resin layer equal in the height from the substrate main body, if the other member is arranged in contact with these resin layers, positions of contact surfaces of these resin layers in contact with the other member are aligned. The contact performance is, therefore, improved. If the other member is bonded to the resin layers, the bonding performance is similarly improved.

While the first resin layer and the second resin layer may be provided on the substrate main body, they may be alternatively provided on the other member bonded to the substrate main body.

According to a ninth aspect of the invention, the top plate member of the droplet discharge head including the electrical connection substrate according to any one of the first to eighth aspects of the invention is provided with a liquid supply through port capable of supplying a liquid from one side of a top plate member to the other side thereof.

The droplet discharge head according to the ninth aspect of the invention includes the electrical connection substrate according to any one of the first to eighth aspects of the invention. It is, therefore, possible to ensure that the connection target members on the both sides of this substrate main body are electrically connected to each other through the through port of the substrate main body.

Further, the droplet supply through port formed in the top plate member enables the liquid to be supplied from one side of the top plate member to the other side thereof.

According to a tenth aspect of the invention, the droplet discharge head according to the ninth aspect of the invention includes a pressure chamber filled with the liquid supplied through the liquid supply through port; a diaphragm constituting a part of the pressure chamber; a piezoelectric element displacing the diaphragm; a nozzle discharging a droplet from the pressure chamber due to vibration of the diaphragm; and an intermediate layer constituting a gap between the substrate main body and the piezoelectric element, and communicating with the liquid supply through port to constitute a liquid supply path.

In this droplet discharge head, the liquid supplied through the liquid supply through port is filled into the pressure chamber, and droplets are discharged from the nozzle by vibration of the diaphragm due to application of a voltage to the piezoelectric element.

Further, since the intermediate layer constitutes a gap (an air layer) between the substrate main body and the piezoelectric element, resistance to the vibration of the diaphragm is reduced (a displacement failure resulting from constraint of the piezoelectric element). Besides, since the intermediate layer communicates with the liquid supply through port and constitutes the liquid supply path, the intermediate layer does not influence the supply of the liquid into the pressure chamber.

According to an eleventh aspect of the invention, plural nozzles are arranged in a matrix.

As a result, it is possible to record an image having a high resolution.

According to a twelfth aspect of the invention, the electrical connection through port and the liquid supply through port based on the eleventh aspect of the invention are formed into a matrix to correspond to the nozzles arranged in the matrix.

If the nozzles are arranged in a matrix, the pressure chamber, the diaphragm, the piezoelectric element, etc. are arranged in a matrix to correspond to the nozzles. According to this aspect of the invention, by further arranging the electrical connection through port and the liquid supply through port in a matrix, it is possible to individually control the piezoelectric elements and individually supply the liquid to the pressure chambers.

According to a thirteenth aspect of the invention, the droplet discharge head according to any one of the tenth to the twelfth aspects of the invention includes a liquid pool chamber that pools the liquid supplied to the pressure chamber, and the liquid pool chamber is provided on an opposite side from the pressure chamber, with the diaphragm interposed between the liquid pool chamber and the pressure chamber.

By thus providing the liquid pool chamber on the opposite side from the pressure chamber with the diaphragm interposed therebetween, the pressure chambers can be arranged to be proximate to one another. Accordingly, the nozzles provided to correspond to the pressure chambers can be arranged at high density and improvement in the resolution can be realized.

According to a fourteenth aspect of the invention, a droplet discharge apparatus including the droplet discharge head according to any one of the ninth to thirteenth aspects of the invention is provided.

Since the droplet discharge apparatus includes the droplet discharge head according to any one of the ninth to thirteenth aspects of the invention, it is possible to ensure that the connection target members on both sides of the substrate main body of the electrical connection substrate are electrically connected to each other through the through port of the substrate main body.

In summary, since the invention is constituted as stated above, it is possible to ensure that the connection target members on both sides of the substrate main body of the electrical connection substrate are electrically connected to each other through the through port of the substrate main body.

BRIEF DESCRIPTION OF THE DRAWINGS

Preferred embodiments of the present invention will be described in detail based on the following figures, wherein:

FIG. 2-1 is an explanatory view that depicts arrangement of inkjet recording heads in the inkjet recording apparatus according to the invention;

FIG. 2-2 is an explanatory view that depicts the relationship between a width of a recording sheet and a width of a print region in the inkjet recording apparatus according to the invention;

FIG. 5 is a sectional view that depicts the configuration of the inkjet recording head according to the first embodiment;

FIGS. 8-1A to 8-1F are explanatory views that depict steps (A) to (F) of manufacturing a piezoelectric element substrate according to the first embodiment of the invention;

FIGS. 8-2G to 8-2K are explanatory views that depict steps (G) to (K) of manufacturing the piezoelectric element substrate according to the first embodiment of the invention;

FIGS. 10-1A to 10-1C are explanatory views that depict steps (A) to (C) of connecting the top plate member to the piezoelectric element substrate according to the first embodiment of the invention;

FIGS. 10-2D to 10-2F are explanatory views that depict steps (D) to (F) of connecting the top plate member to the piezoelectric element substrate according to the first embodiment of the invention;

FIGS. 10-3G to 10-3H are explanatory views that depict steps (G) to (H) of connecting the top plate member to the piezoelectric element substrate according to the first embodiment of the invention;

FIGS. 10-4A to 10-4B are explanatory views that each depict a method for mounting a solder differently from a method shown in FIG. 10-1C in the steps of connecting the top plate member to the piezoelectric element substrate according to the first embodiment of the invention;

FIGS. 12-1A to 12-1B are explanatory views that depict steps (A) to (B) of connecting the channel substrate to the piezoelectric element substrate according to the first embodiment of the invention;

FIGS. 12-2C to 12-2D are explanatory views that depict steps (C) to (D) of connecting the channel substrate to the piezoelectric element substrate according to the first embodiment of the invention;

FIG. 12-3E is an explanatory view that depicts a step of connecting a pool chamber member after the steps of connecting the channel substrate to the piezoelectric element substrate according to the first embodiment of the invention;

FIG. 12-3F is an explanatory view that depicts a step of filling ink after the steps of connecting the channel substrate to the piezoelectric element substrate according to the first embodiment of the invention;

FIGS. 14A and 14B depict an inkjet recording head according to a second embodiment of the invention and, more specifically, are enlarged perspective views thereof near an electrical connection through hole;

FIG. 14C depicts the inkjet recording head according to the second embodiment of the invention and, more specifically, is a sectional view similar to that shown in FIG. 5;

FIGS. 15A to 15C are explanatory views that depict steps (A) to (C) of manufacturing a top plate member according to the second embodiment of the invention;

FIG. 16-1A is an explanatory view that depicts a step (A) of connecting the top plate member to a piezoelectric element substrate according to the second embodiment of the invention;

FIGS. 16-2B to 16-2C are explanatory views that depict steps (B) to (C) of connecting the top plate member to the piezoelectric element substrate according to the second embodiment of the invention;

FIGS. 18-1A to 18-1B are explanatory views that depict steps (A) to (B) of manufacturing the inkjet recording head according to the third embodiment of the invention;

FIGS. 18-2C to 18-2E are explanatory views that depict steps (C) to (E) of manufacturing the inkjet recording head according to the third embodiment of the invention;

FIGS. 18-3F to 18-3G are explanatory views that depict steps (F) to (G) of manufacturing the inkjet recording head according to the third embodiment of the invention;

FIGS. 23A and 23B are partially enlarged sectional views that depict different examples of an inkjet recording head according to an eighth embodiment of the invention;

FIG. 24 is a sectional view that depicts a substrate multilayer member according to a ninth embodiment of the invention;

FIGS. 26-1A to 26-1D are explanatory views that depict steps (A) to (D) of manufacturing a second substrate of the substrate multilayer member according to the ninth embodiment of the invention;

FIGS. 26-2E to 26-2G are explanatory views that depict steps (E) to (G) of manufacturing the second substrate of the substrate multilayer member according to the ninth embodiment of the invention;

FIGS. 27-1A to 27-1C are explanatory views that depict steps (A) to (C) of connecting the first substrate to the second substrate according to the ninth embodiment of the invention;

FIGS. 27-2D to 27-2E are explanatory views that depict steps (D) to (E) of connecting the first substrate to the second substrate according to the ninth embodiment of the invention;

FIGS. 32A to 32D are explanatory views that depict steps (A) to (D) of manufacturing a second printed wiring board according to the tenth embodiment of the invention;

FIGS. 33-1A to 33-1B are explanatory views that depict steps (A) to (B) of connecting the first printed wiring board to the second printed wiring board according to the tenth embodiment of the invention;

FIGS. 33-2C to 33-2D are explanatory views that depict steps (C) to (D) of connecting the first printed wiring board to the second printed wiring board according to the tenth embodiment of the invention;

DETAILED DESCRIPTION OF THE INVENTION

Figure 1:
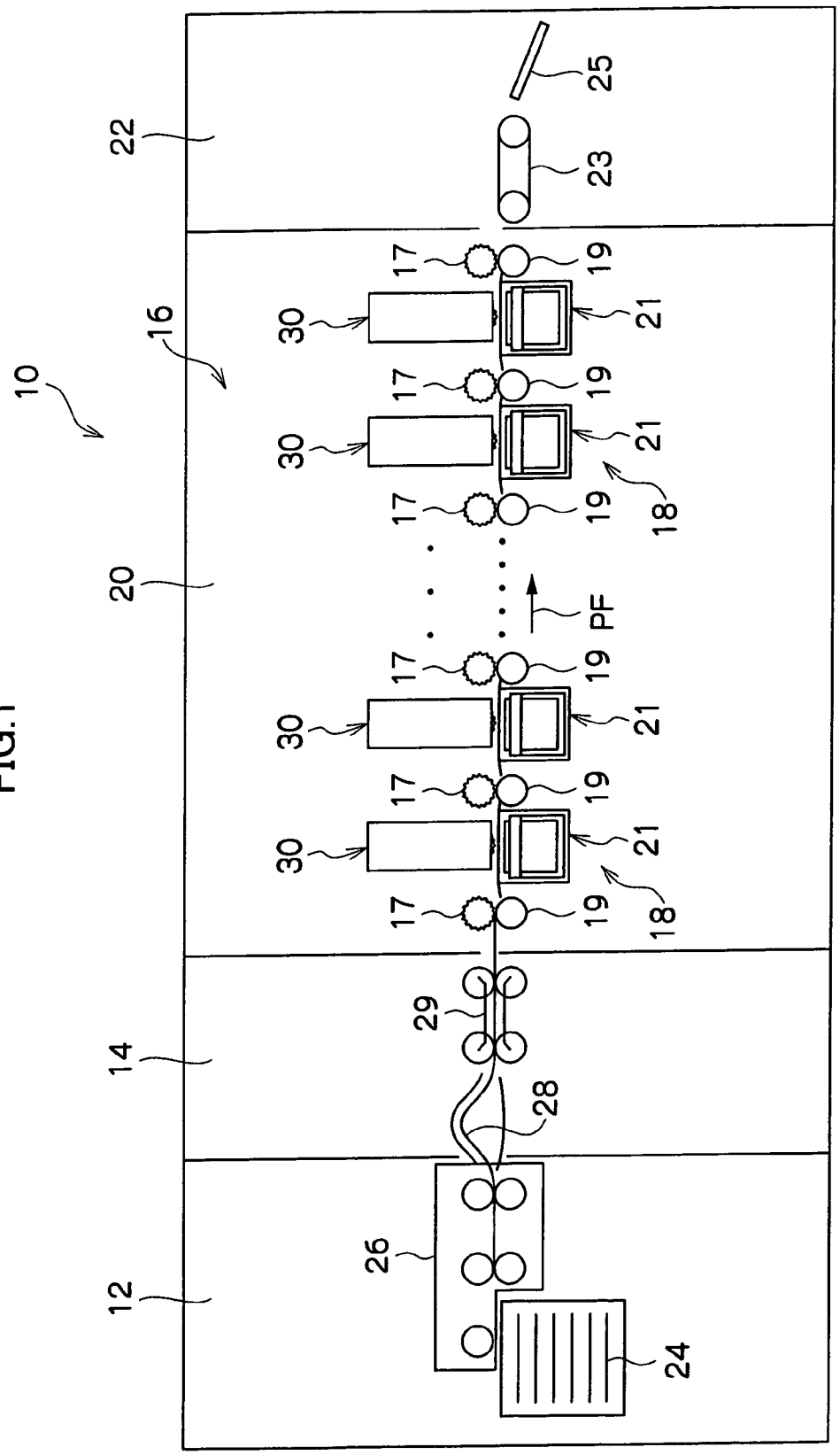
FIG. 1 is a schematic front view that depicts an inkjet recording apparatus according to the invention.

Embodiments of the present invention will be described hereinafter in detail with reference to the drawings. Descriptions will be given herein assuming that a recording medium is a recording sheet P. In addition, a feed direction of an inkjet recording apparatus 10 for feeding the recording sheet P is denoted by an arrow PF. In the drawings, when arrows UP, LO, ad PF are shown, they denote an upward direction, a downward direction, and a recording sheet feed direction, respectively, and when "up" and "down" are referred to, they correspond to the arrows UP and LO, respectively.

As shown in FIG. 1, an inkjet recording apparatus 10 basically includes a recording section 20 including a sheet supply section 12 that feeds a recording sheet, a registration adjustment section 14 that controls an attitude of the recording sheet, a recording head section 16 that discharges an ink droplet to form an image on the recording sheet, and a maintenance section 18 that performs maintenance of the recording head section 16, and a discharge section 22 that discharges the recording sheet on which the image has been formed by the recording section 20.

The sheet supply section 12 includes a stocker 24 in which recording sheets are stacked and stocked and a transport device 26 that takes out the recording sheets one by one and that transports the recording sheets to the registration adjustment section 14.

The registration adjustment section 14 includes a loop formation section 28 and a guide member 29 that controls the attitude of the recording sheet. By causing the recording sheet to pass through this registration adjustment section 14, a skew of the recording sheet is corrected using a flexibility of the sheet, and a transport timing of the recording sheet is controlled before the recording sheet enters the recording section 20.

The discharge section 22 stores the recording sheet on which the image has been formed by the recording section 20 in a tray 25 via a discharge belt 23.

A sheet transport path 27 on which the recording sheet P is transported is formed between the recording head section 16 and the maintenance section 18 (a transport direction of which is denoted by an arrow H). The recording sheet P is continuously transported (without intermission) while holding the recording sheet P between star wheels 17 and transport rolls 19. The ink droplet is discharged onto this recording sheet P from the recording head section 16, whereby the image is formed on the recording sheet P.

The maintenance section 18 is configured by maintenance devices 21 arranged to face respective inkjet recording units 30. The maintenance section 18 can perform processings on inkjet recording heads 32 such as capping, wiping, dummy jetting, and vacuuming.

As shown in FIG. 24, each inkjet recording unit 30 includes a support member 31 arranged in a direction orthogonal to the paper feed direction PF. Plural inkjet recording heads 32 are attached to this support member 31. Plural nozzles 56 are formed in a matrix on each inkjet recording head 32, and the nozzles 56 are aligned at a constant pitch as the whole inkjet recording unit 30 in a width direction of the recording sheet P. By discharging ink droplets from the nozzles 56 onto the recording sheet P continuously transported on the sheet transport path 27, images are formed on the recording sheet P.

At least, for example, four inkjet recording units 30 are arranged to correspond to respective colors of Y, M, C, and K so as to record a so-called full-color image on the recording sheet P.

Figure 25A:
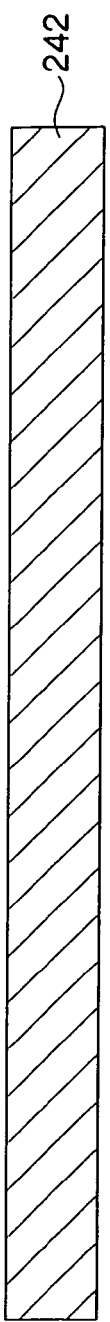
FIGS. 25A to 25C are explanatory views that depict steps (A) to (C) of manufacturing a first substrate of the substrate multilayer member according to the ninth embodiment of the invention.
Figure 25B:
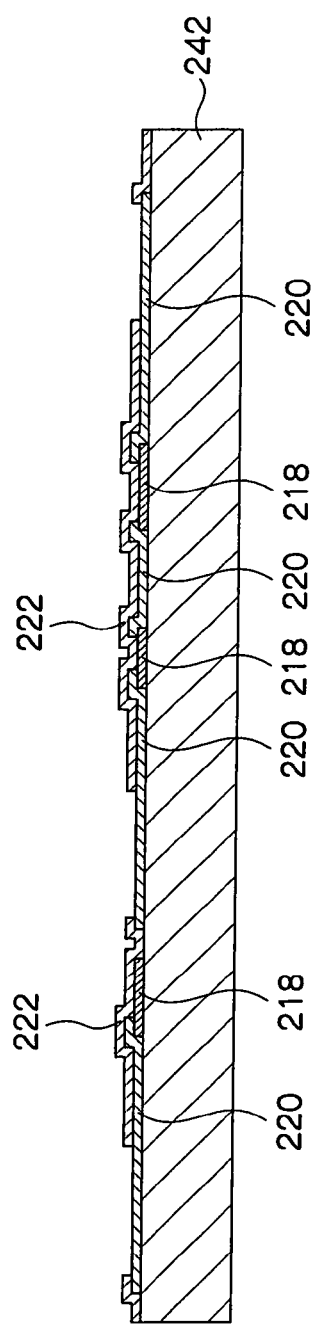
Figure 25C:
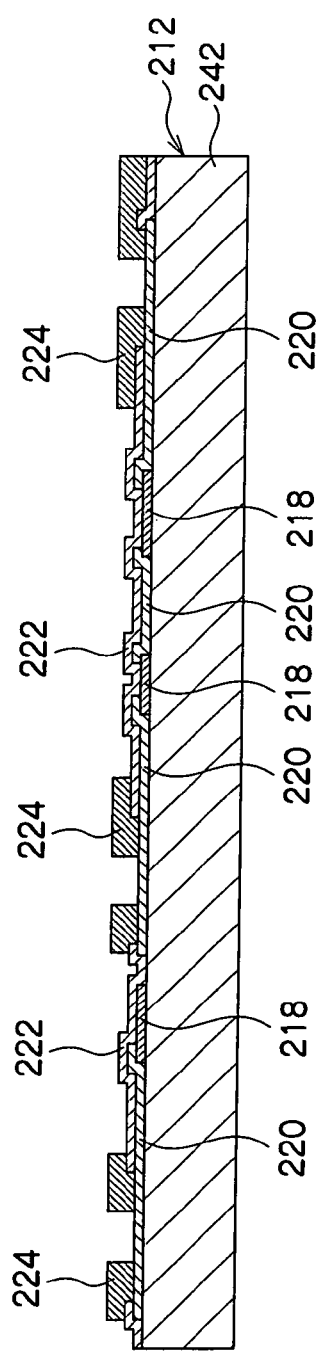

As shown in FIGS. 25A to 25C, a width of a print region by the nozzles 56 of each inkjet recording unit 30 is set larger than a sheet maximum width PW of the recording sheet P on which the image is to be recorded by this inkjet recording apparatus 10. As a result, the image can be recorded across an entire width of the recording sheet P without moving the inkjet recording unit 30 in a sheet width direction.

As the "print region", a basic print region is a region having a largest recording region obtained by removing non-printed margins from both ends of the recording sheet P. However, the print region is generally set larger than the print target sheet maximum width PW. This is because the recording sheet P may possibly be transported while being inclined (skewed) at a predetermined angle with respect to the transport direction and a demand for print without trimming margins is high.

Figure 3A:
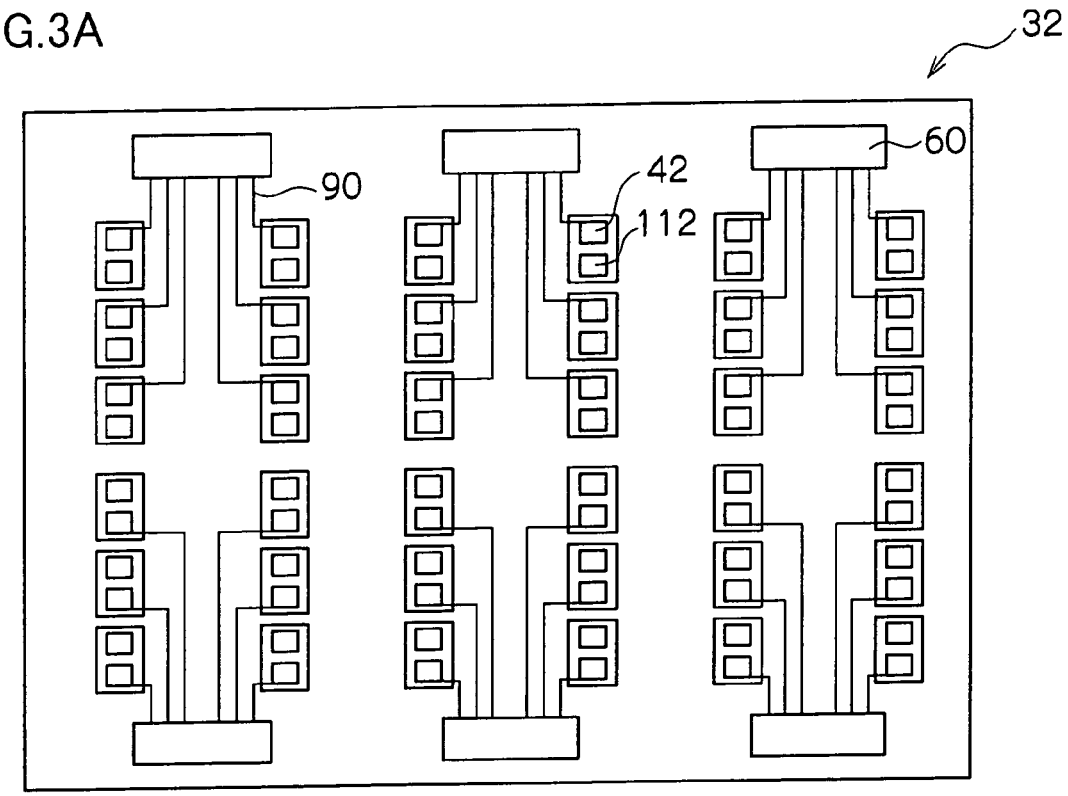
FIG. 3A is a schematic plan view that depicts a configuration of an inkjet recording head, more specifically, an overall configuration of the inkjet recording head, according to a first embodiment of the invention.
Figure 3B:
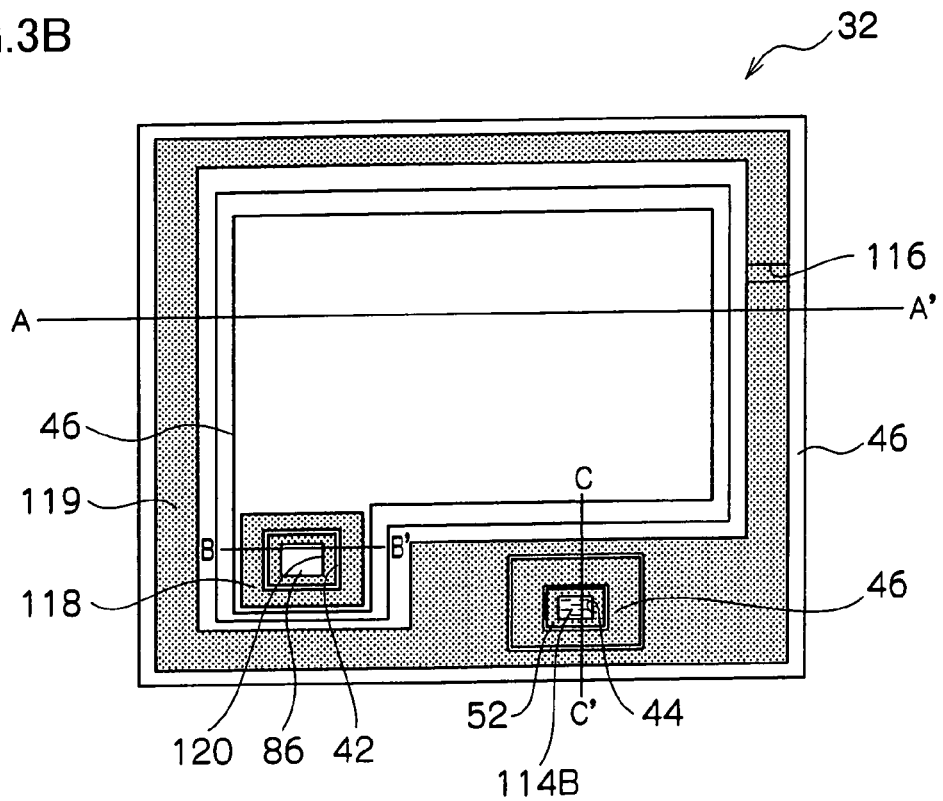
FIG. 3B is a schematic plan view that depicts a configuration of the inkjet recording head, more specifically, a configuration of one element, according to the first embodiment of the invention.

The inkjet recording head 32 of the inkjet recording apparatus 10 thus configured will next be described in detail. FIGS. 3A and 3B are schematic plan views that depict a configuration of the inkjet recording head 32 according to a first embodiment. FIG. 3A depicts an overall configuration of the inkjet recording head 32, and FIG. 3B depicts a configuration of one element.

Figure 4A:
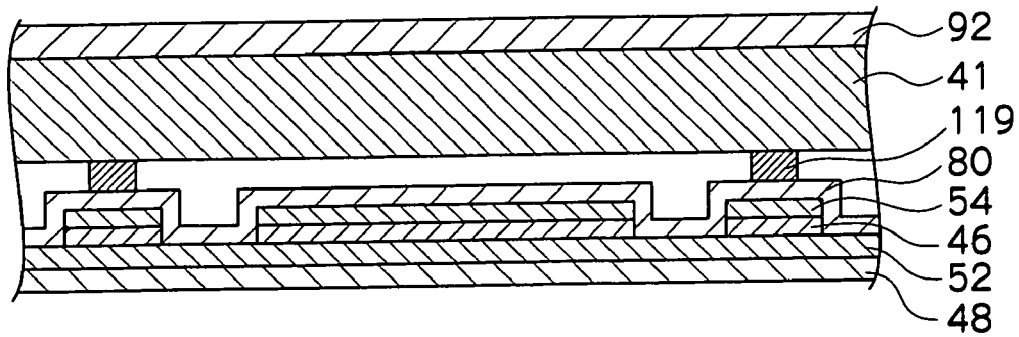
FIG. 4A depicts a configuration of the inkjet recording head according to the first embodiment and, more specifically, is a sectional view taken along a line A-A' of FIG. 3B.
Figure 4B:
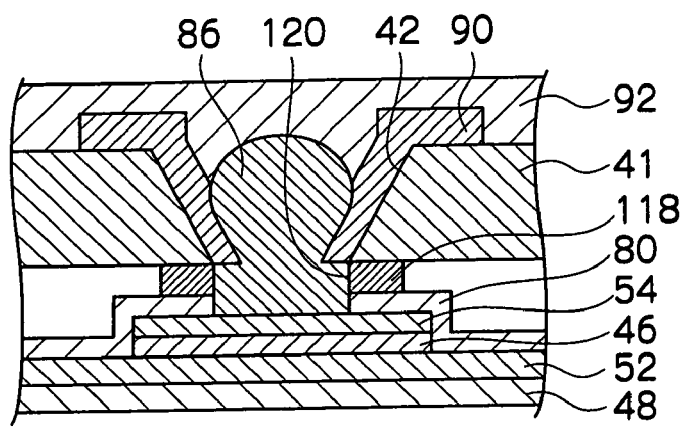
FIG. 4B depicts the configuration of the inkjet recording head according to the first embodiment and, more specifically, is a sectional view taken along a line B-B' of FIG. 3B.
Figure 4C:
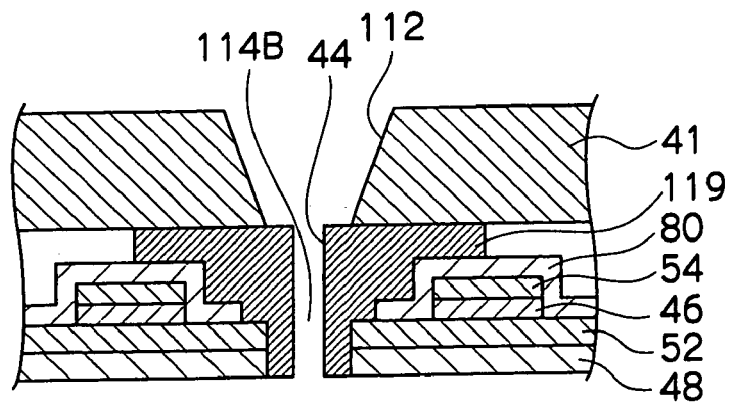
FIG. 4C depicts the configuration of the inkjet recording head according to the first embodiment and, more specifically, is a sectional view taken along a line C-C' of FIG. 3B.

FIGS. 4A to 4C depict respective sections shown in FIGS. 3A and 3B in cross sections taken along lines A-A', B-B', and C-C', respectively. It should be noted, however, that a channel substrate 72 and a pool chamber member 39 are not shown therein.

FIG. 5 is a schematic sectional view of the inkjet recording head 32 in which the inkjet recording head 32 is partially pulled out to clarify important parts of the recording head 32.

In this inkjet recording head 32, a top plate member 40 is arranged. In this embodiment, a glass top plate 41 constituting the top plate member 40 includes a plate wiring and serves as a top plate of the entire inkjet recording head 32. The top plate member 40 includes a driving IC 60 and metal wirings 90 for carrying a current to the driving IC 60. Each metal wiring 90 is covered and protected with a resin protection film 92.

Figure 6:
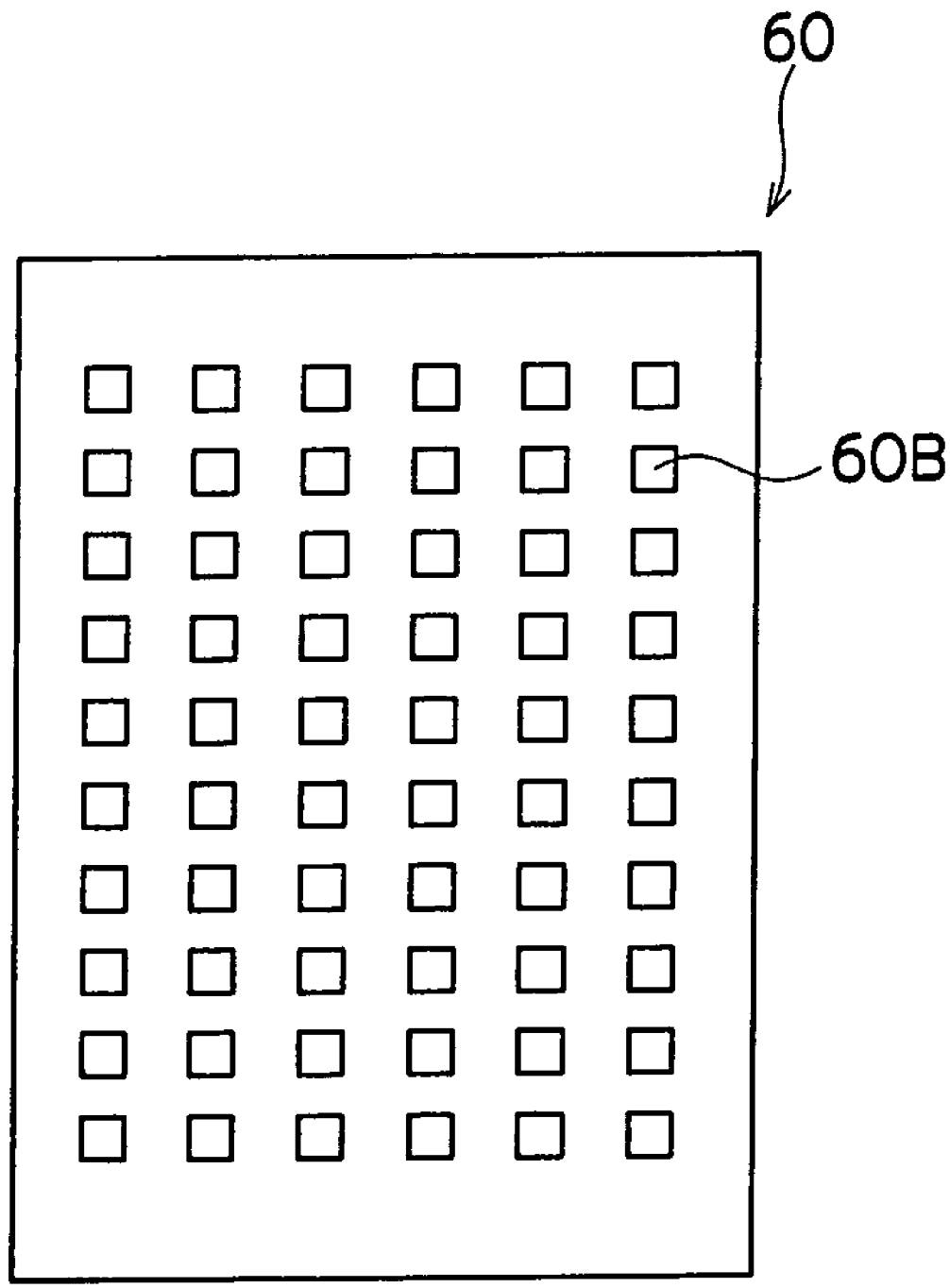
FIG. 6 is a schematic plan view that depicts bumps of a driving IC of the inkjet recording head according to the first embodiment.

As shown in FIG. 6, plural bumps 60B are provided in a matrix on a lower surface of this driving IC 60 so as to protrude by a predetermined height, and a flip-chip is mounted on the metal wirings 90 on the top plate 41. It is, therefore, possible to easily realize high-density arrangement of wirings with respect to a piezoelectric element 46 and reduction in resistance. It is thereby possible to scale down the inkjet recording head 32.

Surroundings of the driving IC 60 are sealed with a resin material 58.

The pool chamber member 39 constituted by an ink resistant material is bonded to the top plate member 40, thereby constituting an ink pool chamber 38 having a predetermined shape and a predetermined volume. An ink supply port 36 communicating with an ink tank is formed in the pool chamber member 39 at a predetermined position. An ink 110 injected from the ink supply port 36 is stored in the ink pool chamber 38.

Ink supply through ports 112 having a one-to-one correspondence to pressure chambers 50, to be described later, are formed in the top plate 41, and the interior of each through port 112 serves as a first ink supply path 114A.

Electrical connection through ports 42 are formed in the top plate 41 at positions corresponding to an upper electrode 54, to be described later. The metal wirings 90 of the top plate 41 extend into the electrical connection through ports 42 to cover inside surfaces of the respective electrical connection through ports 42. In addition, the metal wirings 90 come in contact with an upper electrode 54. Accordingly, the metal wirings 90 are electrically connected to the upper electrode 54, making it unnecessary to independently arrange wirings on a piezoelectric element substrate 70. A lower portion of each electrical connection through port 42 is a bottom 42B closed by each metal wiring 90, so that the electrical connection through port 42 is a closed space except for an upper opening.

The pressure chambers 50 filled with the ink supplied from the ink pool chamber 38 are formed on the channel substrate 72 so as to discharge ink droplets from the nozzles 56 communicating with the respective pressure chambers 50. Further, the pressure chambers 50 are configured so as not to be present on the same horizontal plane as the ink pool chamber 38. The pressure chambers 50 can be, therefore, arranged to be proximate to one another, thereby making it possible to arrange the nozzles 56 at high density in a matrix.

The piezoelectric element substrate 70 is bonded onto an opposite surface of the channel substrate 72 from the surface in which the nozzles 56 are formed, and constitutes one surface of each pressure chamber 50. The piezoelectric element substrate 70 includes a diaphragm 48. By generating a pressure wave by increasing and decreasing the volume of the pressure chambers 50 by vibration of the diaphragm 48, the ink droplets can be discharged from the nozzles 56.

The piezoelectric element 46 is bonded onto an upper surface of the diaphragm 48 at each pressure chamber 50. The diaphragm 48 is formed out of glass and exhibits elasticity at least in vertical directions. When the diaphragm is energized by the piezoelectric element 46 (a voltage is applied from the piezoelectric element 46 to the diaphragm 48), the diaphragm 48 is deflected (displaced) in the vertical direction. The diaphragm 48 may be constituted by a metal material such as SUS. A lower electrode 52 that has one polarity is arranged on a lower surface of the piezoelectric element 46 whereas the upper electrode 54 that has the other polarity is formed on the upper surface of the piezoelectric element 46.

The piezoelectric element 46 is covered and protected with a low water permeability insulating film (SiOx film) 80. The low water permeability insulating film (SiOx film) 80 with which the piezoelectric element 46 is covered and protected is formed under conditions such that water permeability of the film 80 is reduced. Thus, the low water permeability insulating film 80 can prevent water from entering into an interior of the piezoelectric element 46 to cause a reliability defect (deterioration in piezoelectric characteristics generated due to reduction of oxygen in the PZT film).

Further, a barrier resin layer 119 is formed on the low water permeability insulating film (SiOx film) 80. As shown in FIGS. 3A and 3B, the barrier resin layer 119 partitions a space between the piezoelectric element substrate 70 and the top plate member 40.

Ink supply through ports 44 are formed in the barrier resin layer 119 to communicate with the respective ink supply through ports 112 of the top plate 41. The interior of each ink supply through port 44 serves as a second ink supply path 114B. The second ink supply path 114B has a smaller cross-sectional area D2 than a cross-sectional area D1 of the first ink supply path 114A. The cross-sectional area D2 of the second supply path 114B is adjusted so that a channel resistance of all of the ink supply paths 114A is a predetermined resistance.

The cross-sectional area D1 of the first ink supply path 114A is set sufficiently larger than the cross-sectional area D2 and is adjusted so that a channel resistance of all of the first and second ink supply paths 114 is negligible as compared with that of all of the first and second ink supply paths 114B.

Namely, a channel resistance of an ink supply path 114 from the ink pool chamber 38 to each pressure chamber 50 is regulated only by each second ink supply path 114B. In addition, by supplying the ink through the ink supply through ports 44 thus formed in the barrier resin layer 119, ink leakage along the supply paths is prevented.

Air communication holes 116 are formed in the barrier resin layer 119 to reduce a pressure change of a space between the top plate 41 and the piezoelectric element substrate 70 during manufacturing of the inkjet recording heads 32 or during image recording.

A barrier resin layer 118 is laminated at a position corresponding to each electrical connection through port 42. As can be seen from FIGS. 3A and 3B, a through hole 120 through which the metal wiring 90 penetrates is formed in the barrier resin layer 118 so that a lower end of the metal wiring 90 can come in contact with the upper electrode 54. Although FIGS. 3A and 3B are sectional views at a position at which the barrier resin layer 118 is separated from the barrier resin layer 119, these layers 118 and 119 are actually partially connected to each other.

The barrier resin layers 118 and 119 constitute a gap between the top plate member 40 and the piezoelectric element 46 (strictly speaking, the low water permeability insulating film (SiOx film) 80), which gap serves as an air layer. This air layer prevents the top plate member 40 from influencing the driving of the piezoelectric element 46 and the vibration of the diaphragm 48.

Each electrical connection through port 42 is filled with a solder 86 so as to contact with the metal wiring 90. The metal wiring 90 is substantially reinforced, and a contact state (an electrical contact state) in which the metal wiring 90 contacts with the upper electrode 54 is improved. Even if the contact state is worsened by, for example, heat stress or mechanical stress, the contact state of the metal wiring can be kept good due to the solder 86.

Accordingly, a signal from the driving IC 60 is transmitted to the metal wiring 90 of the top plate member 40 and then transmitted from the metal wiring 90 to the upper electrode 54. A voltage is applied to the piezoelectric element 46 at predetermined timing, and the diaphragm 48 is vertically deflected, whereby the ink 110 filled into the pressure chambers 50 is pressurized and ink droplets are discharged from the nozzles 56.

The barrier resin layers 119 and 118 are configured so that upper surfaces thereof are equal in height, i.e., in the same plane. A height (distance) of a surface of the barrier resin layer 119 measured from the top plate 41 is, therefore, equal to that of an opposing surface of the barrier resin layer 118. As a result, a contact performance of the top plate 41 for coming into contact with the piezoelectric element substrate 70 is improved and sealing performance is improved, accordingly.

Manufacturing steps of the inkjet recording head 32 thus configured will now be described in detail with reference to FIGS. 7 to 14C.

Figure 7:
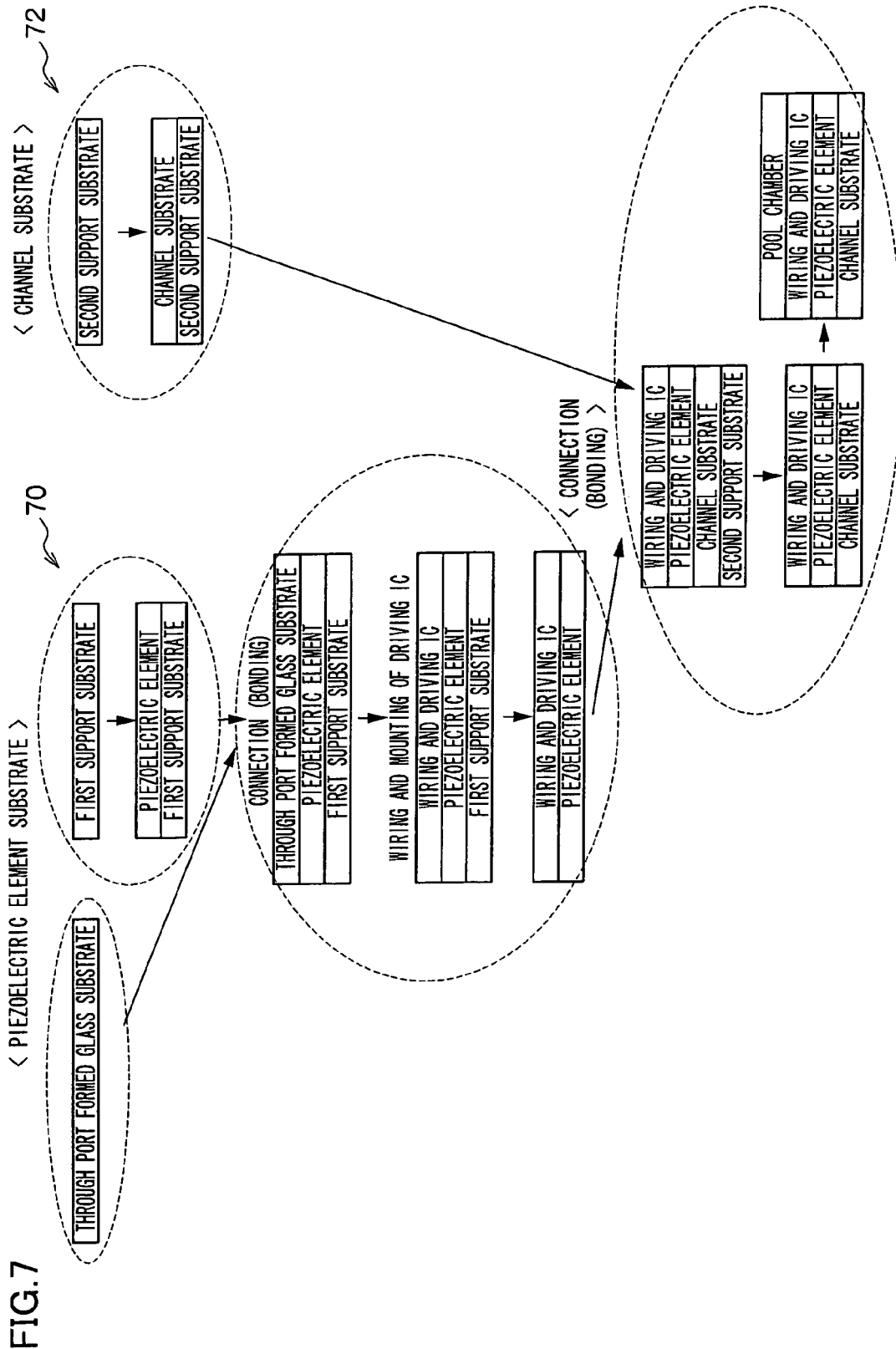
FIG. 7 is an explanatory view for overall steps of manufacturing the inkjet recording head according to the first embodiment of the invention.

As shown in FIG. 7, this inkjet recording head 32 is manufactured by separately forming the piezoelectric element substrate 70 and the channel substrate 72 and connecting the substrates 70 and 72. Steps of manufacturing the piezoelectric element substrate 70 will be, therefore, explained first. It is noted that the top plate member 40 is connected to the piezoelectric element substrate 70 earlier than the channel substrate 72.

Figures 2G, 8:
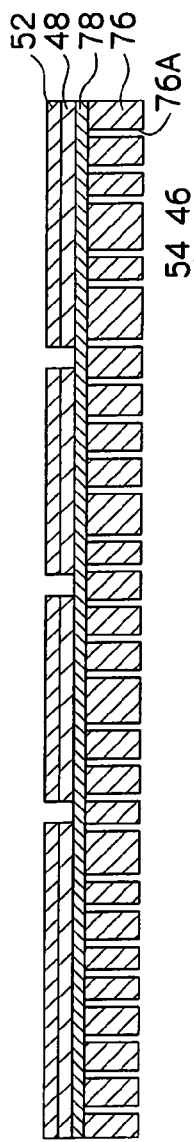
Figures 1A, 12:
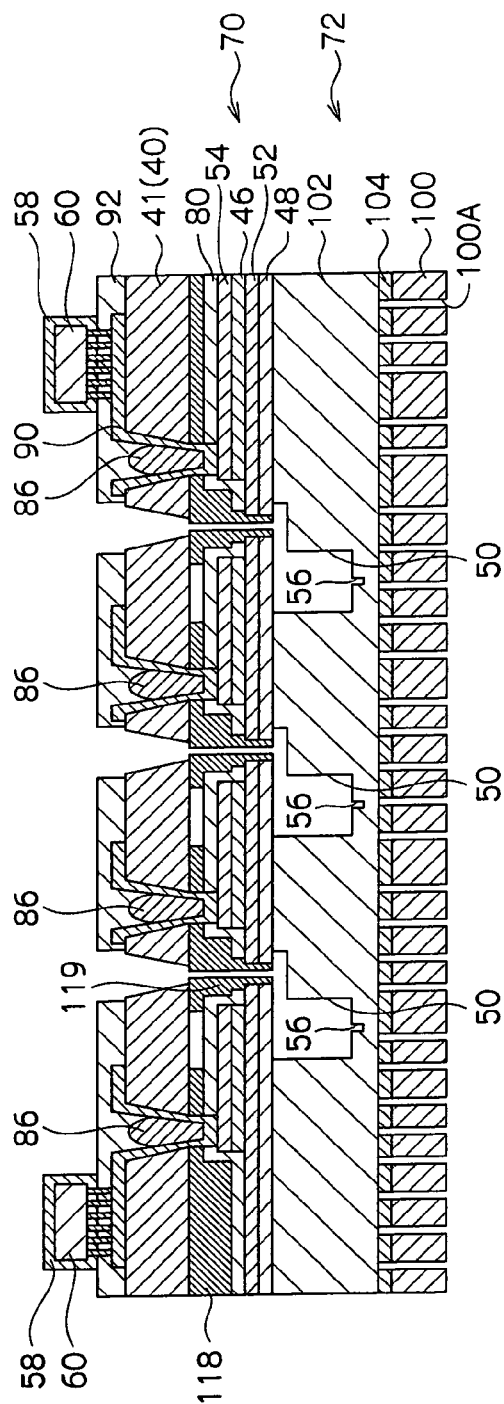

As shown in FIG. 8-1A, a first support substrate 76 made of glass in which plural through holes 76A are formed is prepared. A material for the first support substrate 76 is not limited to glass as long as it is not deflected. However, since glass is hard and inexpensive, it is preferable to use glass for the first support substrate 76. As a manufacturing method for this first support substrate 76, blasting and femtosecond laser processing performed on a glass substrate, exposure and development of a photosensitive glass substrate (e.g., PEG3C manufactured by HOYA CORPORATION) or the like is known. At this stage, the through holes 76A are formed so as not to penetrate the first support substrate 76.

Figures 1B, 12:
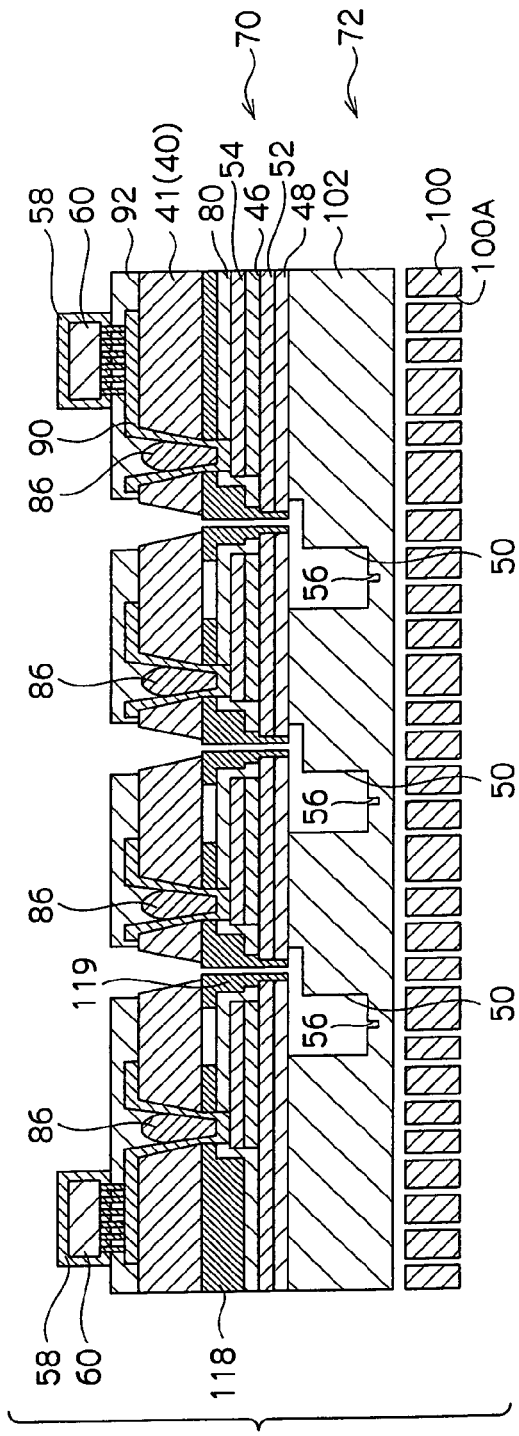

As shown in FIG. 8-1B, a Ge layer 78 is formed by sputtering. This Ge layer 78 functions as an adhesive layer and an interface peeling layer.

As shown in FIG. 8-1C, a glass substrate 88 is bonded to the Ge layer 78 by, for example, heat and pressure bonding (e.g., at 900° C. and 2 kg/cm$^2$ for ten minutes).

As shown in FIG. 8-1D, the glass substrate 88 is subjected to etching (e.g., HF etching). By forming the glass substrate 88 into a thin film, the diaphragm 48 having a predetermined thickness (e.g., 20 μm) is formed. In addition, the through holes 76A are made penetrate the support substrate 76.

As shown in FIG. 8-1E, the glass substrate 88 which has been made thinner is subjected again to etching (e.g., formation of a resist by photolithography, HF etching, and peeling of the resist by oxygen plasma) to thereby form hole portions 88H.

As shown in FIG. 8-1F, sputtering is performed to thereby form an Au film 62 having a thickness of, for example, about 0.5 μm.

Figures 2H, 8:
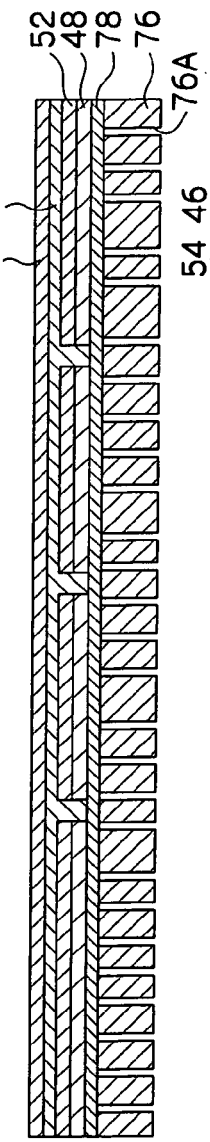
Figures 2I, 8:
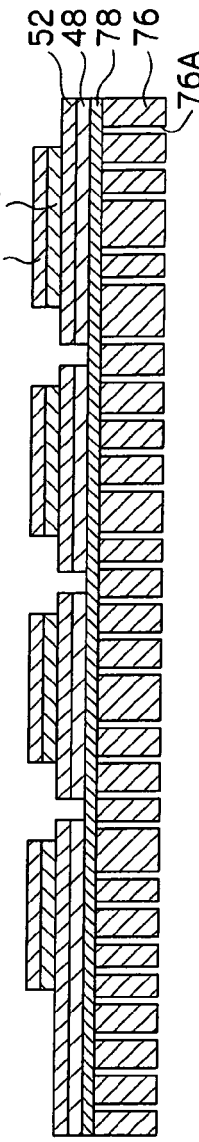

As shown in FIG. 8-2G, a multilayered lower electrode 52 is patterned on an upper surface of the diaphragm 48. Specifically, a resist is formed by photolithography, patterning (etching) is performed, and the resist is peeled off by oxygen plasma. This lower electrode 52 serves as a grounding potential. As shown in FIG. 8-2H, a PZT film that is a material for the piezoelectric element 46 and the upper electrode 54 are sequentially formed on an upper surface of the lower electrode 52. As shown in FIG. 8-2I, the piezoelectric element 46 (PZT film) and the upper electrode 54 are patterned.

Specifically, the PZT film is sputtered (to have a film thickness of 3 μm to 15 μm), a metal film is sputtered (to have a film thickness of 50 Å to 3000 Å), a resist is formed by photolithography, patterning (etching) is performed, and the resist is peeled off by oxygen plasma. Examples of a material for the lower and upper electrodes 52 and 54 include Au, Ir, and Pt having affinity for a PZT material for the piezoelectric element and heat resistance.

Figures 2J, 8:
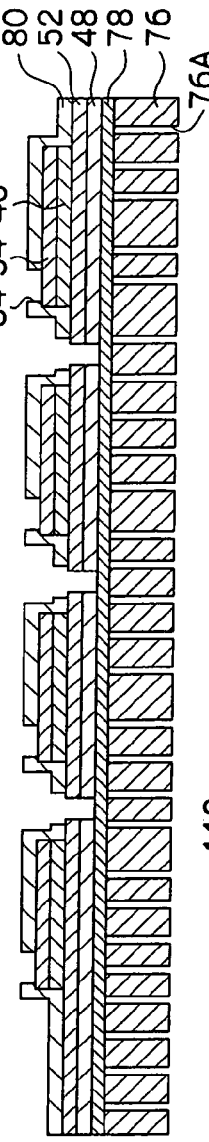

As shown in FIG. 8-2J, the low water permeability insulating film (SiOx film) 80 is formed on exposed upper surfaces of the lower electrode 52 and the upper electrode 54. By patterning, openings 84 (contact holes) for connecting the upper electrode 54 to the respective metal wirings 90 are formed.

Specifically, the low water permeability insulating film (SiOx film) 80 having a high dangling bond density is formed by chemical vapor deposition (CVD), a resist is formed by photolithography, patterning (etching) is performed, and the resist is peeled off by oxygen plasma. While the SiOx film is used here as the low water permeability film, an SiNx film, an SiOxNy film or the like may be used.

Figures 2K, 8:
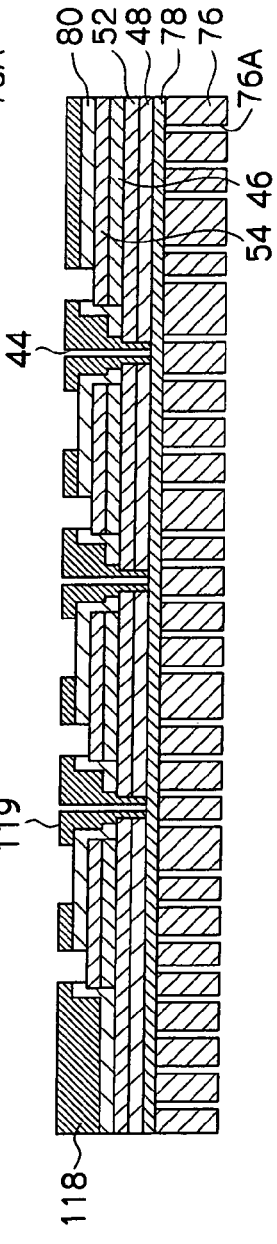

As shown in FIG. 8-2K, the barrier resin layers 119 and 118 are patterned. Specifically, a photosensitive resin that constitutes the barrier resin layers 119 and 118 is applied and subjected to exposure and development, thereby forming patterns. Finally, the patterns thus formed are cured. At this point, the ink supply through ports 44 are formed in the barrier resin layer 119. Although being identical in material, the barrier resin layers 119 and 118 differ in design pattern.

Figure 9A:
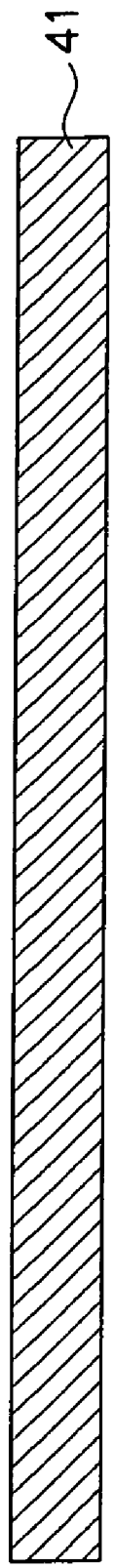
FIGS. 9A and 9B are explanatory views that depict steps (A) to (B) of manufacturing a top plate member according to the first embodiment of the invention.
Figure 9B:
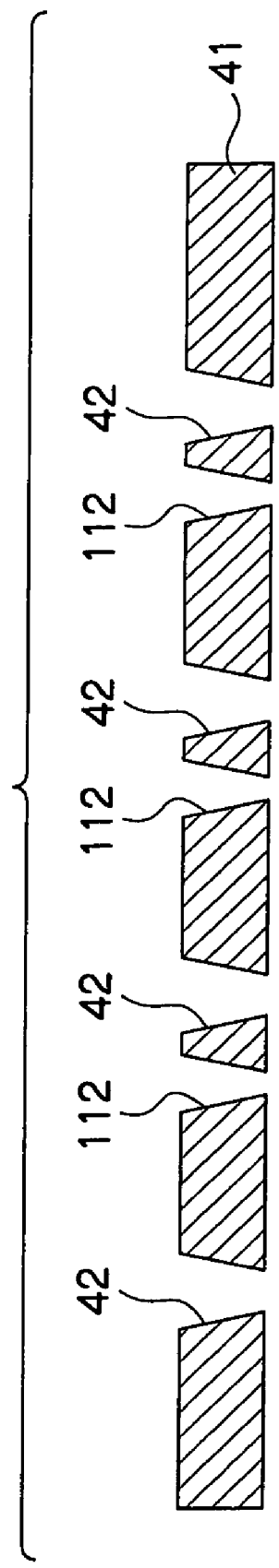

The piezoelectric element substrate 70 is thus manufactured, and the top plate member 40 having a glass plate, for example, used as a support is connected to this piezoelectric element substrate 70. In FIGS. 9A and 9B, a wiring formation surface is assumed to be a lower surface for the convenience of description. In actual steps, however, the wiring formation surface is an upper surface.

In the manufacturing of the top plate member 40, as shown in FIG. 9A, the top plate member 40 itself includes the top plate 41 of a sufficient thickness (0.3 to 1.5 mm) to secure strength to be able to serve as a support. It is, therefore, unnecessary to separately provide a support.

As shown in FIG. 9B, the ink supply through ports 112 and the electrical connection through ports 42 are formed in the top plate 41. Specifically, a resist of a photosensitive dry film is patterned by photolithography, openings are formed by sand blasting with this resist used as a mask, and the resist is peeled off by oxygen plasma.

The ink supply through ports 112 and the electrical connection through ports 42 are formed to be tapered (in a funnel shape) so that respective inside surfaces thereof become closer to each other in downward direction.

The top plate 41 (top plate member 40) in which the ink supply through ports 112 and the electrical connection through ports 42 are thus formed is covered onto the piezoelectric element substrate 70, and the top plate 41 and the piezoelectric element substrate 70 are connected (bonded) to each other by thermal compression bonding. Since the barrier resin layers 119 and 118 are configured to be flush with each other (equal in height), the contact performance when the top plate 41 comes in contact with the piezoelectric substrate 70 is improved, making it possible to bond them with high sealing performance, accordingly.

Figures 2D, 10:
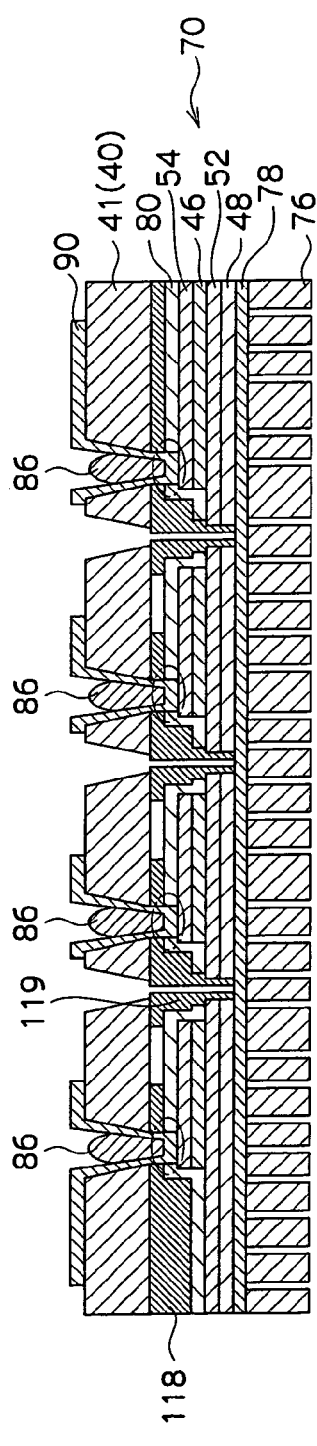

As shown in FIG. 10-1B, the metal wiring 90 is formed on an upper surface of the top plate 41 and patterned. Specifically, an Al film (having a thickness of 1 μm) is formed by sputtering, a resist is formed by photolithography, the Al film is wet etched using $H_3PO_4$ chemicals, and the resist is peeled off by oxygen plasma. Since a difference in height of the through ports is quite large, resist spray coating and exposure at long focal depth are employed in the photolithographic step. At this time, the metal wiring 90 is patterned so that a part of the metal wiring 90 can reach the upper electrode 54 from an inside surface of each electrical connection through port 42. The bottom 42B of the electrical connection through port 42 is thereby closed by the metal wiring 90, so that the electrical connection through port 42 is a closed space except for the upper opening.

If the metal thin film is to be formed deep in the through port 42, the CVD, which is superior in different-height part covering performance to the sputtering, may be adopted.

As shown in FIG. 10-1C, the solder 86 is mounted in the electrical connection through port 42 on which the metal wiring 90 is thus patterned (in the space). To do so, a solder ball method for directly mounting a solder ball 86B in the electrical connection through port 42 can be used.

Alternatively, as shown in FIG. 10-4A, a heated and molten solder discharge and supply method to which the principle of inkjet is applied may be used. With this method, the solder 86 can be supplied to a predetermined position without contact with the top plate 41 and without using a mask. Further, as shown in FIG. 10-4B, a screen printing method may be used to supply the solder 86.

Whichever supply method is used, the solder 86 tends to be bonded to the inside surface of the electrical connection through port 42 since the electrical connection through port 42 is formed to have a tapered shape (a funnel shape) so that the inside surface of the through port 42 is narrower in cross section in a downward direction.

As shown in FIG. 10-2D, the solder 86 is subjected to reflow (e.g., at 280° C. for ten minutes), thereby spreading the solder 86 to the bottom 42B of the electrical connection through port 42. At this time, there is no path from which the molten solder flows out at the bottom 42B of the electrical connection through port 42. It is, therefore, possible to sufficiently melt the solder 86 in a high temperature environment and to ensure filling of the solder 86 into the bottom 42B of the electrical connection through port 42.

At this stage, the solder 86 is located inside the electrical connection through port 42 relative to a lower surface (on which the metal wiring 90 is not formed) of the top plate 41, so that the solder 86 is ensured to come in contact with the metal wiring 90 within the electrical connection through port 42. At a bottom of the metal wiring 90, i.e., a region in contact with the upper electrode 54, in particular, the Al film constituting the metal wiring 90 is often thinner. Moreover, a mechanical stress may possibly be applied to the metal wiring 90 due to thermal expansion of the barrier resin layer 119 or the like, whereby the metal wiring 90 may possibly be broken.

Even in such a case, the solder 86 filled into the bottom 42B connects the bottom 42B to the metal wiring 90 within the electrical connection through port 42. It is, therefore, possible for the solder 86 to keep continuity between the bottom 42B and the metal wiring 90. In addition, since the molten solder 86 does not flow out from the electrical connection through port 42, the solder 86 does not inadvertently cause a short-circuit near the electrical connection through port 42.

It is noted that an amount of the solder to be filled is set to a predetermined amount in advance so that the solder 86 molten at this stage is not located above the upper surface of the top plate 41 (strictly speaking, the upper surface of the metal wiring 90).

Figures 2E, 10:
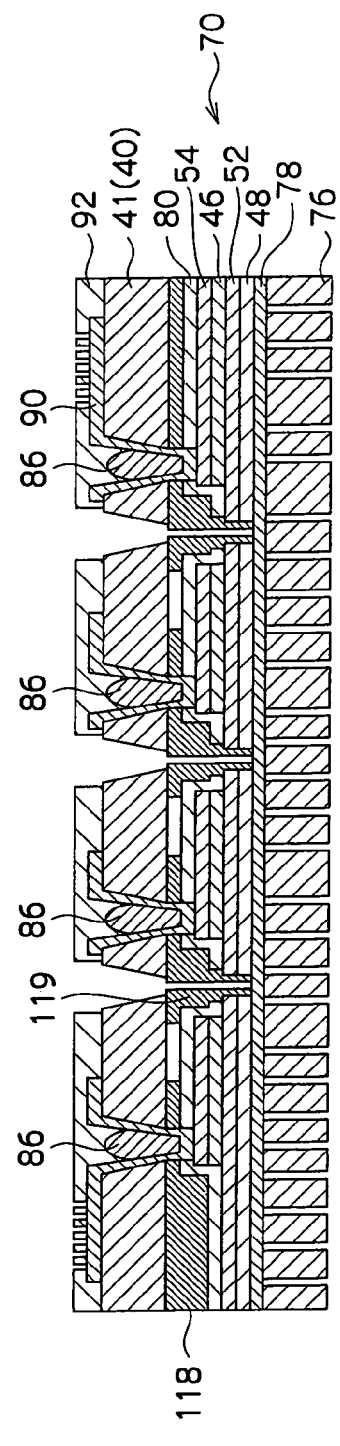

As shown in FIG. 10-2E, the resin protection film 92 (e.g., photosensitive polyimide "Durimide 7320" manufactured by Fujifilm Arch Co., Ltd.) is provided and patterned on the surface of the substrate 70 on which the metal wiring 90 is formed. At this time, the resin protection film 92 is provided so as not to cover the first ink supply path 114A. As a material for this resin protection film 92, a material such as polyimide resin, epoxy resin, polyurethane resin, or silicon resin that is ink proof may be used.

Figures 2F, 10:
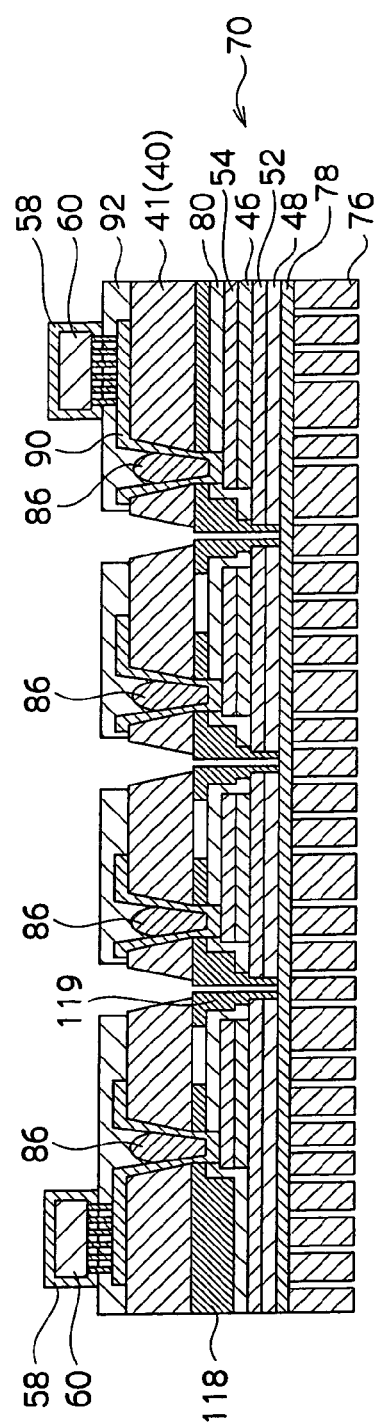

As shown in FIG. 10-2F, the driving IC 60 is flip-chip mounted on the metal wiring 90. At this time, the driving IC 60 is processed to have a predetermined thickness (70 μm to 3000 μm) in a grinding step executed after the end of semiconductor wafer process in advance. Surroundings of the driving IC 60 are sealed with the resin material 58 so as to be able to protect the driving IC 60 from the external environment such as water. Further, by sealing the surroundings of the driving IC 60 with the resin material 58, it is possible to avoid damage in later steps, e.g., damage due to water or a ground piece when the completed piezoelectric element substrate 70 is divided into the inkjet recording heads 32 by dicing.

As shown in FIG. 10-3G, the Ge layer 78 is etched away (e.g., by an $H_2O_2$ treatment at 80° C. for 60 minutes), thereby separating the first support substrate 76.

As a result, as shown in FIG. 10-3H, the piezoelectric element substrate 70 to which the top plate member 40 is connected (bonded) is completed. From this state, the top plate 40 of the top plate member 41 serves as the support for the piezoelectric element substrate 70.

Meanwhile, as for the channel substrate 72, a second support substrate 100 made of glass in which plural through holes 100A are formed is prepared. Similarly to the first support substrate 76, a material for the second support substrate 100 is not limited to glass as long as it is not deflected. However, since glass is hard and inexpensive, it is preferable to use glass for the second support substrate 100. As a manufacturing method for this second support substrate 100, blasting and femtosecond laser processing performed on a glass substrate, exposure and development of a photosensitive glass substrate (e.g., PEG3C manufactured by HOYA CORPORATION) or the like is known.

Figure 11A:
FIGS. 11A to 11E are explanatory views that depict steps (A) to (E) of manufacturing a channel substrate according to the invention.
Figure 11B:
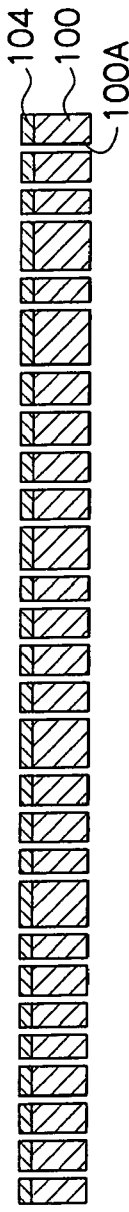
Figure 11C:
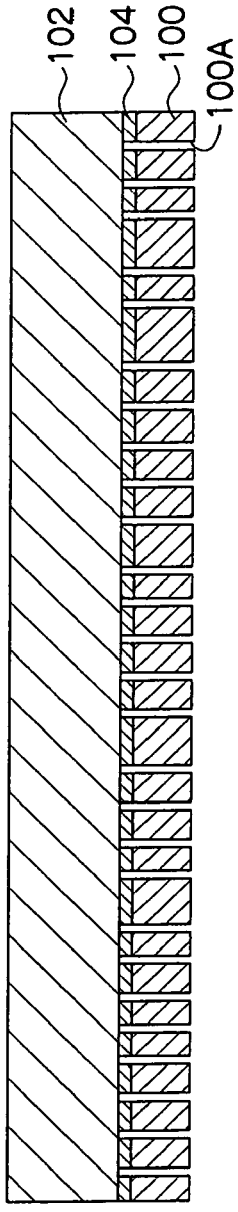
Figure 11D:
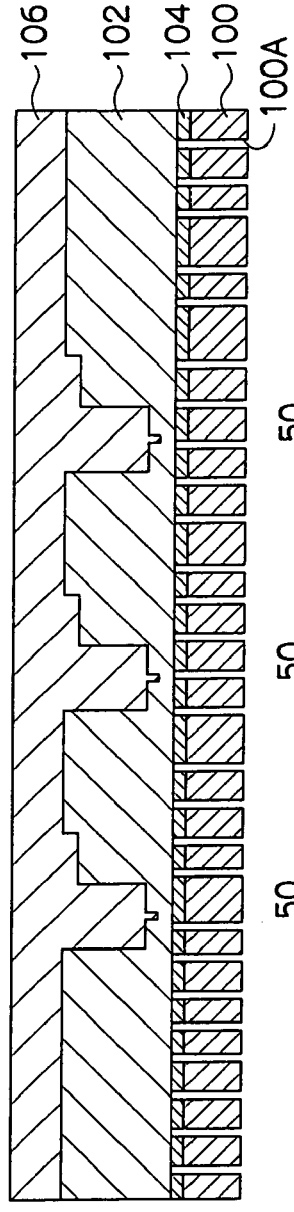
Figure 11E:
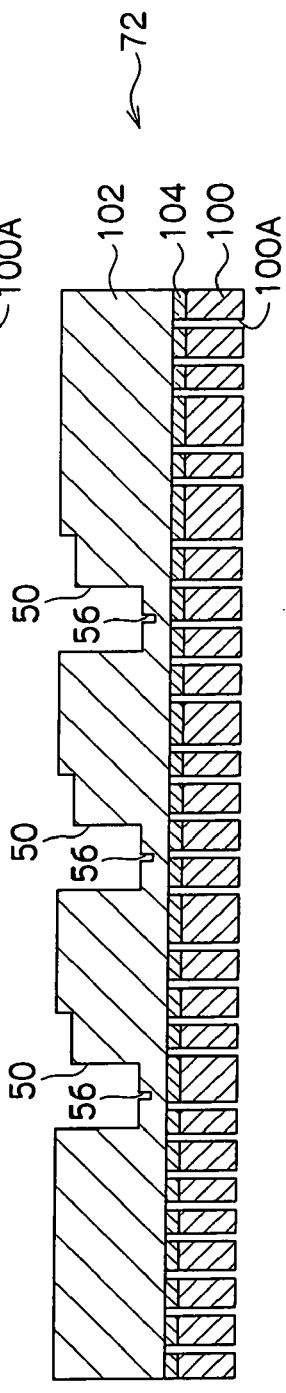

As shown in FIG. 11B, an adhesive 104 is applied onto an upper surface (a front surface) of the second support substrate 100. As shown in FIG. 11C, a resin substrate 102 (e.g., an amido-imide substrate having a thickness of 0.1 to 0.5 mm) is bonded onto an upper surface (a front surface) of the adhesive 104. As shown in FIG. 11D, an upper surface of the resin substrate 102 is pressed against a metal mold 106 and heated and pressurized. As shown in FIG. 11E, the metal mold 106 is separated from the resin substrate 102, thereby completing the channel substrate 72 on which the pressure chambers 50, the nozzles 56 and the like are formed.

When the channel substrate 72 is completed, the piezoelectric element substrate 70 is connected (bonded) to the channel substrate 72 by thermal compression bonding as shown in FIG. 12-1A. During bonding, the piezoelectric element substrate 70 is bonded to the channel substrate 72 so as to hold the substrate 70 between a holding member provided above the substrate 70, not shown, and the channel substrate 72 provided below the substrate 70. At this time, by adjusting the solders 86 so as not to be located above the upper surface of the top plate 41, the solders 86 do not protrude from the electrical connection through ports 42. It is, therefore, possible to ensure bonding of the substrate 70 to the channel substrate 72 without causing an inadvertent force to act on bonded portions or the like and without bonding defects.

As shown in FIG. 12-1B, an adhesive remover is injected from the through holes 100A of the second support substrate 100 by an organic ethanol-amine treatment to selectively dissolve the adhesive 104, thereby separating the second support substrate 100 from the channel substrate 72.

Figures 2C, 12:
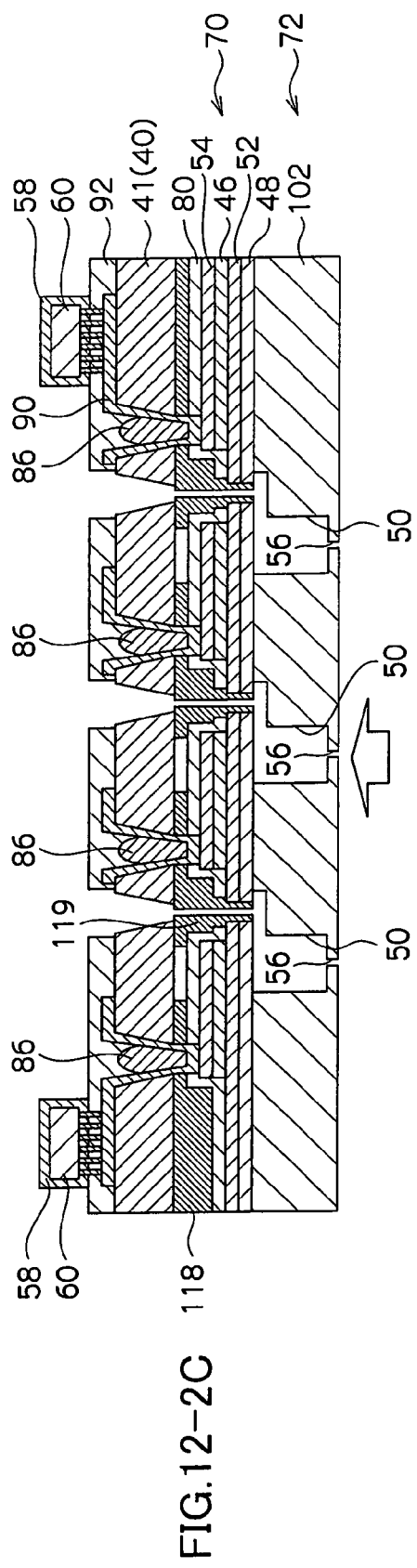
Figures 2D, 12:
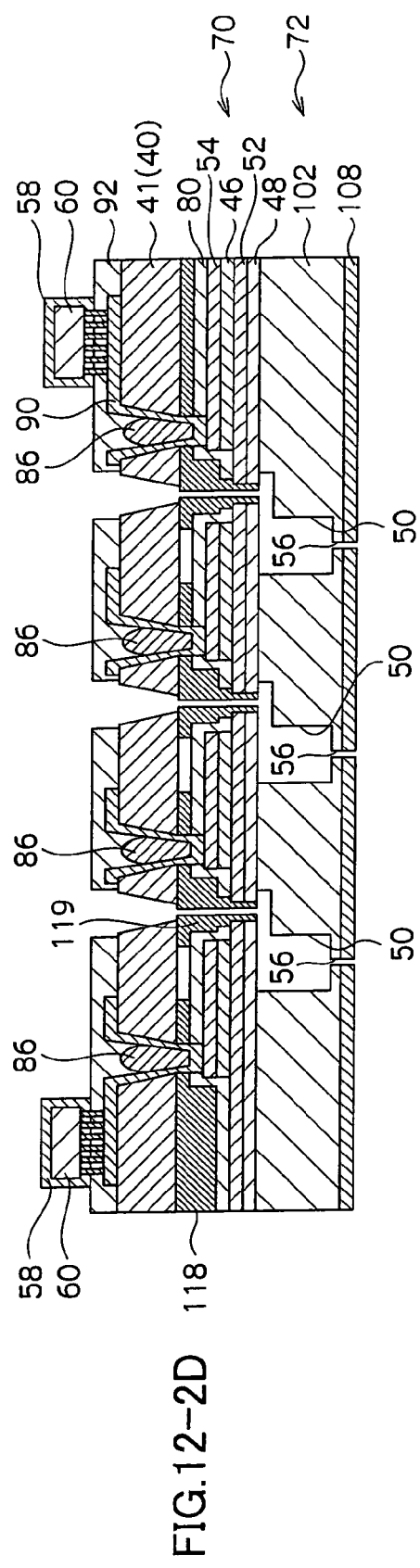

As shown in FIG. 12-2C, a surface of the channel substrate 72 from which the second support substrate 100 is separated is subjected to a polishing processing using a polishing compound that mainly consists of alumina or a RIE processing using oxygen plasma, thereby removing a surface layer and opening the nozzles 56. As shown in FIG. 12-2D, a fluorine material 108 (e.g., "Cytop" manufactured by Asahi Glass Co., Ltd.) serving as water repellent agent is applied onto a lower surface in which the nozzles 56 are opened.

Figures 3E, 12:
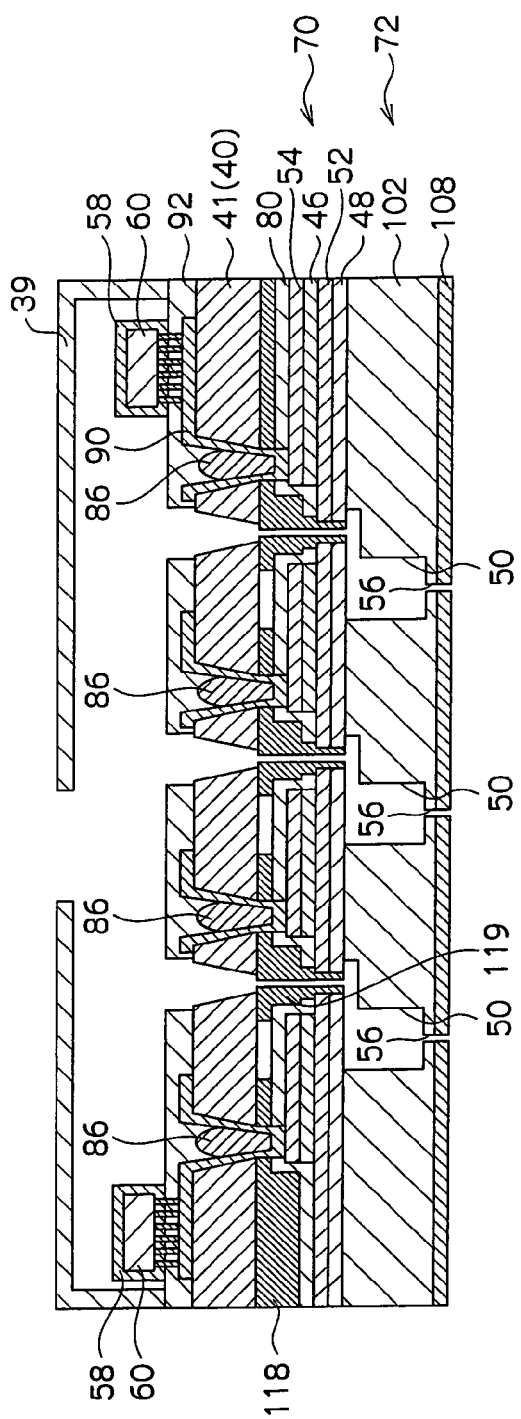
Figures 3F, 12:
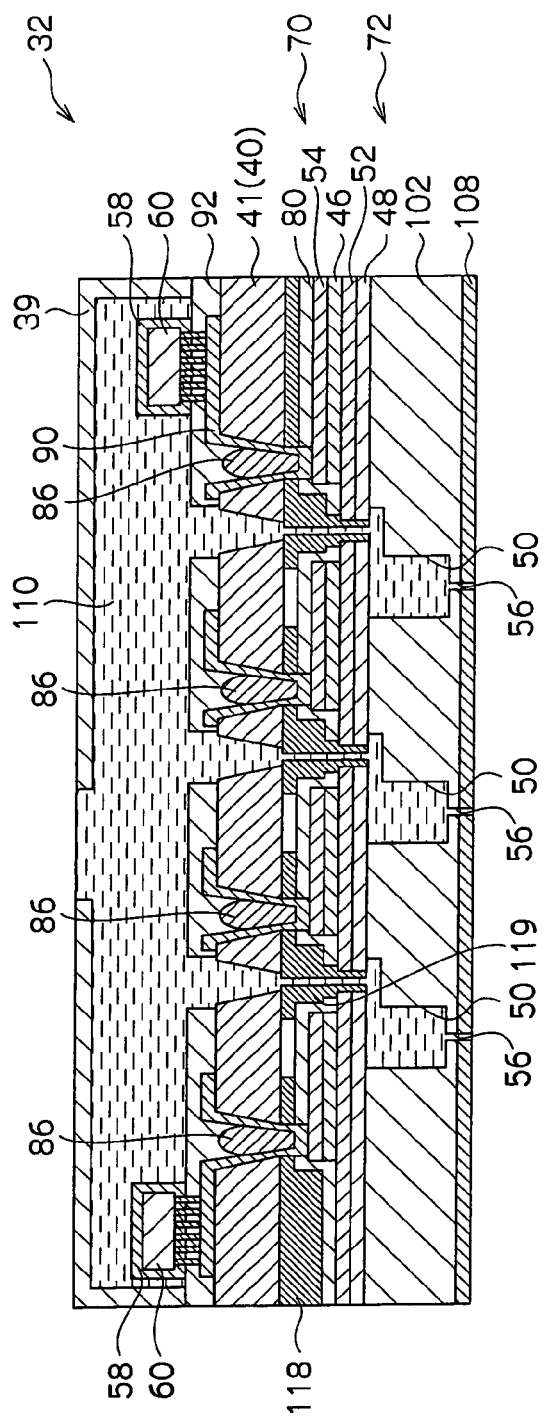
Figure 13:
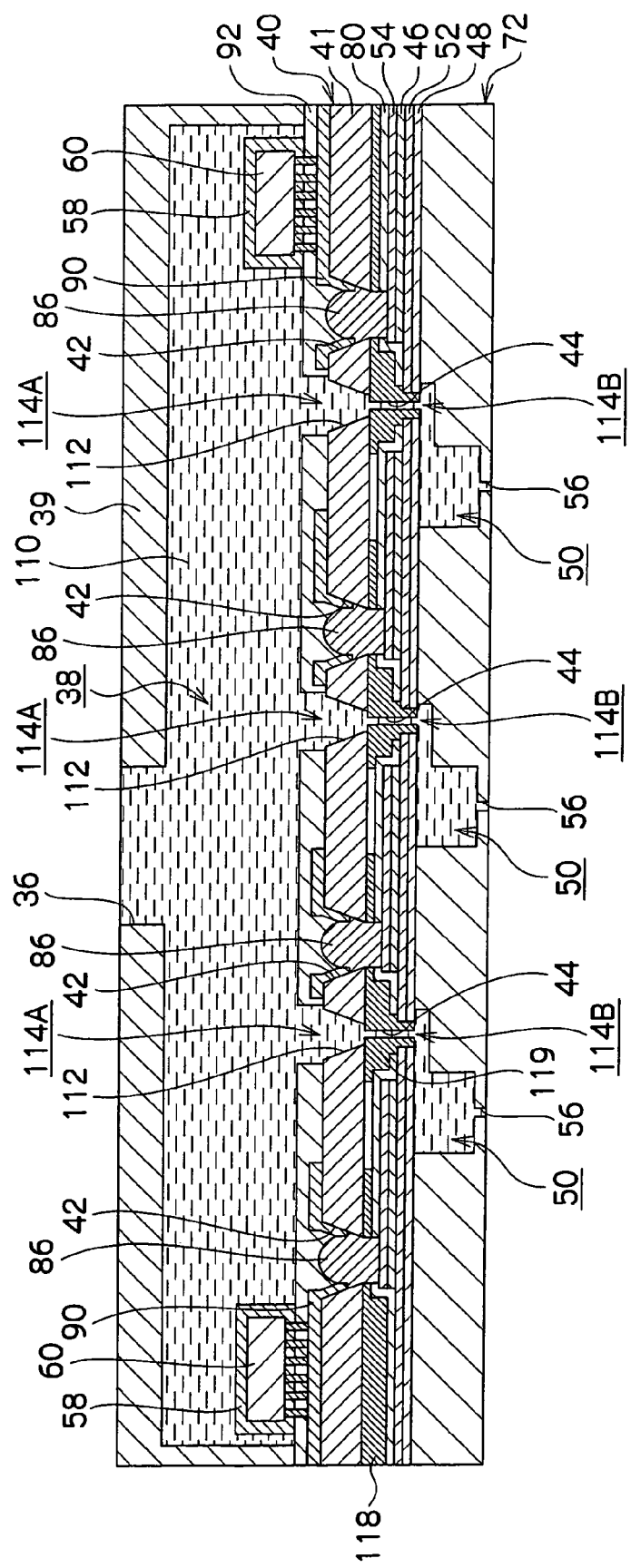
FIG. 13 is a sectional view that depicts a different configuration of the inkjet recording head from that shown in FIG. 5 according to the first embodiment of the invention.

As shown in FIG. 12-3E, the pool chamber member 39 is attached to an upper surface of the top plate member 40 (top plate 41), and the ink pool chamber 38 is constituted between the pool chamber member 39 and the top plate member 40, thereby completing the inkjet recording head 32. As shown in FIG. 12-3F, the ink 110 can be filled into the ink pool chamber 38 and the pressure chambers 50.

Operation of the inkjet recording apparatus 10 including the inkjet recording heads 32 manufactured as described above will next be described. When an electric signal for instructing the inkjet recording apparatus 10 to print is sent, one recording sheet P is picked up from the stocker 24 and transported by the transport device 26.

In each inkjet recording unit 30, the ink 110 is already injected into (filled into) the ink pool chamber 38 of each inkjet recording head 32 from the ink tank, and the ink 110 filled into the ink pool chamber 38 is supplied (filled) into the pressure chambers 50 via the ink supply paths 114. At this time, a meniscus in which a surface of the ink 110 is slightly concave on the pressure chamber 50 side is formed on a tip end (discharge port) of each nozzle 56.

By selectively discharging ink droplets from plural nozzles 56 while transporting the recording sheet P, a part of an image based on image data is recorded on the recording sheet P. Namely, voltages are applied to the predetermined piezoelectric elements 46 at predetermined timing by the driving IC 60, the diaphragm 48 is vertically deformed or deflected (undergoes out-of-plane vibration), the ink 110 in the pressure chambers 50 is pressurized, and the ink 110 is discharged from the predetermined nozzles 56 as ink droplets.

When the image based on the image data is completely recorded on the recording sheet P, the recording sheet P is discharged to the tray 25 via the discharge belt 23. Print processing (image recording) on the recording sheet P is thereby completed.

Each of the inkjet recording heads 32 is configured so that the diaphragm 48 (piezoelectric element 46) is arranged between the ink pool chamber 38 and the pressure chamber 50 and so that the ink pool chamber 38 and the pressure chamber 50 are not in the same horizontal plane with each other. Accordingly, the pressure chambers 50 are arranged to be proximate to one another and the nozzles 56 are arranged at high density.

Further, the driving IC 60 for applying the voltage to the piezoelectric element 46 is configured not to be exposed to (protrude to) the outside of the diaphragm 48 and the top plate member 40 (incorporated in the inkjet recording heads 32). As compared with a configuration in which the driving IC 60 is mounted externally of the inkjet recording head 32, a length of the metal wiring 90 that connects the piezoelectric element 46 to the driving IC 60 can be made small, thereby making it possible to realize reduction in resistance from the driving IC 60 to the piezoelectric element 46.

Namely, the high density of the nozzles 56, that is, high density matrix arrangement of the nozzles 56, is realized at a practical resistance, whereby increase in resolution can be realized. Moreover, the driving IC 60 therefor is flip-chip mounted on the top plate 41, so that high density wiring connection can be easily realized and the height of the driving IC 60 can be reduced (the driving IC 60 can be made thin). It is, therefore, possible to scale down the inkjet recording head 32.

Specifically, according to the conventional electrical connection based on a flexible printed circuit (FPC) method, a nozzle resolution is limited to 600 npi (nozzle per pitch). According to the method of the invention, the nozzles can be easily arranged at a nozzle resolution of 1200 npi. As for size, as compared with the nozzle arrangement at the resolution of 600 npi, a size can be reduced to be equal to or smaller than half the size of the conventional nozzle arrangement since it is unnecessary to use an FPC.

Since the metal wiring 90 of the top plate 41 is covered with the resin protection film 92, it is possible to prevent corrosion of the metal wiring 90 by the ink 110.

The driving IC 60 and the upper electrode 54 are connected to each other by the metal wiring 90 within each electrical connection through port 42 formed in the top plate 41. Further, the solder 86 is filled into the electrical connection through port 42, so that the bottom 42B (see FIG. 10-1B) is reinforced. Due to this, even if thermal stress or mechanical stress acts on the bottom 42B, it is possible to ensure that the contact state in which the metal wiring 90 comes in contact with the upper electrode 54 is maintained. Even if the metal wiring 90 is broken, the continuous state can be secured by the solder 86.

If a film formation method such as sputtering, which is inferior in different-height part covering performance, is applied to the electrical connection through port 42 having a small diameter, the metal thin film (metal wiring 90) is often formed only in an upper region of the electrical connection through port 42. In such a case, however, the method of the invention can ensure that the continuous state is maintained since the solder 86 connects the upper and lower wirings (the metal wiring 90 and the upper electrode 54).

If it is necessary to reduce a size of the electrical connection through port 42, i.e., to use the electrical connection through port 42 having a small diameter, the above-described connection method is often adopted.

Furthermore, the top plate member 40 can be electrically connected to the piezoelectric element substrate 70 without forming wirings and bumps on a back surface (lower surface) of the top plate 41. That is, it suffices to process only one surface (an upper surface) of the top plate 41, thereby facilitating manufacturing.

To electrically connect the metal wirings 90 to the upper electrodes 54 by, for example, bumps or the like, it is sometimes difficult to bond the top plate member 40 to the piezoelectric element substrate 70 if heights of the bumps are irregular. According to this embodiment, however, even if the amounts of the solder are irregular, the top plate member 40 can be bonded to the piezoelectric element substrate 70 since an excessive amount of the solder is contained in each electrical connection through port 42. A wide margin of irregularity in the amount of the solder can be set, which can also facilitate manufacturing.

In the connection portion in which the metal wiring 90 is connected to the upper electrode 54, only the metal wiring 90, the upper electrode 54, and the solder are substantially present, and they exhibit high temperature resistance. As a result, flexibility of the processing method and selection of materials in later steps (e.g., the step of bonding the channel substrate 72 to the substrate 70 in the above-described manufacturing process) can be improved.

As stated so far, the piezoelectric element substrate 70 and the channel substrate 72 that constitute this inkjet recording head 32 are always manufactured on the hard support substrates 76 and 100, respectively. In their manufacturing steps, when the support substrates 76 and 100 become unnecessary, they are removed. The inkjet recording head 32 is, therefore, configured to be easily manufactured. The inkjet recording head 32 thus manufactured (completed) is supported by the top plate 41 (that is, the top plate 41 serves as the support for the inkjet recording head 32), so that rigidity of the inkjet recording head 32 can be secured.

In the inkjet recording apparatus 10 according to this embodiment, ink droplets are selectively discharged from the inkjet recording heads 32 of the inkjet recording units 30 for the respective colors of black, yellow, magenta, and cyan, and a full-color image is recorded on the recording sheet P. However, inkjet recording according to the invention is not limited to recording of characters and images on the recording sheet P.

Namely, a type of a recording medium is not limited to paper, and also a type of the discharged liquid is not limited to ink. For example, ink can be discharged onto a polymeric film or glass to form a color filter for a display, and welded solder can be discharged onto a substrate to form bumps for component mounting. The inkjet recording head 32 according to the invention can be applied to all industrial droplet discharge apparatuses.

Further, FWA is taken as an example for the inkjet recording apparatus 10 according to this embodiment. Alternatively, the invention can be also applied to a Partial Width Array (PWA) including a main scan mechanism and a sub scan mechanism.

Next, inkjet recording heads according to second to seventh embodiments of the invention will be described. For these inkjet recording heads, constituent elements, members, and the like which are identical to those of the first embodiment are denoted by the same reference numerals, and detailed description thereof is omitted.

FIG. 14C depicts an inkjet recording head 132 according to the second embodiment of the invention. The inkjet recording head 132 according to the second embodiment is configured so that the metal wiring 90 is formed on an inside surface of each electrical connection through port 42 without closing the bottom 42B and does not contact with the upper electrode 54 below the port 42. The solder 86 contacts with the metal wiring 90 within the electrical connection through port 42 and the upper electrode 54, thereby electrically connecting the electrical connection through port 42 to the upper electrode 54. The metal wiring 90 may be formed over the entire circumference of the electrical connection through port 42 as shown in FIG. 14A or may be partially formed within the electrical connection through port 42 in a circumferential direction as shown in FIG. 14B.

Figures 1A, 16:
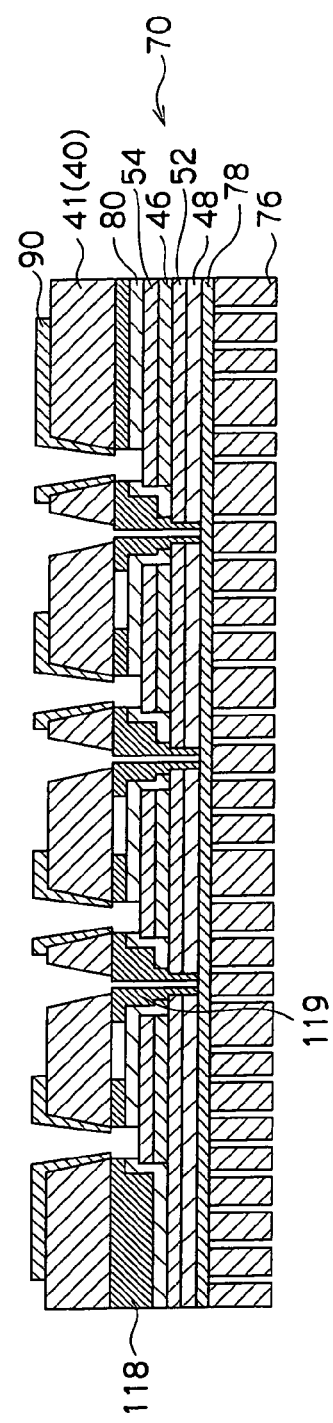

To manufacture the inkjet recording head 132 according to the second embodiment, the piezoelectric substrate 70 is manufactured similarly to the first embodiment, but manufacturing steps of the top plate member 40 differ from those according to the first embodiment. Namely, as shown in FIG. 15B, the second embodiment is the same as the first embodiment in that the ink supply through ports 112 and the electrical connection through ports 42 are formed in the top plate 41 sufficiently thick to be able to serve as a support as shown in FIG. 15A. However, before the top plate member 40 is bonded to the piezoelectric element substrate 70, the metal wirings 90 are formed on the top plate 41 as shown in FIG. 15C. As shown in FIG. 16-1A, the top plate member 40 thus obtained is covered on the piezoelectric element substrate 70 and connected (bonded) thereto by thermal compression bonding.

Figures 1, 2:
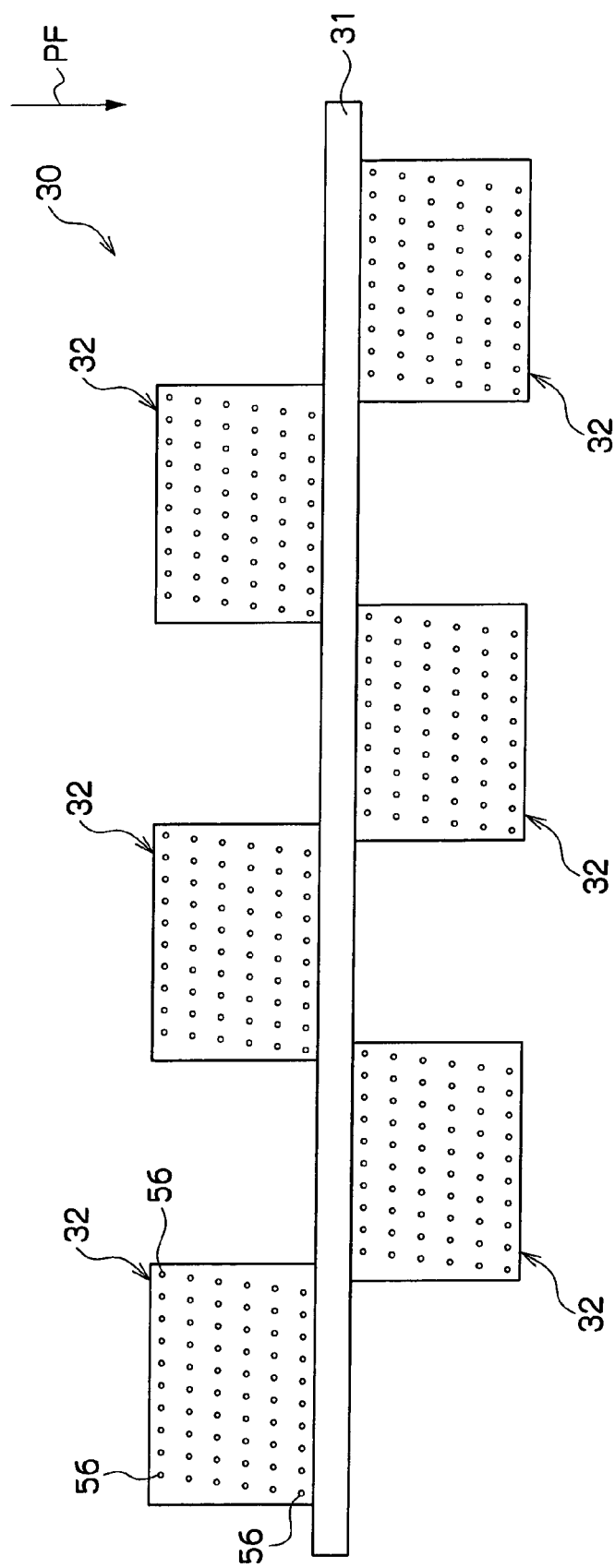

As shown in FIG. 16-2B, the solder is mounted in each electrical connection through port 42. As a solder mounting method, any one of the solder ball method, the heated and molten solder discharge and supply method, and the screen printing can be applied similarly to the first embodiment.

As shown in FIG. 16-2C, the solder is subjected to reflow, whereby the molten solder 86 reaches the upper electrode 54.

As can be understood from the above description, in the method for manufacturing the inkjet recording head 132 according to the second embodiment, the metal wirings 90 are formed on the top plate 41, and then the top plate 40 is bonded to the piezoelectric element substrate 70. In this respect, the method according to the second embodiment differs from the method for manufacturing the inkjet recording head 32 according to the first embodiment in which the metal wirings 90 are formed on the top plate 41 after the top plate 41 is bonded to the piezoelectric element substrate 70.

As can be understood, the order of the steps of manufacturing the inkjet recording head is not limited to a specific one as long as an inkjet recording head having a desired configuration can be finally obtained. The following four manufacturing flows can be particularly taken as examples.

(1) The top plate 41 is bonded to the piezoelectric element substrate 70.→The metal film serving as the metal wirings 90 is formed.→The metal film is patterned.→The solder is filled.

(2) The top plate 41 is bonded to the piezoelectric element substrate 70.→The metal film serving as the metal wirings 90 is formed.→The solder is filled.→The metal film is patterned.

(3) The metal film serving as the metal wirings 90 is formed.→The metal film is patterned.→The top plate 41 is bonded to the piezoelectric element substrate 70.→The solder is filled.

(4) The metal film serving as the metal wirings 90 is formed.→The top plate 41 is bonded to the piezoelectric element substrate 70.→The metal film is patterned.→The solder is filled.

(5) The top plate 41 is bonded to the piezoelectric element substrate 70.→The solder is filled.→The metal film serving as the metal wirings 90 is formed.→The metal film is patterned.

Figure 17:
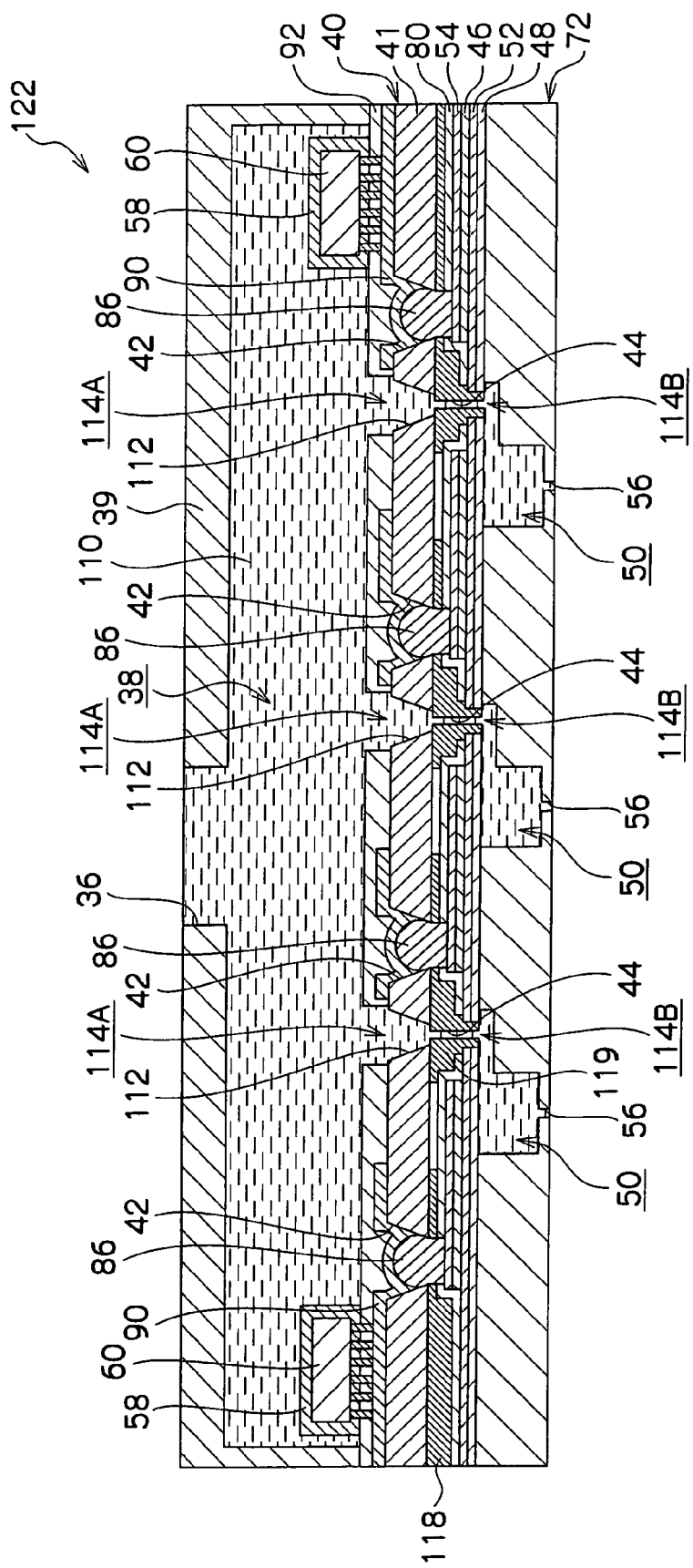
FIG. 17 is a sectional view that depicts a configuration of an inkjet recording head according to a third embodiment of the invention.
Figures 2C, 18:
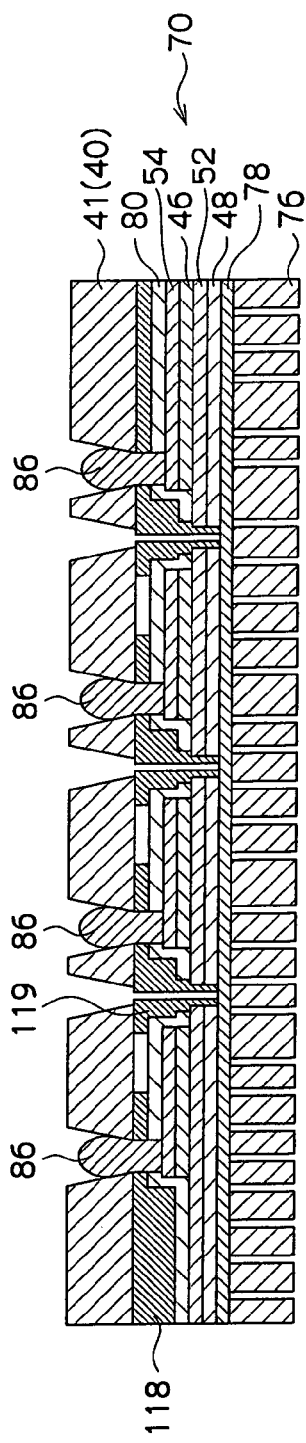
Figures 2D, 18:
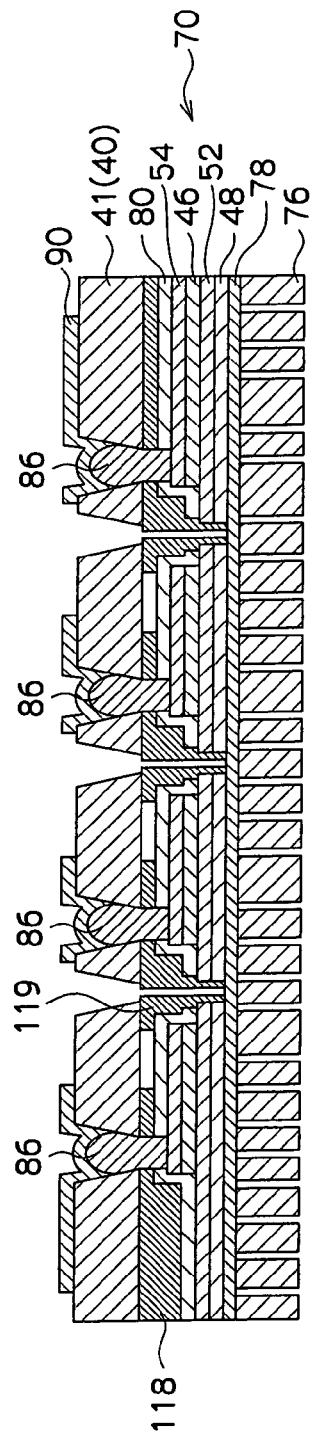
Figures 2E, 18:
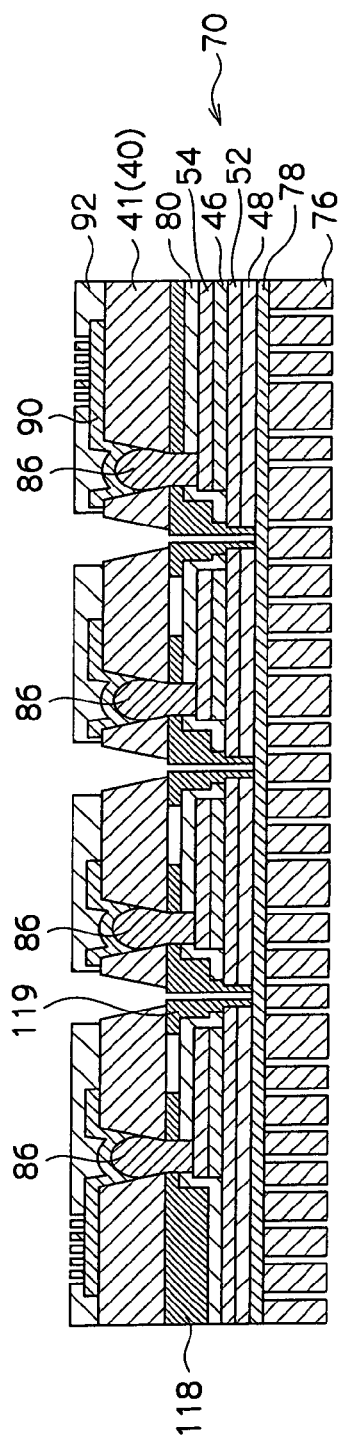

A part of the manufacturing steps described in the flow (5) above, in particular, are shown in FIGS. 18-1A to 18-3G. FIG. 17 depicts an inkjet recording head 122 according to a third embodiment of the invention obtained by these manufacturing steps.

As shown in FIG. 18-1A, in the manufacturing steps, similarly to the manufacturing steps shown in FIG. 10-1, the top plate 41 (top plate member 40) is connected (bonded) to the piezoelectric element substrate 70 by thermal compression bonding. Thereafter, before patterning the metal wirings 90, the solder 86 is mounted in each electrical connection through port 42 as shown in FIG. 18-1B. As a solder mounting method, the heated and molten solder discharge and supply method or the screen printing as well as the solder ball method for directly mounting the solder ball 86B in the electrical connection through port 42 can be used.

As shown in FIG. 18-2C, the solder 86 is subjected to reflow (e.g., at 280° C. for ten minutes), thereby spreading the solder 86 to the bottom 42B of the electrical connection through port 42 and bringing the solder 86 into contact with the upper electrode 54.

As shown in FIG. 18-2D, the metal wiring 90 is formed on the top plate 41 and the upper surface of the solder 86 and patterned.

As shown in FIG. 18-2E, the resin protection film 92 (e.g., photosensitive polyimide "Durimide7320" manufactured by Fujifilm Arch Co., Ltd.) is provided and patterned.

As shown in FIG. 18-3F, the Ge layer 78 is etched away (e.g., by an $H_2O_2$ treatment at 80° C. for 60 minutes), thereby separating the first support substrate 76.

Thus, as shown in FIG. 18-3G, the piezoelectric element substrate 70 to which the top plate member 40 is connected (bonded) is completed. At this stage, the driving IC 60 is not mounted; however, the driving IC 60 may be flip-chip mounted on the metal wiring 90 similarly to the method shown in, for example, FIG. 10-2F.

Thereafter, the inkjet recording head 122 is obtained through the same steps as those shown in FIGS. 11A to 11E and 12-1A to 12-3F. As can be seen from FIG. 17, in this inkjet recording head 122, the metal wiring 90 is also formed on an upper portion of the solder 86.

Figure 19:
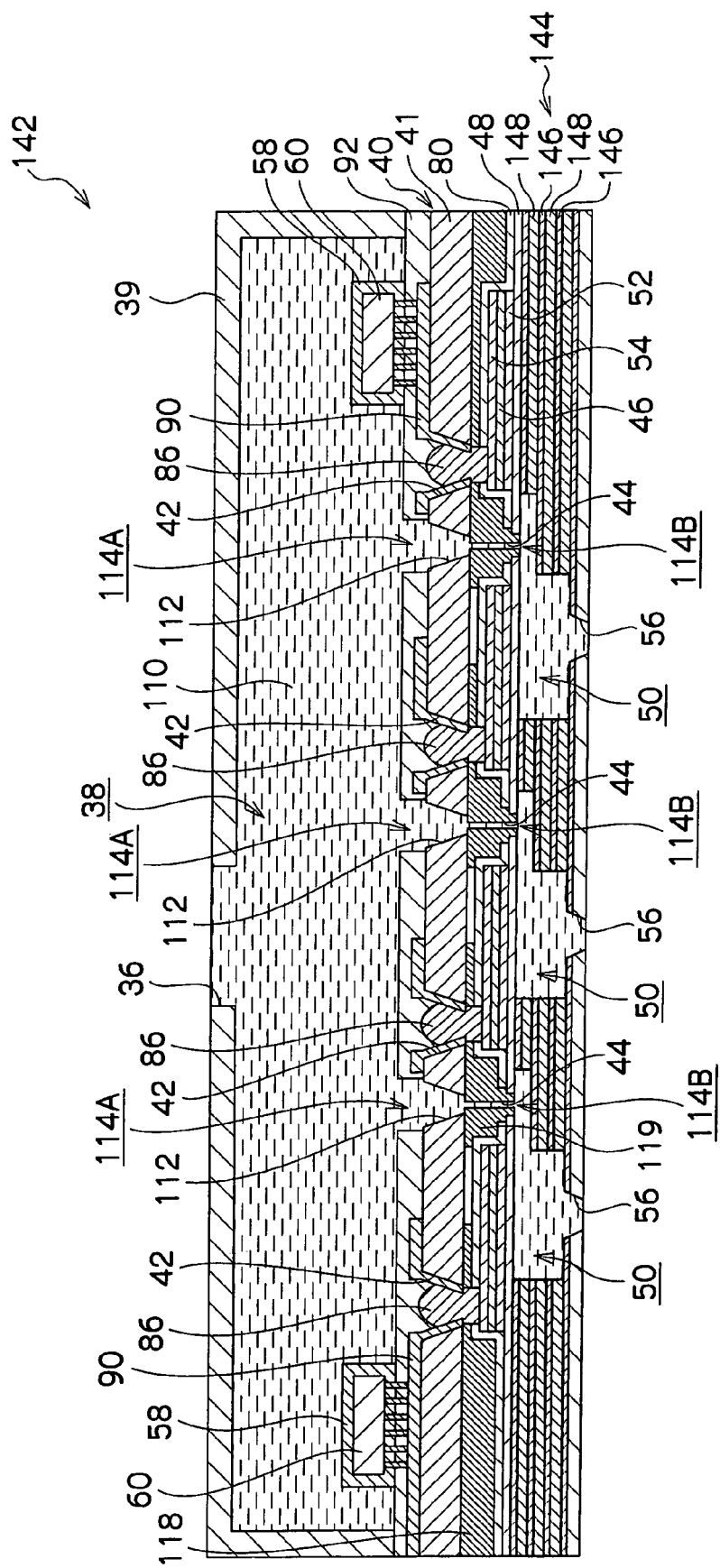
FIG. 19 is a sectional view of an inkjet recording head according to a fourth embodiment of the invention, showing a section similar to that of FIG. 5.

FIG. 19 depicts an inkjet recording head 142 according to a fourth embodiment of the invention. The fourth embodiment differs from the first embodiment in that a channel substrate 144 structured so that plural multilayer channel substrates 148 and plural resin films 146 are provided is used. Namely, irrespective of the structure of the channel substrate 144, the solder 86 can satisfactorily maintain the contact state in which the metal wiring 90 contacts with the upper electrode 54. As the multilayer channel substrate 148, the SUS can be employed and can be also used as the diaphragm 48. The piezoelectric element 46 may be formed by a bulk piezo bonding method.

Figure 20:
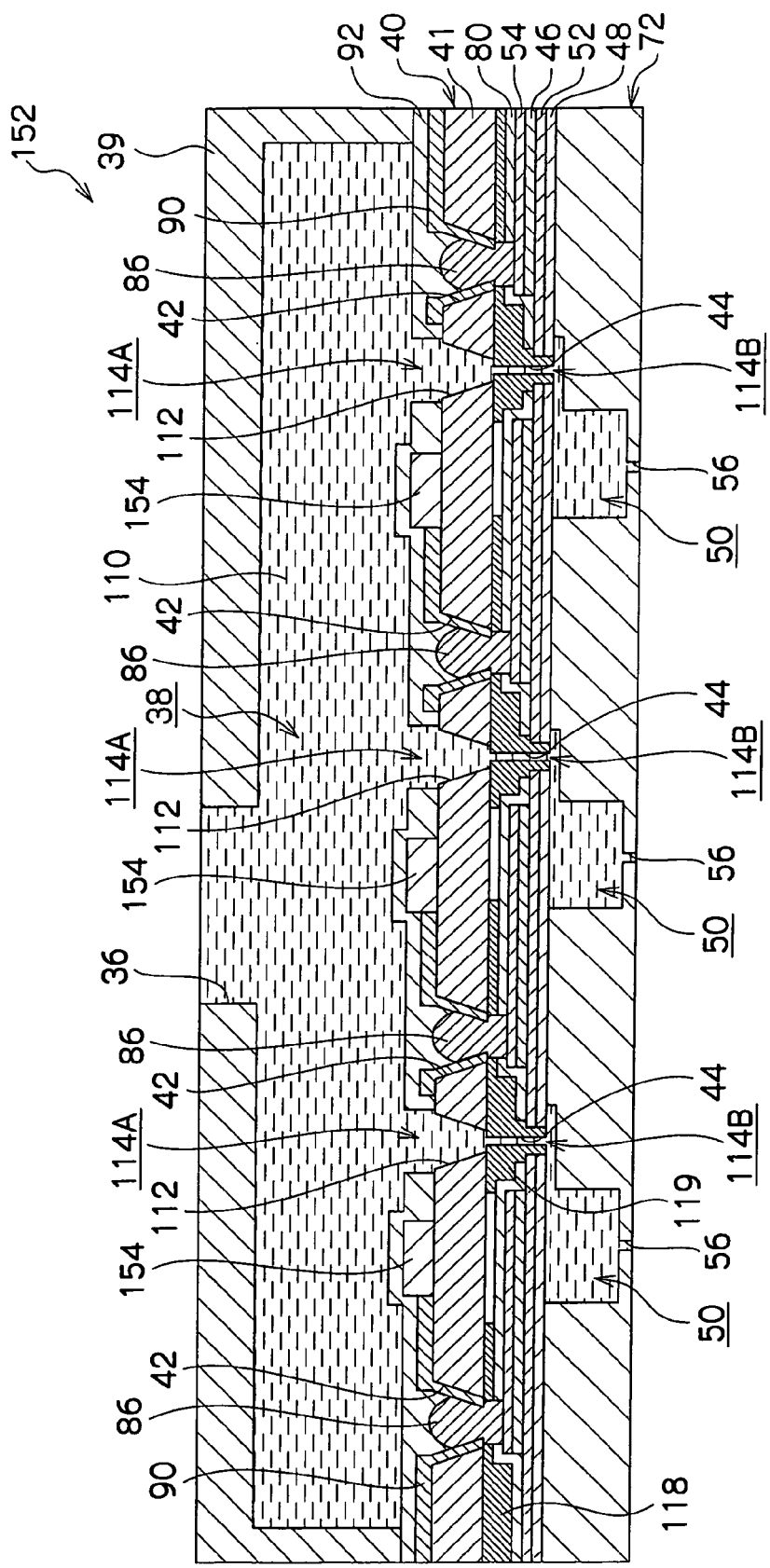
FIG. 20 is a sectional view of an inkjet recording head according to a fifth embodiment of the invention, showing a section similar to that of FIG. 5.

FIG. 20 depicts an inkjet recording head 152 according to a fifth embodiment of the invention. The fifth embodiment differs from the first embodiment in that thin film transistors (TFTs) 154 are provided on the top plate 41 in place of the driving ICs 60 to constitute the top plate member 40. As can be seen, a type of members provided on the top plate 41 is not limited to a specific one. As a method for manufacturing the top plate member 40, the thin film transistors 154 are provided on the top plate member 41 (glass substrate) by an ordinary TFT process, the electrical connection through ports 42 and the ink supply through ports 112 are formed in the top plate 40 using a resist constituted by a photosensitive dry film as a mask, and the metal wirings 90 are provided on the top plate 40.

Figure 21:
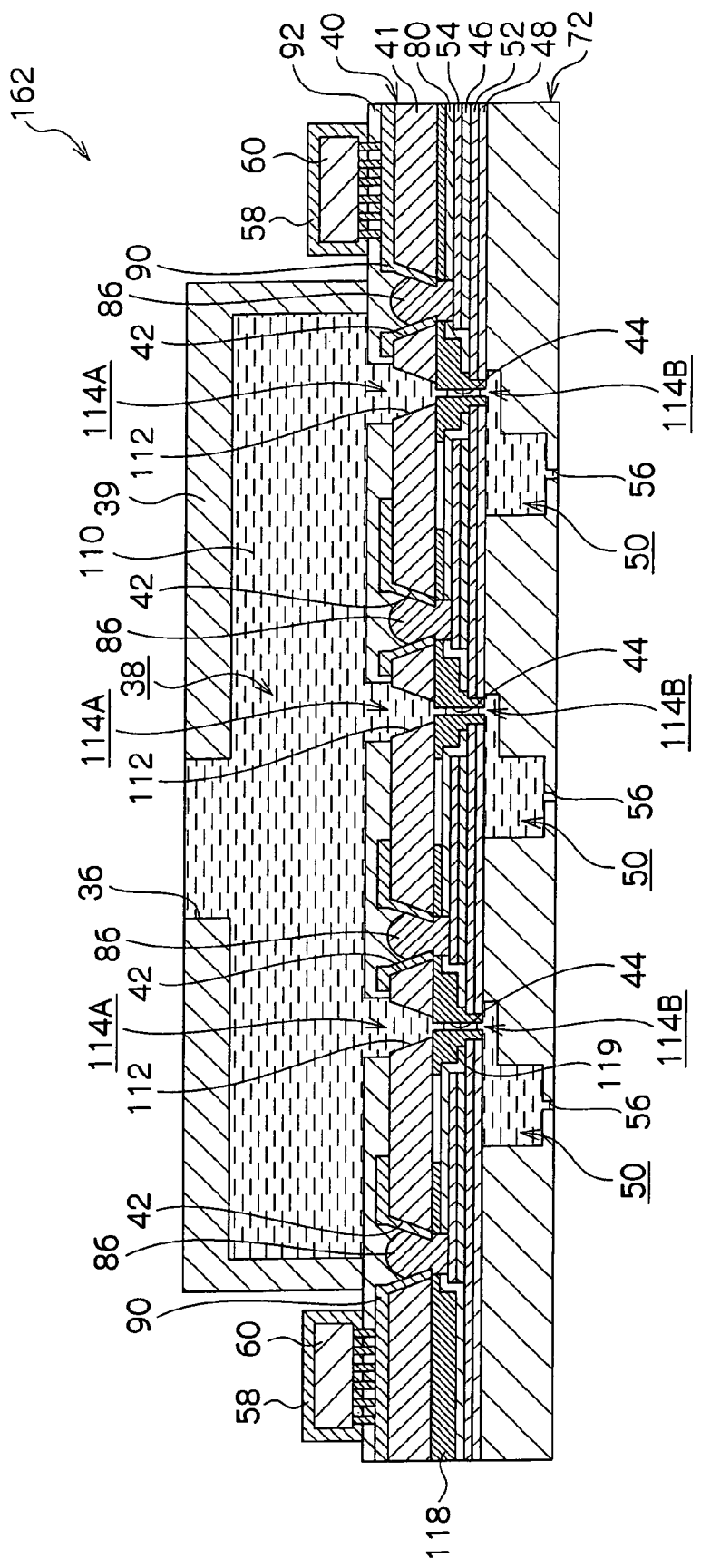
FIG. 21 is a sectional view of an inkjet recording head according to a sixth embodiment of the invention, showing a section similar to that of FIG. 5.

FIG. 21 depicts an inkjet recording head 162 according to a sixth embodiment of the invention. In the sixth embodiment, the driving ICs 60 are arranged outside of the ink pool chamber 38 so that it is possible to further ensure that the driving ICs 60 can be protected from the ink 110.

Figure 22:
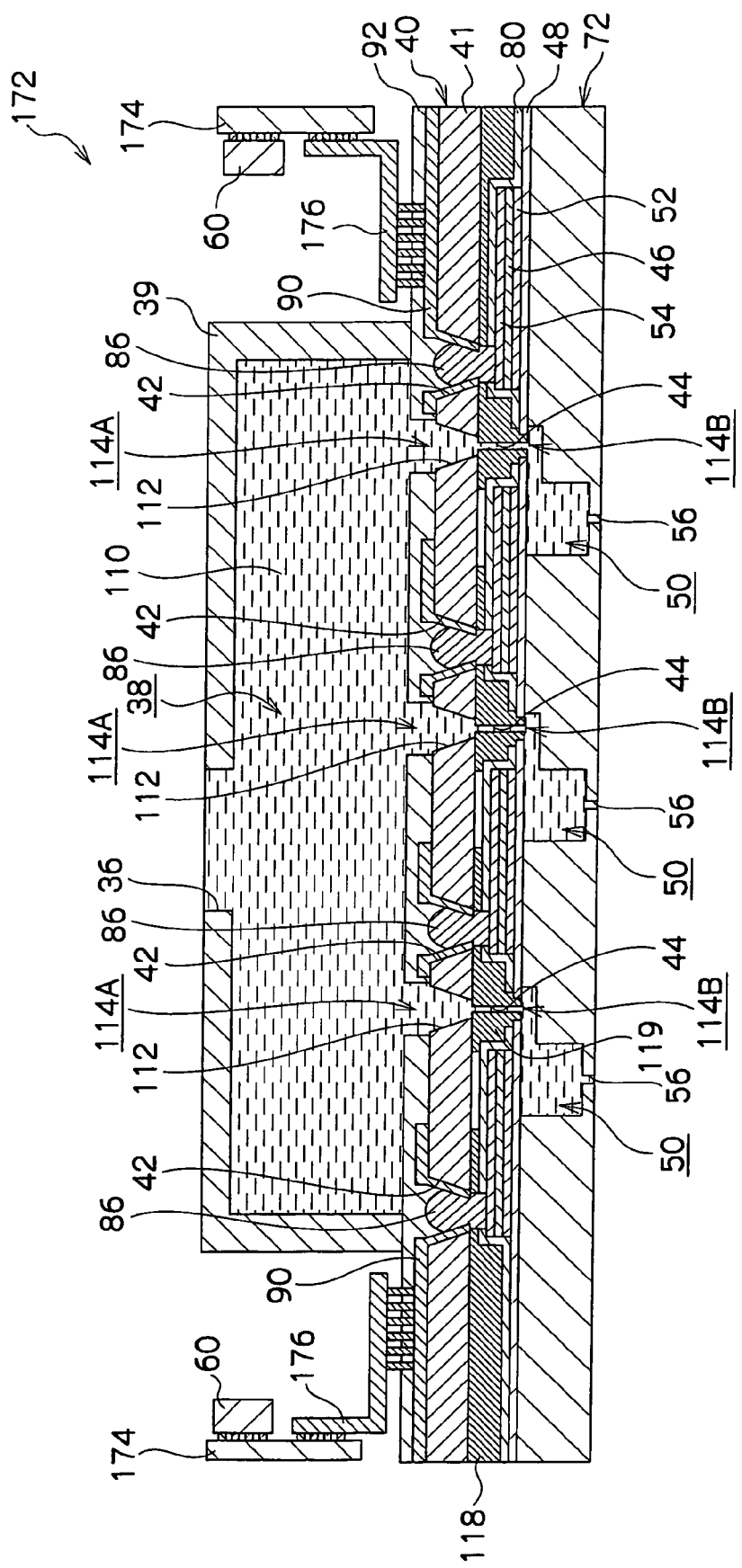
FIG. 22 is a sectional view of an inkjet recording head according to a seventh embodiment of the invention, showing a section similar to that of FIG. 5.

FIG. 22 depicts an inkjet recording head 172 according to a seventh embodiment of the invention. In the seventh embodiment, driving ICs 60 are mounted on a printed wiring board 174 provided separately from the top plate 41, and the printed wiring board 174 is electrically connected to the metal wirings 90 by a flexible printed wiring board 176. Alternatively, the driving ICs 60 may be mounted on the flexible printed wiring board 176.

FIGS. 23A and 23B partially depict an inkjet recording head 182 according to an eighth embodiment of the invention. In the eighth embodiment, particularly an example shown in FIG. 23A, the barrier resin layers 118 and 119 (see FIG. 5) near the electrical connection through ports 42 are not formed, in which respect the eighth embodiment differs from the first embodiment. In an example shown in FIG. 23B, the barrier resin layer 118 near the electrical connection through ports 42 is not formed. As can be seen, even if a part of the respective layers that constitute the inkjet recording head is not provided, the invention can be applied. In the eighth embodiment, an overall configuration of the inkjet recording head 182 is similar to that according to any one of the first to seventh embodiment.

Embodiments in which the electrical connection substrate according to the invention is applied as the substrate within the inkjet recording head have been described so far. However, the invention is not limited to these embodiments and is widely applicable to an instance in which plural connection target members are electrically connected. Embodiments in which the invention is applied to those other than the inkjet recording head will now be described.

FIG. 24 depicts a substrate multilayer body 212 according to a ninth embodiment of the invention. In the substrate multilayer body 212 according to the ninth embodiment, a second substrate (an upper substrate) 216 serving as an IC chip in which circuits 228 and metal wirings 230 are protected by insulating protection films 232 and 233 and a resin protection film 234 is provided on a first substrate (a lower substrate) 214 serving as an IC chip in which circuits 218 and metal wirings 220 are protected by an insulating protection film 222 and a resin protection film 224. The substrate multilayer body 212 has a two-layer structure as a whole.

Electrical connection through ports 236 are formed in the second substrate 216. A through wiring 238 extends from the metal wiring 230 into an inside surface of each electrical connection through port 236 and reaches the metal wiring 220 of the first substrate 214. A solder 240 is filled into the electrical connection through port 236, and a bottom 236B of the port 236 is reinforced. Due to this, even if thermal stress or mechanical stress acts on the bottom 42B, it is possible to ensure that a contact state in which the metal wiring 220 contacts with the through wiring 238 is maintained. Even if the metal wiring 238 is broken on the bottom 42B, the continuous state in which the metal wiring 238 is continuous to the metal wiring 220 of the first substrate 214 can be secured by the solder 240.

On the second substrate 216, a part of the resin protection film 234 is opened to expose the through wiring 238 to thereby provide an external terminal connection pad 250.

FIGS. 25A to 27-2E depict steps of manufacturing the substrate multilayer body 212 according to the ninth embodiment.

To manufacture the first substrate 214, an Si substrate 242 is prepared as shown in FIG. 25A. And as shown in FIG. 25B, a so-called LSI process is performed on the Si substrate 242 to form the circuits 218 and the metal wirings 220, and the circuits 218 and the metal wirings 220 are protected by the insulating protection film 222. As shown in FIG. 25C, the resin protection film 224 is formed out of photosensitive resin.

Next, the second substrate 216 is manufactured. As shown in FIG. 26-1A, the Si substrate 242 is prepared. As shown in FIG. 25B, the so-called LSI process is performed on the Si substrate 242 to form the circuits 228 and the metal wirings 230, and the circuits 228 and the metal wirings 230 are protected by the insulating protection film 232. As shown in FIG. 26-1C, a resist 244 constituted by a photosensitive dry film is formed by photolithography.

As shown in FIG. 26-1D, the electrical connection through ports 236 are formed by sand blasting. As shown in FIG. 26-2E, the resist 244 is peeled off. As shown in FIG. 26-2F, an Si oxide film (SiOx film) is formed by plasma CVD to thereby form the insulating protection film 232. This insulating protection film 232 is sequentially subjected to formation of a resist by photolithography, etching by the RIE etching, and peeling of the resist. As shown in FIG. 26-2G, the insulating protection film 232 is thus patterned.

Figures 2D, 27:
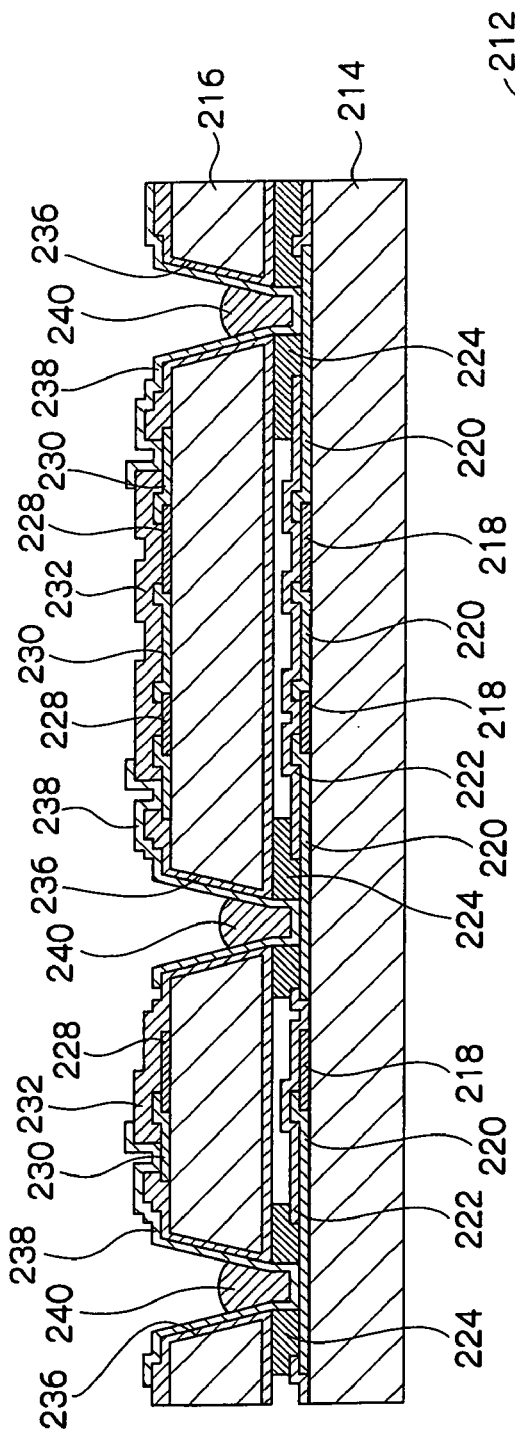
Figures 2E, 27:
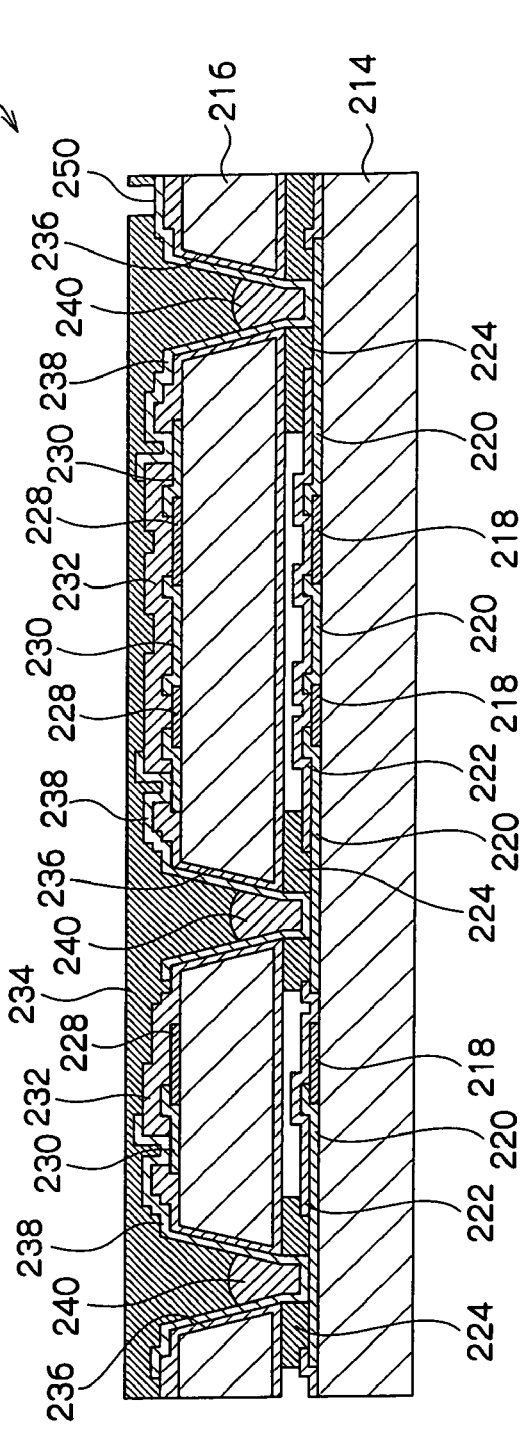

As shown in FIG. 27-1A, the second substrate 216 is mounted on the first substrate 214 and the substrates 216 and 214 are bonded to each other by thermal compression bonding (e.g., at 350° C. and 2 kg/cm² for 20 minutes). As shown in FIG. 27-1B, the through wiring 238 is patterned. Specifically, an Al film (having a thickness of 1 µm) is formed by sputtering, a resist is formed by photolithography, the Al film is wet etched using $H_3PO_4$ chemicals, and the resist is peeled off by oxygen plasma. Since a difference in height of the through ports is quite large, resist spray coating and exposure at long focal depth are employed in the photolithographic step.

At this time, the through wiring 238 is patterned so that a part of the through wiring 238 can reach the metal wiring 220 of the first substrate 214 from an inside surface of each electrical connection through port 236. The bottom 42B of the electrical connection through port 236 is thereby closed by the through wiring 238, so that the electrical connection through port 236 is a closed space except for the upper opening.

As shown in FIG. 27-1C, the solder 240 is mounted. To do so, the solder ball method for directly mounting a solder ball 240B in the electrical connection through port 236, the heated and molten solder discharge and supply method, or the screen printing method may be used.

As shown in FIG. 27-2D, the solder 240 is subjected to reflow (e.g., at 280° C. for ten minutes), thereby spreading the solder 240 to the bottom 42B of the electrical connection through port 236. At this time, there is no path from which the molten solder flows out at the bottom 42B of the electrical connection through port 236. It is, therefore, possible to sufficiently melt the solder 240 in a high temperature environment and to ensure filling of the solder 240 into the bottom 42B of the electrical connection through port 236.

Finally, as shown in FIG. 27-2E, the photosensitive resin is patterned to form the resin protection film 234, thereby obtaining the substrate multilayer body 212 according to the ninth embodiment.

Figure 28:
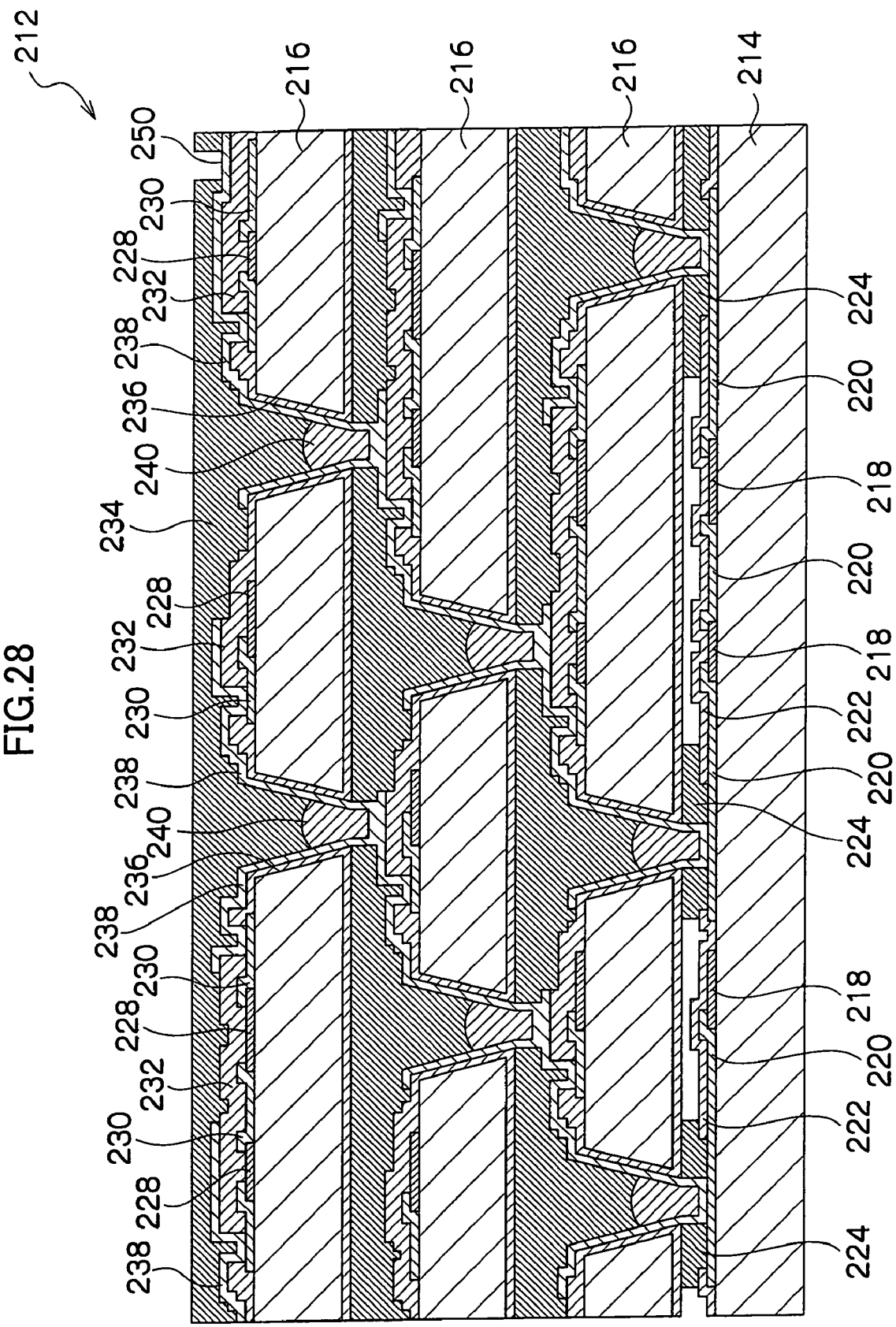
FIG. 28 is a sectional view that depicts an example of a multilayer structure of the substrate multilayer member according to the ninth embodiment of the invention.

In the ninth embodiment, the substrate multilayer body can be configured to have a multilayer structure in which plural second substrates 216 are provided on the first substrate 214 as shown in FIG. 28 as well as the two-layer structure shown in FIG. 24.

Figure 29:
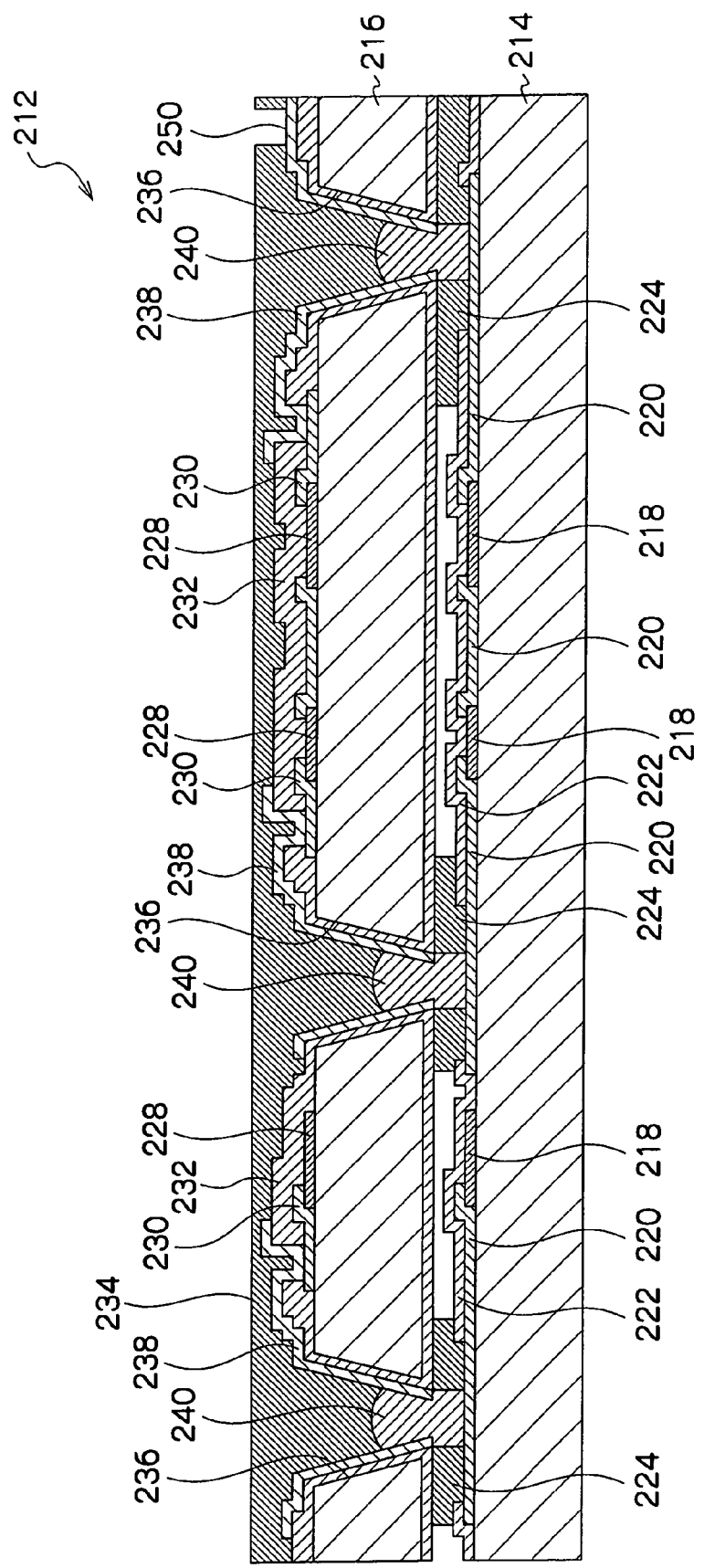
FIG. 29 is a sectional view that depicts a modification of the substrate multilayer member according to the ninth embodiment of the invention.

Further, it is not always necessary that the through wiring 238 closes the bottom 42B of the electrical connection through port 236. As shown in FIG. 29, the solder 240 may contact with the metal wiring 220 on the bottom 42B of the electrical connection through port 236.

Figure 30:
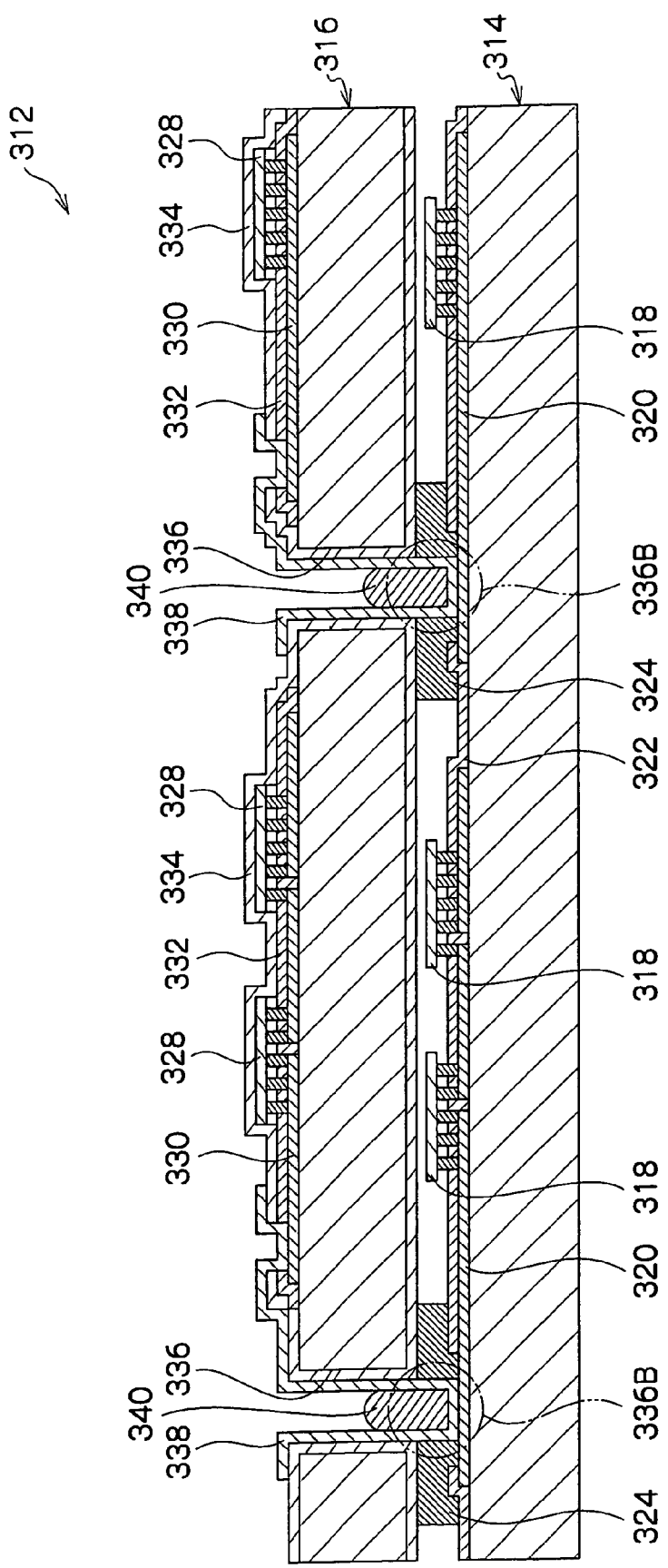
FIG. 30 is a sectional view that depicts a substrate multilayer member according to a tenth embodiment of the invention.

FIG. 30 depicts a substrate multilayer body 312 according to a tenth embodiment of the invention. In the substrate multilayer body 312 according to the tenth embodiment, a second printed wiring board 316 on which second integrated circuits 328 and second wirings 330 are mounted with the second wirings 330 protected by an insulating protection films 332, and the second integrated circuits 328 protected by an insulating protection film 334 is provided on a first printed wiring board 314 on which first integrated circuits 318 and first wirings 320 are mounted with the first wirings 320 protected by an insulating protection films 322 or a resin protection film 324. The substrate multilayer body 312 has a two-layer structure as a whole.

Electrical connection through ports 336 are formed in the second printed wiring board 316. A through wiring 338 extends from the second wiring 330 to an inside surface of each electrical connection through port 336 and reaches the first wiring 320 of the first printed wiring board 314. A solder 340 is filled into the electrical connection through port 336, and a bottom 336B of the port 336 is reinforced. Due to this, even if thermal stress or mechanical stress acts on the bottom 336B, it is possible to ensure that a contact state in which the first wiring 320 contacts with the through wiring 338 is maintained. Even if the through wiring 338 is broken on the bottom 336B, the continuous state in which the through wiring 338 is continuous to the first wiring 320 of the first printed wiring board 314 can be secured by the solder 340.

FIGS. 31A to 33-2D depict steps of manufacturing the substrate multilayer body 312 according to the tenth embodiment.

Figure 31A:
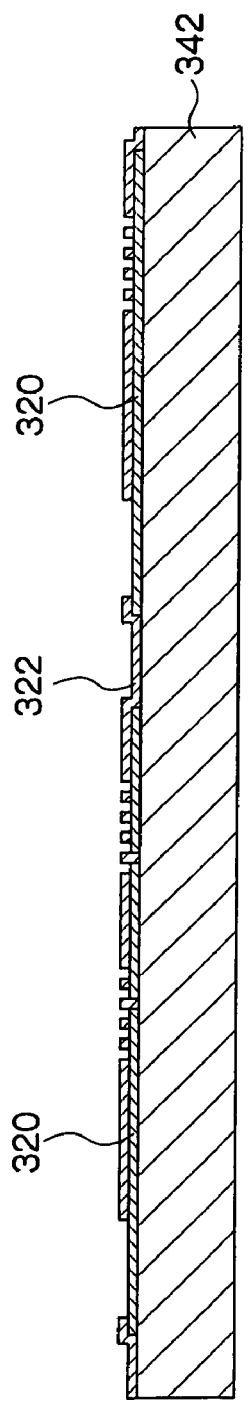
FIGS. 31A to 31C are explanatory views that depict steps (A) to (C) of manufacturing a first printed wiring board of the substrate multilayer member according to the tenth embodiment of the invention.
Figure 31B:
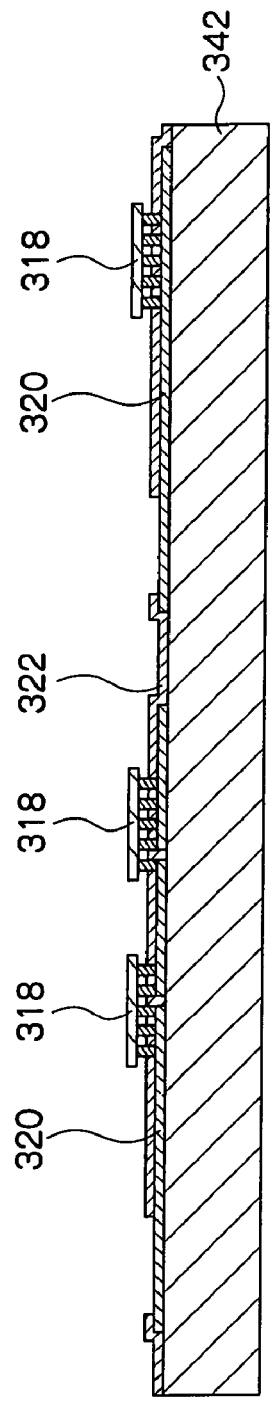
Figure 31C:
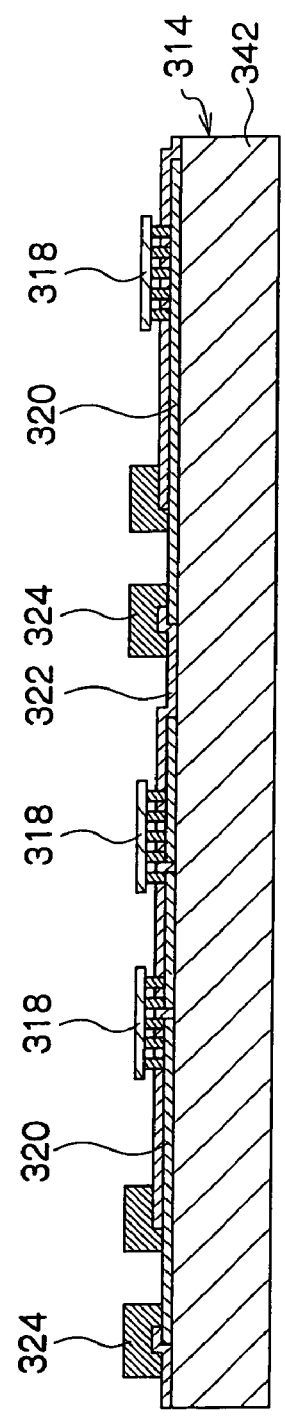

To manufacture the first printed wiring board 314, a support substrate 342 is prepared as shown in FIG. 31A, and the first wiring 320 constituted by Cu and the insulating protection film 322 constituted by polyimide are formed on the support substrate 342. As shown in FIG. 31B, the first integrated circuits 318 are flip-chip mounted and, as shown in FIG. 31C, the resin protection films 324 are formed out of photosensitive resin.

Next, the second printed wiring board 316 is manufactured. As shown in FIG. 32A, a support substrate 344 in which the electrical connection through ports 336 are formed in advance is prepared, and the second wiring 330 constituted by Cu and the insulating protection film 322 constituted by polyimide are formed on the support substrate 344. As shown in FIG. 32B, the second integrated circuits 328 are flip-chip mounted. As shown in FIG. 32C, an Si oxide film (SiOx film) is formed by plasma CVD to thereby form the insulating protection film 334. This insulating protection film 334 is sequentially subjected to formation of a resist by photolithography, etching by the RIE etching, and peeling of the resist. As shown in FIG. 32D, the insulating protection film 334 is thus patterned.

As shown in FIG. 33-1A, the second printed wiring board 316 is mounted on the first printed wiring board 314, and the second printed wiring board 316 and the first printed wiring board 314 are bonded to each other by thermal compression bonding (e.g., at 250° C. and 10 kg/cm$^2$ for 20 minutes). As shown in FIG. 33-1B, the through wiring 338 is patterned. Specifically, an Al film (having a thickness of 1 μm) is formed by sputtering, a resist is formed by photolithography, the Al film is wet etched using $H_3PO_4$ chemicals, and the resist is peeled off by oxygen plasma. Since a difference in height of the through ports is quite large, resist spray coating and exposure at long focal depth are employed in the photolithographic step.

At this time, the through wiring 338 is patterned so that a part of the through wiring 338 can reach the first wiring 320 of the first printed wiring board 314 from an inside surface of each electrical connection through port 336. The bottom 336B of the electrical connection through port 336 is thereby closed by the through wiring 338, so that the electrical connection through port 336 is a closed space except for the upper opening.

As shown in FIG. 33-2C, the solder 340 is mounted on this space. To do so, the solder ball method, the heated and molten solder discharge and supply method, or the screen printing method can be used.

As shown in FIG. 33-2D, the solder 340 is subjected to reflow (e.g., at 280° C. for ten minutes), thereby spreading the solder 340 to the bottom 336B of the electrical connection through port 336. At this time, there is no path from which the molten solder flows out at the bottom 336B of the electrical connection through port 336. It is, therefore, possible to sufficiently melt the solder 340 in a high temperature environment and to ensure filling of the solder 340 into the bottom 336B of the electrical connection through port 336.

The substrate multilayer body 312 according to the tenth embodiment is thus obtained.

Figure 34:
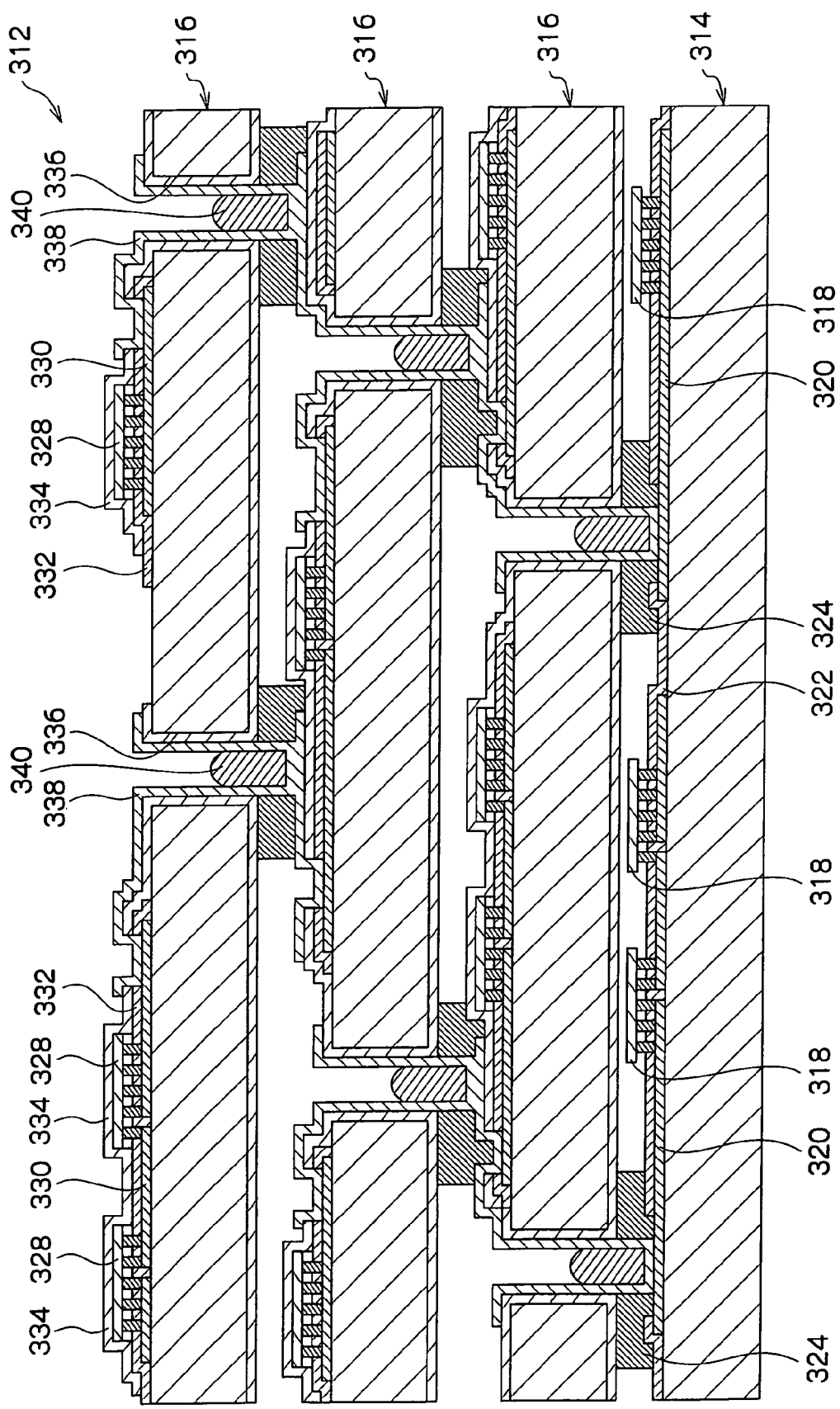
FIG. 34 is a sectional view that depicts an example of a multilayer structure of the substrate multilayer member according to the tenth embodiment of the invention.

In the tenth embodiment, the substrate multilayer body can be configured to have a multilayer structure in which plural second substrates 316 are provided on the first substrate 314 as shown in FIG. 34 as well as the two-layer structure shown in FIG. 30.

Figure 35:
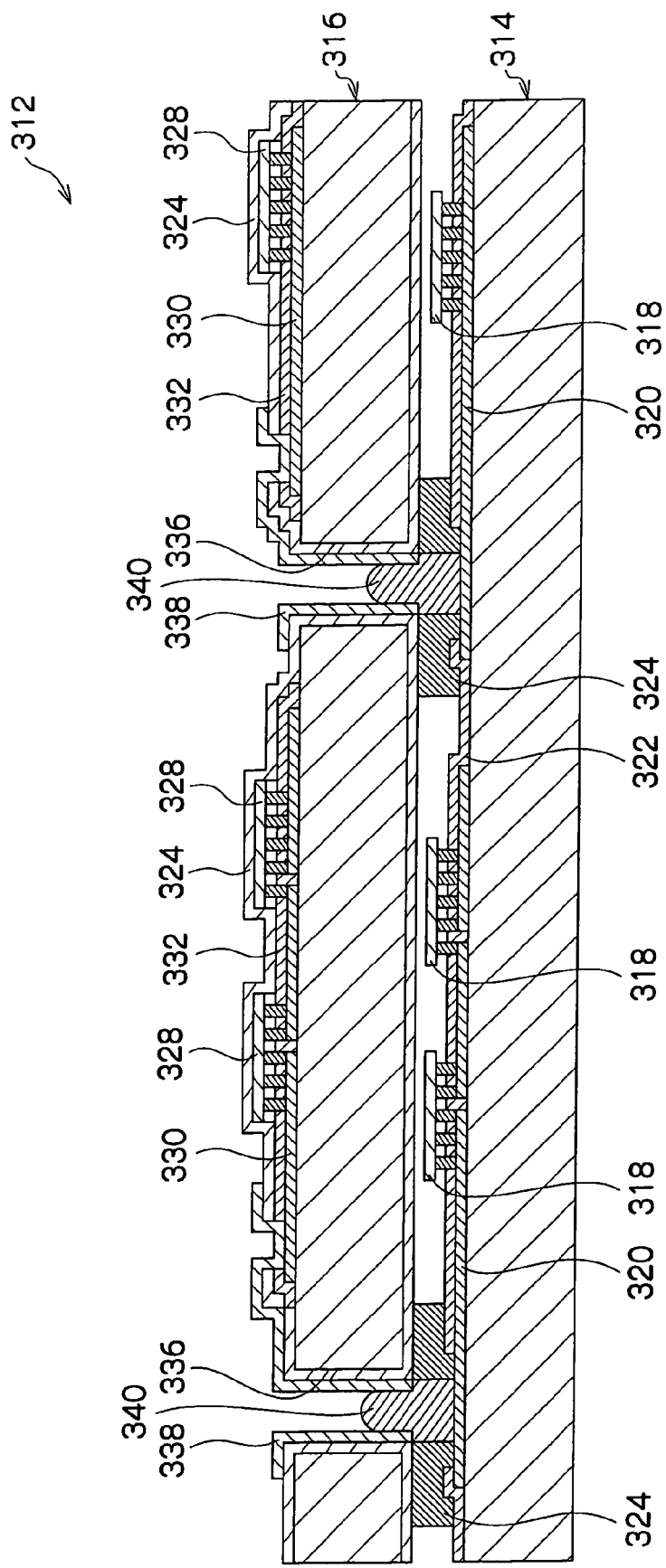
FIG. 35 is a sectional view that depicts a modification of the multilayer structure of the substrate multilayer member according to the tenth embodiment of the invention.

Further, in the tenth embodiment, it is not always necessary that the through wiring 338 closes the bottom 336B of the electrical connection through port 336. As shown in FIG. 35, the solder 340 may contact with the first wirings 320 on the bottom 336B of the electrical connection through port 336.

In the respective embodiments, the driving ICs, the circuits, the integrated circuits, and the like are employed as the components mounted on the substrate. Alternatively, various functional elements other than these components can be mounted on the substrate so as to be used as a so-called MEMS (Micro Electro Mechanical System) package. Examples of the functional elements include various microactuators such as an electrostatic motor and a movable mirror, various micro-sensors such as a pressure sensor, and various light emitting and receiving elements such as a light receiving element and a surface light emitting element.

Figure 36:
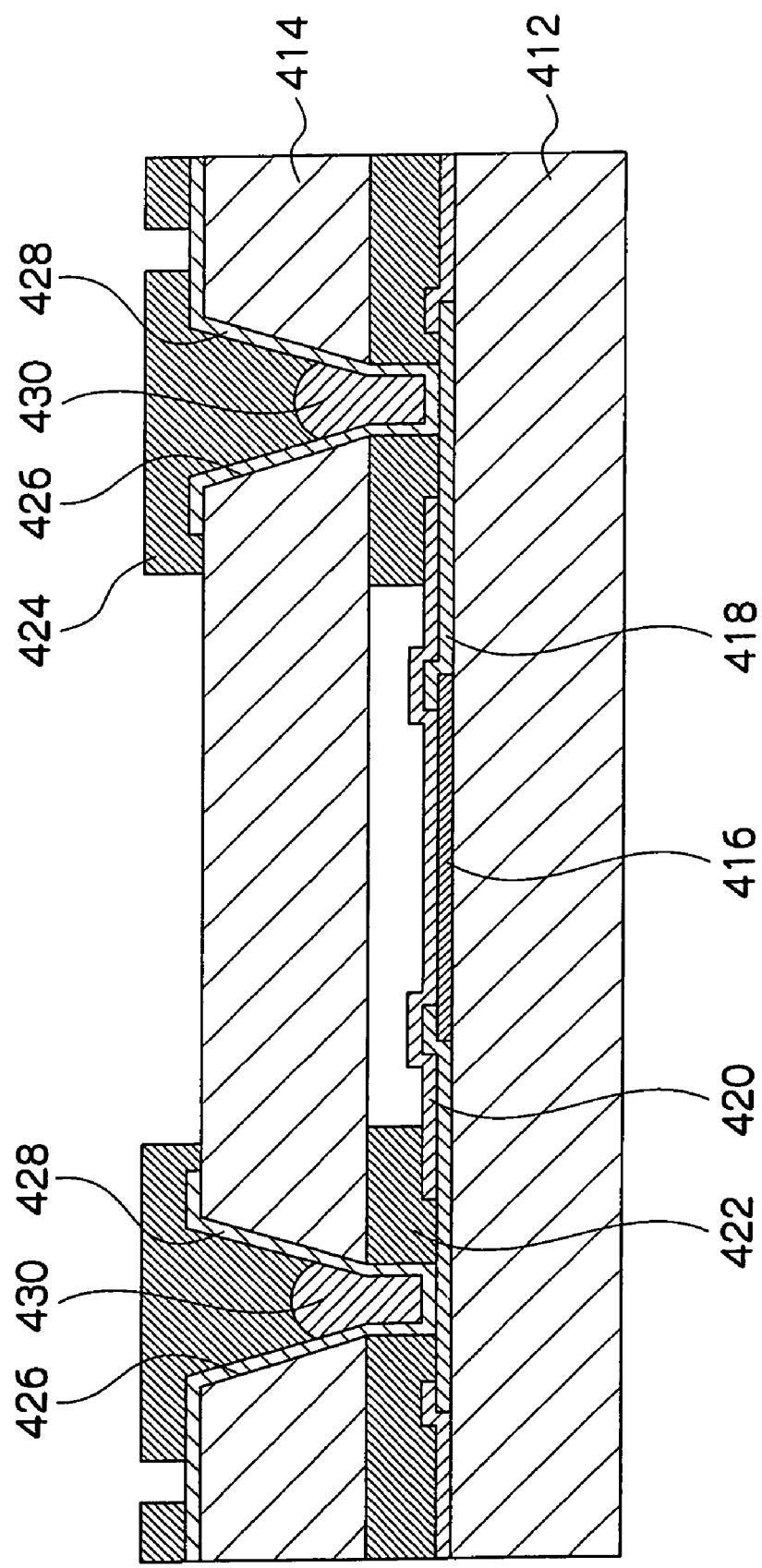
FIG. 36 is a sectional view that depicts a substrate multilayer member having a functional element mounted thereon as a substrate multilayer member according to the invention.

In this case, as shown in FIG. 36, if a protection substrate 414 in the form of a hard plate is provided on a substrate 412 in which a functional element 416 and a wiring 418 are protected by an insulating protection film 420, resin protection films 422 and 424, etc., the functional element 416 can be protected from external foreign matter (e.g., ground pieces generated in a working step and water). Particularly if the functional element 416 is a light emitting or receiving element, a light permeable substrate (a transparent glass plate or a resin plate) is preferably used as the protection substrate 414 since light emission and light reception are not adversely influenced.

With either configuration, a through wiring 428 within a through port 426 of the protection substrate 414 and a solder 430 enable transmission and reception of a signal to and from the functional element 416 and supply of power thereto.

In any of the above-stated embodiments, by forming the electrical connection through ports 42, 236, and 336 to be tapered (in a funnel shape), the openings are widened and the different-height part covering performance during formation of the thin film can be improved. The metal wiring films within these through ports can be formed thick deep in the ports. It is thereby possible to realize good electrical connection for bringing the metal wiring film of the lower layer part into contact with the solder even if the solder is not filled up to an upper portion of the through port.

Figure 37A:
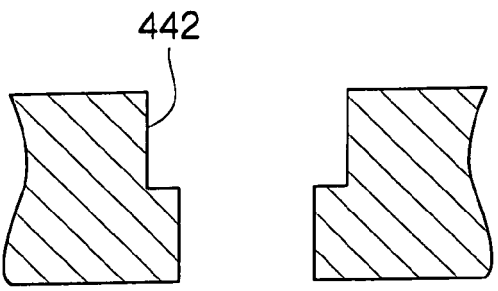
FIGS. 37A to 37D are explanatory views that depict examples of an electrical connection through hole according to the invention.
Figure 37B:
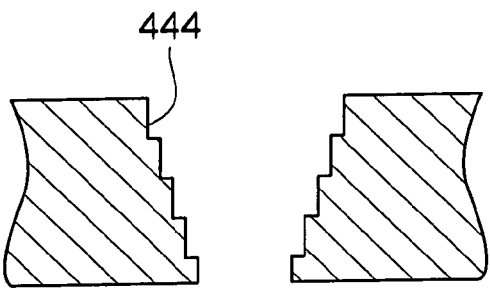

For example, an electrical connection through port 442 with a step as shown in FIG. 37A or a stepped electrical connection through port 444 having many of these steps formed as shown in FIG. 37B may be used. Such a stepped shape can be realized by, for example, multiple exposure on a photosensitive glass.

Figure 37C:
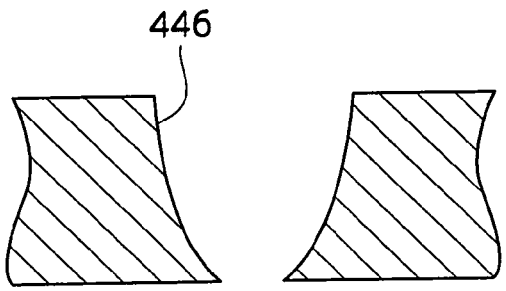
Figure 37D:
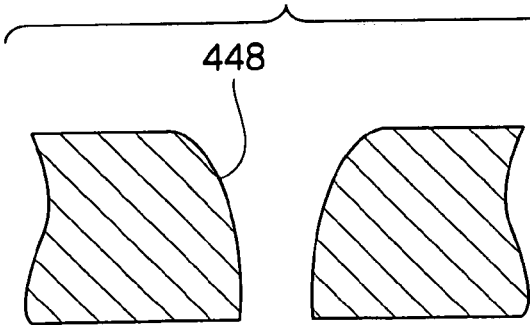

Further, an electrical connection through port 446 having an inside surface inclined and bent convexly outward as shown in FIG. 37C or an electrical connection through port 448 bent convexly inward as shown in FIG. 37D may be used.

Such a shape can be realized by, for example, wet etching on a glass substrate (particularly for the shape shown in FIG. 37C) or laser processing on the glass substrate (particularly for the shape shown in FIG. 37D).

A fluidized conductive material according to the invention is not limited to the solder, and molten metal, metal paste, conductive adhesive or the like can be used as the fluidized conductive material. Since resistivity required for these materials depends on characteristics required for elements, one of the materials can be appropriately selected in light of cost and step matching (heat resistant temperature and the like).

In the embodiments, as the droplet discharge head according to the invention, the inkjet recording heads discharging ink droplets of respective colors of black, yellow, magenta, and cyan have been described. As the droplet discharge apparatus, the inkjet recording apparatus including the inkjet recording heads has been described. However, the droplet discharge head and the droplet discharge apparatus according to the invention are not limited to those for recording images (including characters) on the recording sheet P.

Namely, the recording medium is not limited to paper, and the liquid to be discharged is not limited to ink. For example, ink may be discharged onto a polymeric film or glass to form a color filter for a display, and welded solder may be discharged onto a substrate to form bumps for component mounting. The inkjet recording head according to the invention can be widely applied to all industrial droplet discharge apparatuses.

Further, FWA is taken as an example for these droplet discharge apparatuses. Alternatively, the invention can be also applied to the Partial Width Array (PWA) including a main scan mechanism and a sub scan mechanism.

What is claimed is:

1. An electrical connection substrate comprising:
   a substrate main body in which an electrical connection through port is formed; and
   connection target members arranged on both sides of the substrate main body, respectively, wherein
   the connection target members are electrically connected to each other through the electrical connection through port, and the electrical connection through port is filled with a fluidized conductive material, and a wiring pattern, in which the connection target members are arranged, is formed on at least one surface of the substrate main body, and the connection target members are electrically connected to each other through the wiring pattern.

2. The electrical connection substrate according to claim 1, wherein the wiring pattern is formed to cover at least a part of an inside surface of the electrical connection through port.

3. The electrical connection substrate according to claim 1, wherein the wiring pattern is formed to be exposed from one surface of the substrate main body to the other surface thereof through the electrical connection through port.

4. The electrical connection substrate according to claim 3, wherein the fluidized conductive material is located closer to an inside surface of the electrical connection through port than a portion of the wiring pattern that is exposed from the electrical connection through port.

5. The electrical connection substrate according to claim 1, wherein the fluidized conductive material is arranged so as not to protrude from the electrical connection through port on an opposite surface to a surface of the substrate main body on which other members are bonded to the substrate main body.

6. The electrical connection substrate according to claim 1, further comprising:
    an insulating film which is formed on a surface of the substrate main body on which the wiring pattern is not formed, and in which a communication port communicating with the electrical connection through port is formed; and
    a closing member forming a part of the connection target members or the wiring pattern, and closing a side of the communication port which side does not communicate with the electrical connection through port.

7. The electrical connection substrate according to claim 6, further comprising:
    a first resin layer formed to be located around the electrical connection through port on a side of the substrate main body which side other members are bonded to; and
    a second resin layer formed to be located near the connection target members on the side of the substrate main body which side the other members are bonded to, wherein
    the first resin layer and the second resin layer are substantially equal in height from the substrate main body.

8. A droplet discharge head comprising:
    an electrical connection substrate including a substrate main body in which an electrical connection through port is formed, and connection target members arranged on both sides of the substrate main body, respectively, the connection target members being electrically connected to each other through the electrical connection through port, and the electrical connection through port being filled with a fluidized conductive material, wherein
    a liquid supply through port capable of supplying a liquid from one side of a top plate member to the other side thereof is formed in the top plate member, and
    a wiring pattern, in which the connection target members are arranged, is formed on at least one surface of the substrate main body, and the connection target members are electrically connected to each other through the wiring pattern.

9. The droplet discharge head according to claim 8, further comprising:
    a pressure chamber filled with the liquid supplied through the liquid supply through port;
    a diaphragm constituting a part of the pressure chamber;
    a piezoelectric element displacing the diaphragm;
    a nozzle discharging a droplet from the pressure chamber due to vibration of the diaphragm; and
    an intermediate layer constituting a gap between the substrate main body and the piezoelectric element, and communicating with the liquid supply through port to constitute a liquid supply path.

10. The droplet discharge head according to claim 9, wherein a plurality of the nozzles are arranged in a matrix.

11. The droplet discharge head according to claim 10, wherein the electrical connection through port and the liquid supply through port are formed into a matrix to correspond to the nozzles arranged in the matrix.

12. The droplet discharge head according to claim 9, further comprising:
    a liquid pool chamber that pools the liquid supplied to the pressure chamber, wherein
    the liquid pool chamber is provided on an opposite side from the pressure chamber, with the diaphragm interposed between the liquid pool chamber and the pressure chamber.

13. A droplet discharge apparatus comprising the droplet discharge head according to claim 8.

14. The electrical connection substrate according to claim 1, wherein the fluidized conductive material closes the electrical connection through port, and the connection target members are electrically connected to each other through the fluidized conductive material and the wiring pattern.

15. The electrical connection substrate according to claim 14, wherein the wiring pattern is located on a deeper side of the electrical connection through port than a portion of the fluidized conductive material that is exposed from the electrical connection through port.

* * * * *